(12) United States Patent
Kubota et al.

(10) Patent No.: US 12,737,083 B2
(45) Date of Patent: Sep. 15, 2026

(54) DISPLAY APPARATUS

(71) Applicant: Semiconductor Energy Laboratory Co., Ltd., Kanagawa-ken (JP)

(72) Inventors: Daisuke Kubota, Atsugi (JP); Kenichi Okazaki, Atsugi (JP); Ryo Hatsumi, Hadano (JP); Koji Kusunoki, Isehara (JP); Shunpei Yamazaki, Tokyo (JP)

(73) Assignee: Semiconductor Energy Laboratory Co., Ltd. (JP)

(*) Notice: Subject to any disclaimer, the term of this patent is extended or adjusted under 35 U.S.C. 154(b) by 462 days.

(21) Appl. No.: 18/563,630

(22) PCT Filed: May 19, 2022

(86) PCT No.: PCT/IB2022/054651
§ 371 (c)(1),
(2) Date: Nov. 22, 2023

(87) PCT Pub. No.: WO2022/248984
PCT Pub. Date: Dec. 1, 2022

(65) Prior Publication Data

US 2024/0260287 A1 Aug. 1, 2024

(30) Foreign Application Priority Data

May 27, 2021 (JP) ................................ 2021-089477

(51) Int. Cl.
*H10K 39/34* (2026.01)
*G06F 3/042* (2006.01)
(Continued)

(52) U.S. Cl.
CPC ........... *G06F 3/0421* (2013.01); *H10K 39/34* (2023.02); *H10K 50/00* (2023.02); *H10K 59/00* (2023.02);
(Continued)

(58) Field of Classification Search
CPC ...... H10K 39/34; H10K 59/00; H10K 59/873; H10K 59/871; H10K 50/00; G06F 3/0421
See application file for complete search history.

(56) References Cited

U.S. PATENT DOCUMENTS 5,953,985 A 9/1999 Kobayashi
6,120,338 A 9/2000 Hirano. et al.
(Continued)

FOREIGN PATENT DOCUMENTS

CN 107230691 A 10/2017
CN 108242453 A 7/2018
(Continued)

OTHER PUBLICATIONS

International Search Report (Application No. PCT/IB2022/054651) Dated Aug. 9, 2022.
(Continued)

*Primary Examiner* — Nathan W Ha
(74) *Attorney, Agent, or Firm* — Husch Blackwell LLP

(57) ABSTRACT

A display apparatus having an image capturing function is provided. A display apparatus or an image capturing device with a high aperture ratio is provided. The display apparatus includes a light-emitting element, a light-receiving element, a first resin layer, and a light-blocking layer. A first pixel electrode, a first organic layer, and a common electrode are stacked in this order in the light-emitting element. A second pixel electrode, a second organic layer, and the common electrode are stacked in this order in the light-receiving element. The first organic layer includes a first light-emitting layer, and the second organic layer includes a photoelectric conversion layer. The light-blocking layer includes a portion positioned, in a plan view, between the light-emitting element and the light-receiving element. The first resin layer is provided to cover the light-emitting element and the light-receiving element. The first resin layer includes portions
(Continued)

positioned between the light-emitting element and the light-blocking layer and between the light-receiving element and the light-blocking layer. Furthermore, the first resin layer includes a portion with thickness smaller than an arrangement interval between the light-emitting element and the light-receiving element in a region overlapping with the light-blocking layer.

14 Claims, 32 Drawing Sheets

(51) Int. Cl.
*H10K 50/00* (2023.01)
*H10K 59/00* (2023.01)
*H10K 59/80* (2023.01)

(52) U.S. Cl.
CPC ......... *H10K 59/871* (2023.02); *H10K 59/873* (2023.02)

(56) References Cited

U.S. PATENT DOCUMENTS 8,736,587 B2 5/2014 Yamazaki
9,088,006 B2 7/2015 Yamazaki et al.
9,627,648 B2 4/2017 Yamazaki et al.
9,805,659 B2 10/2017 Ikeda et al.
10,003,047 B2 6/2018 Yamazaki et al.
10,381,599 B2 8/2019 Yamazaki et al.
10,903,453 B2 1/2021 Yamazaki et al.
11,621,407 B2 4/2023 Yamazaki et al.
11,804,065 B2 10/2023 Li
11,839,106 B2 12/2023 Yamazaki et al.
12,610,713 B2* 4/2026 Yamazaki ............ H10K 59/353
2002/0072139 A1 6/2002 Kashiwabara
2007/0200492 A1* 8/2007 Cok .................... H10K 59/877 313/506
2008/0100202 A1* 5/2008 Cok .................. C23C 16/45525 313/503
2008/0157654 A1* 7/2008 Cok ...................... H05B 33/26 445/24
2010/0007270 A1* 1/2010 Suh ................... H10K 59/8731 313/504
2010/0007632 A1 1/2010 Yamazaki
2011/0148290 A1 6/2011 Oota
2012/0256204 A1 10/2012 Yoshizumi. et al.
2012/0273804 A1 11/2012 Hatano
2012/0276484 A1 11/2012 Izumi et al.
2013/0084531 A1 4/2013 Hamaguchi et al.
2013/0084664 A1 4/2013 Yoshitoku et al.
2013/0084666 A1 4/2013 Oshige
2013/0256639 A1* 10/2013 Kambe .................. H10K 71/00 257/40
2013/0280839 A1 10/2013 Sonoda. et al.
2013/0295705 A1 11/2013 Sonoda. et al.
2013/0313537 A1* 11/2013 Aratani ................ H10K 50/805 257/40
2014/0004640 A1 1/2014 Hamaguchi et al.
2014/0004642 A1 1/2014 Otsuka et al.
2014/0183478 A1* 7/2014 Lee ...................... H10K 77/111 257/40
2014/0231790 A1* 8/2014 Fujino .................. H10K 59/351 257/89
2014/0252317 A1* 9/2014 Gupta ............. H10K 59/80521 257/40
2014/0299879 A1 10/2014 Yamazaki
2015/0022515 A1 1/2015 Ikeda et al.
2015/0060826 A1 3/2015 Matsumoto. et al.
2015/0069360 A1 3/2015 Sato
2015/0076476 A1 3/2015 Odaka et al.
2016/0118626 A1* 4/2016 Seo ...................... H10K 59/351 257/89
2016/0147109 A1* 5/2016 Yamazaki ......... G02F 1/133514 257/40
2016/0172595 A1 6/2016 Malinowski et al.
2016/0315133 A1 10/2016 Sato
2017/0141167 A1 5/2017 Naganuma
2017/0149018 A1* 5/2017 Choi ...................... H10K 50/86
2017/0256754 A1 9/2017 Defranco et al.
2017/0278909 A1 9/2017 Jeon et al.
2018/0190908 A1 7/2018 Ke et al.
2019/0006440 A1 1/2019 Sun et al.
2019/0056543 A1* 2/2019 Ueda ...................... G02B 5/201
2019/0096975 A1* 3/2019 Park ..................... H10H 20/854
2020/0091247 A1* 3/2020 Lee ....................... G06F 3/0412
2020/0203662 A1 6/2020 Mollard. et al.
2020/0243620 A1* 7/2020 Abe ..................... H10K 50/841
2020/0274089 A1* 8/2020 Son .................... H10K 59/8792
2020/0334439 A1 10/2020 Sun et al.
2021/0020665 A1* 1/2021 Yamazaki ........... H10D 86/423
2021/0020699 A1* 1/2021 Yoshimura ............ H10K 59/35
2021/0327979 A1 10/2021 Kamada et al.
2021/0351236 A1* 11/2021 Shin ...................... G06F 1/1652
2021/0376286 A1* 12/2021 Fujimaki ................ H05B 33/02
2021/0408147 A1* 12/2021 Sun ...................... H10K 71/164
2021/0408432 A1* 12/2021 Wei ...................... G09G 3/3258
2022/0052292 A1* 2/2022 Watanabe ................. G09F 9/00
2022/0059638 A1* 2/2022 Yoshida .................... G09F 9/30
2022/0115468 A1* 4/2022 Huang ............... H10K 59/1201
2022/0173174 A1 6/2022 Hatsumi et al.
2022/0344448 A1* 10/2022 Zhang .................. H10K 59/122
2023/0117024 A1 4/2023 Kubota et al.
2023/0157123 A1* 5/2023 Kubota .................. H10F 39/12 257/40
2023/0354625 A1 11/2023 Kubota et al.
2024/0099068 A1* 3/2024 Yamazaki .............. H10K 59/38
2024/0315080 A1* 9/2024 Sonoda ..................... G09F 9/30
2024/0395974 A1* 11/2024 Yamazaki .......... H10H 20/8312
2025/0098439 A1* 3/2025 Hosaka .................. H10K 50/82

FOREIGN PATENT DOCUMENTS

CN 110162203 A 8/2019
CN 111626195 A 9/2020
CN 112673488 A 4/2021
JP 2000-036385 A 2/2000
JP 2003-059663 A 2/2003
JP 2006-091462 A 4/2006
JP 2008-098106 A 4/2008
JP 2008-147072 A 6/2008
JP 2008-251270 A 10/2008
JP 2010-040042 A 2/2010
JP 2013-232232 A 11/2013
JP 2014-120218 A 6/2014
JP 2014-135251 A 7/2014
JP 2014-197522 A 10/2014
JP 2014-232568 A 12/2014
JP 2015-026387 A 2/2015
JP 2015-038605 A 2/2015
JP 2015-115178 A 6/2015
JP 2016-035768 A 3/2016
JP 2016-197494 A 11/2016
JP 2019-109519 A 7/2019
JP 2019-179696 A 10/2019
JP 2020-160305 A 10/2020
JP 2020-166295 A 10/2020
KR 2016-0032099 A 3/2016
KR 2017-0113794 A 10/2017
KR 2021-0055699 A 5/2021
TW 201513079 4/2015
TW 201933318 8/2019
TW 202013783 4/2020
TW 202119381 5/2021
WO WO-2015/008680 1/2015
WO WO-2018/113207 6/2018
WO WO-2020/034726 2/2020

(56) References Cited

FOREIGN PATENT DOCUMENTS

| | | |
|---|---|---|
| WO | WO-2020/053692 | 3/2020 |
| WO | WO-2021/238972 | 12/2021 |

OTHER PUBLICATIONS

Written Opinion (Application No. PCT/IB2022/054651) Dated Aug. 9, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

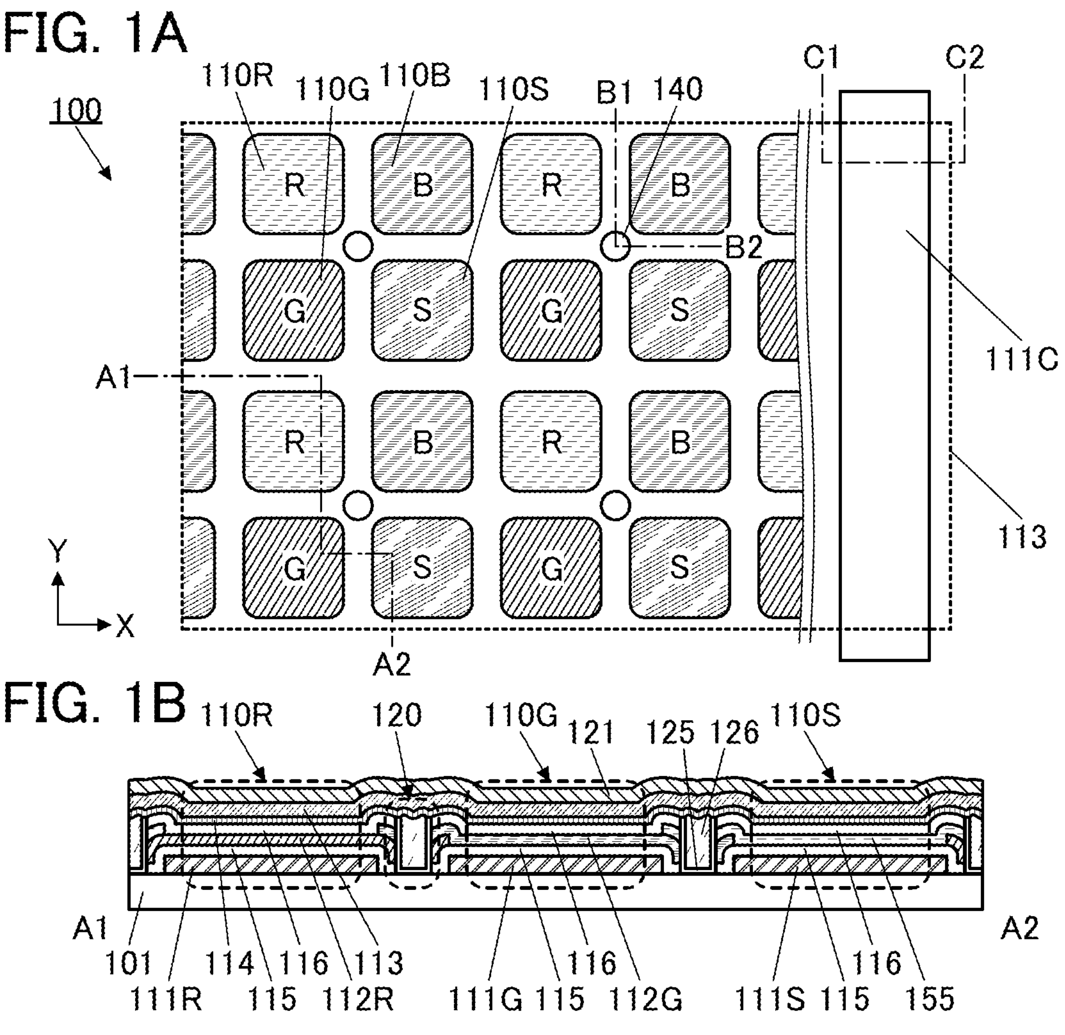
FIG. 1A
100
110R
110G
110B
110S
B1
140
C1
C2
B2
111C
A1
113
Y
X
A2
R
B
G
S
FIG. 1B
110R
120
110G
121
125
126
110S
A1
A2
101
114
116
113
111R
115
112R
111G
115
112G
111S
115
155
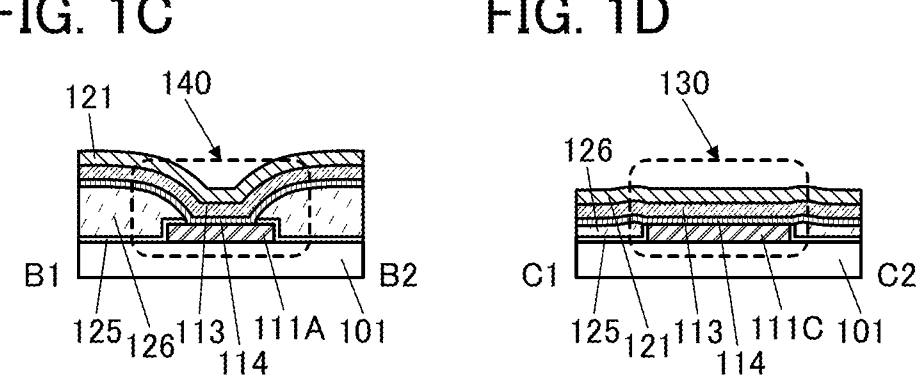
FIG. 1C
121
140
B1
B2
125
126
113
111A
101
114
FIG. 1D
130
126
C1
C2
125
121
113
111C
101
114

FIG. 22A
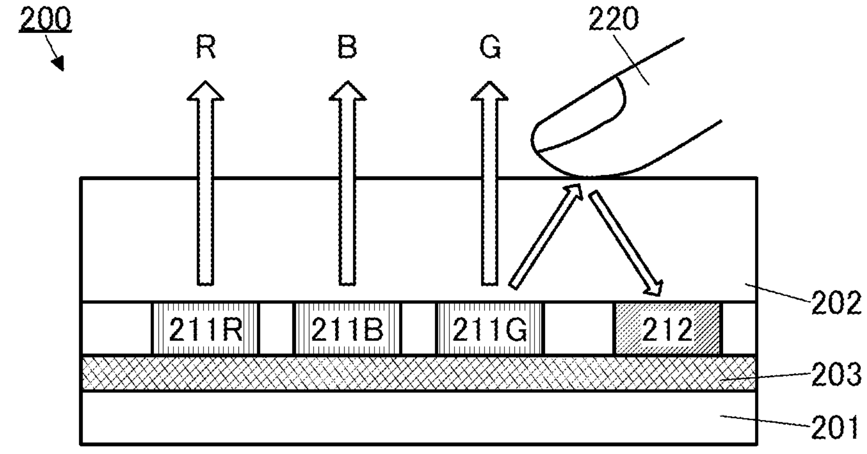
FIG. 22B
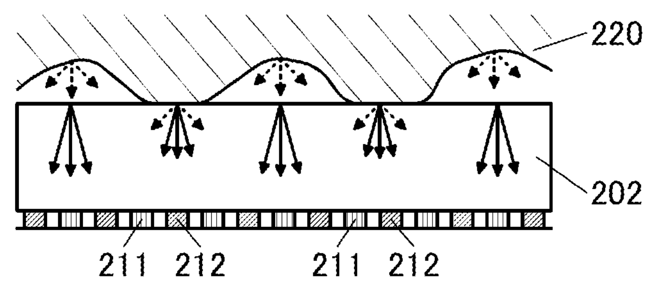
FIG. 22C
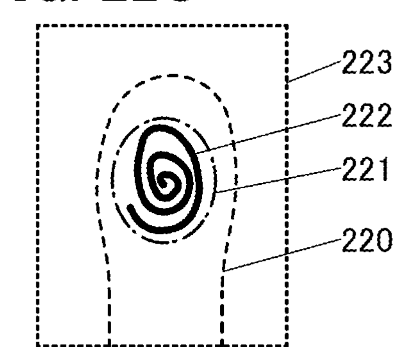
FIG. 22D
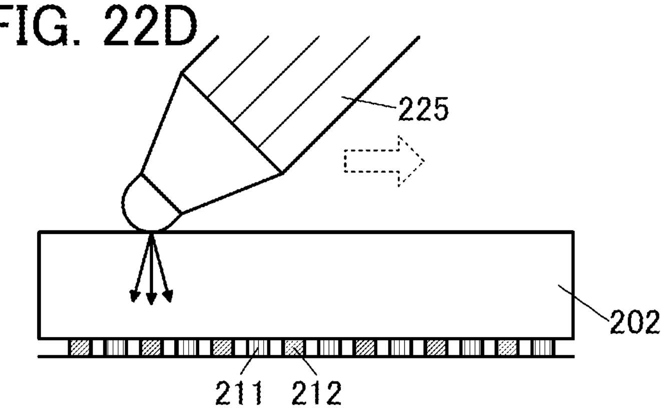
FIG. 22E
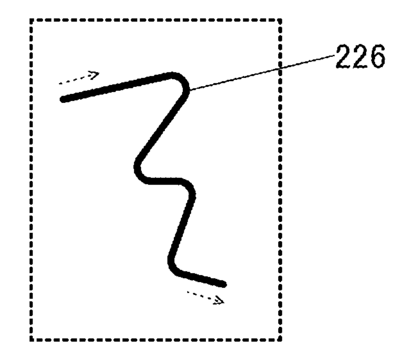
FIG. 22F
| 211R | 211G |
|---|---|
| 211B | 212 |
FIG. 22G
| 211 R | 211 G | 211 B |
|---|---|---|
| 212 | | |
FIG. 22H
| 211 R | 211 G | 211 B | 211 W |
|---|---|---|---|
| 212 | | | |

FIG. 24A
200B
B G R 220 G
211B 211G 213R
202 203 201
FIG. 24B
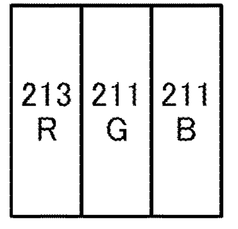
FIG. 24C
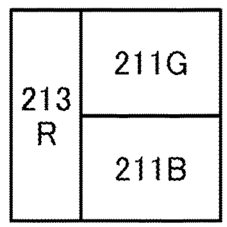
FIG. 24D
213R 211G
211B 211X
FIG. 24E
213R 211G 211B
211B 213R 211G
FIG. 24F
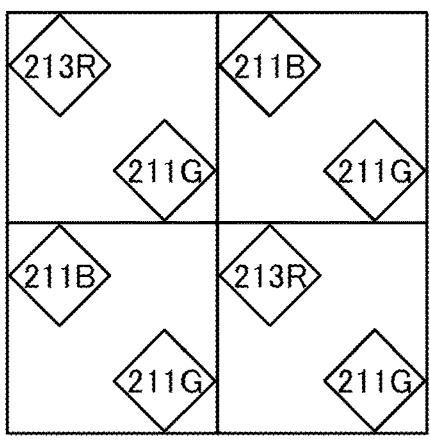
FIG. 24H
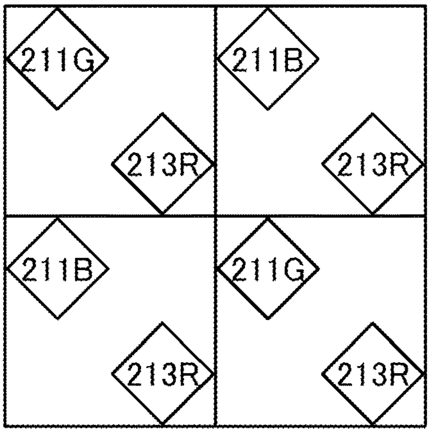
FIG. 24G
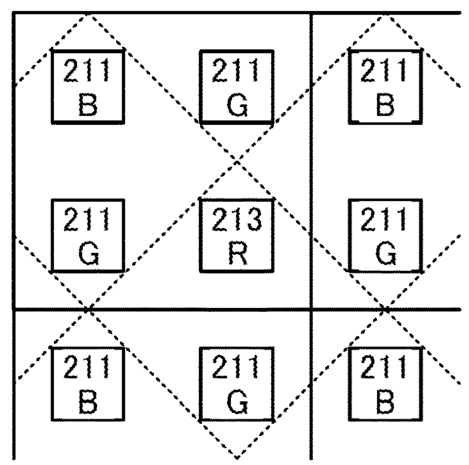
FIG. 24I
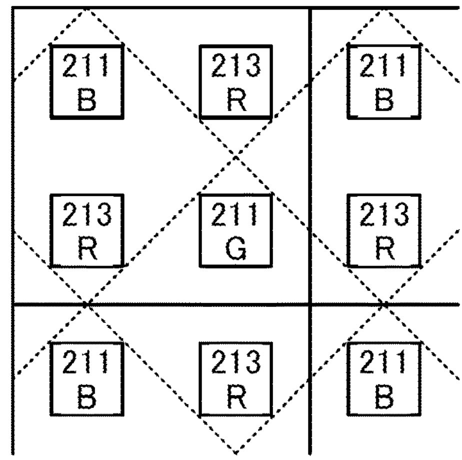

FIG. 26A
380C
370SR 370G 370B
R G B
375
385
384
383R 373 383G 383B
382
381
371 371 371
FIG. 26B
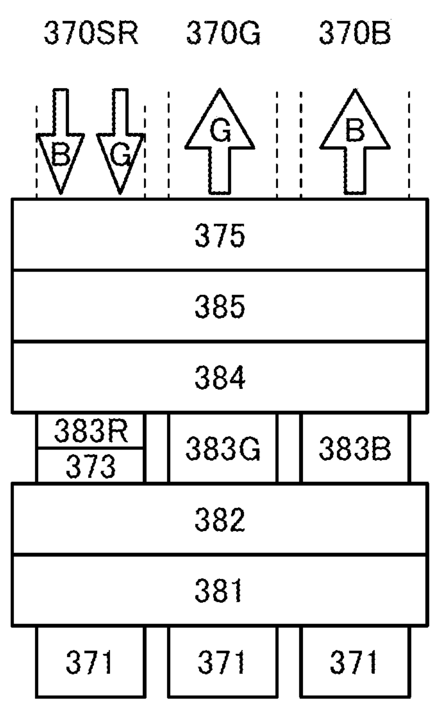
FIG. 26C
378
385
384
373
383R
382
381
377
FIG. 26D
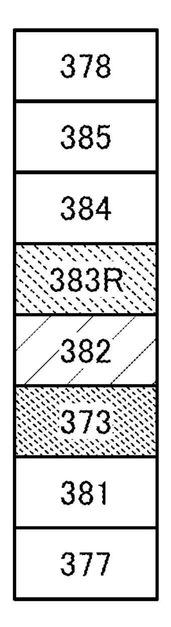
FIG. 26E
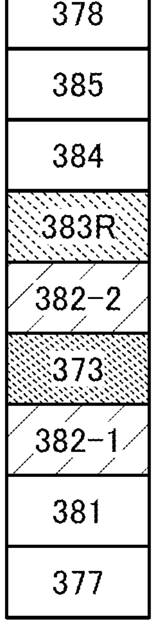
FIG. 26F
378
385
384
383R
373
381
377
FIG. 26G
378
385
384
389
382
381
377

701
702L
702R 701
702L
702R 701
702L
702R 701
702L
702R 701
702L
702R 701
702L
702R 701
702L
702R 701
702L
702R 701
702

701
702

FIG. 30A
FIG. 30B
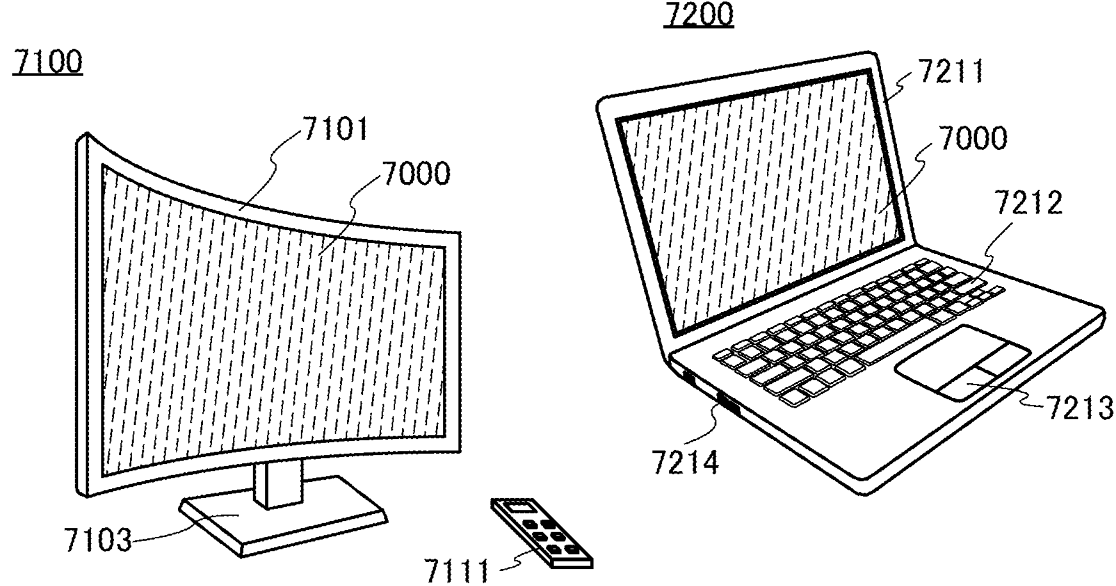
FIG. 30C
FIG. 30D
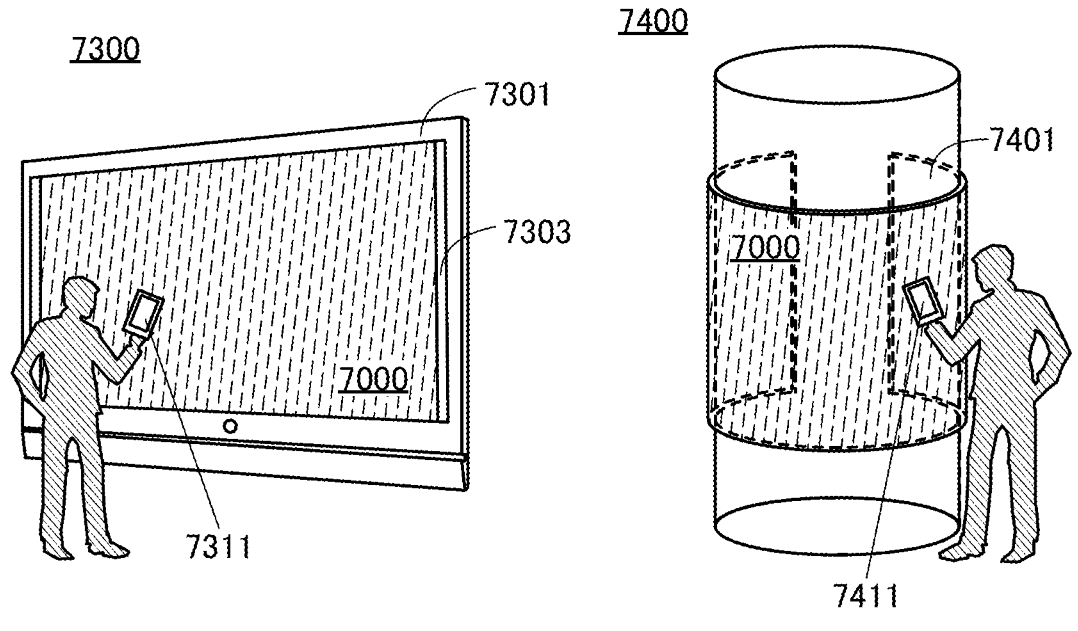

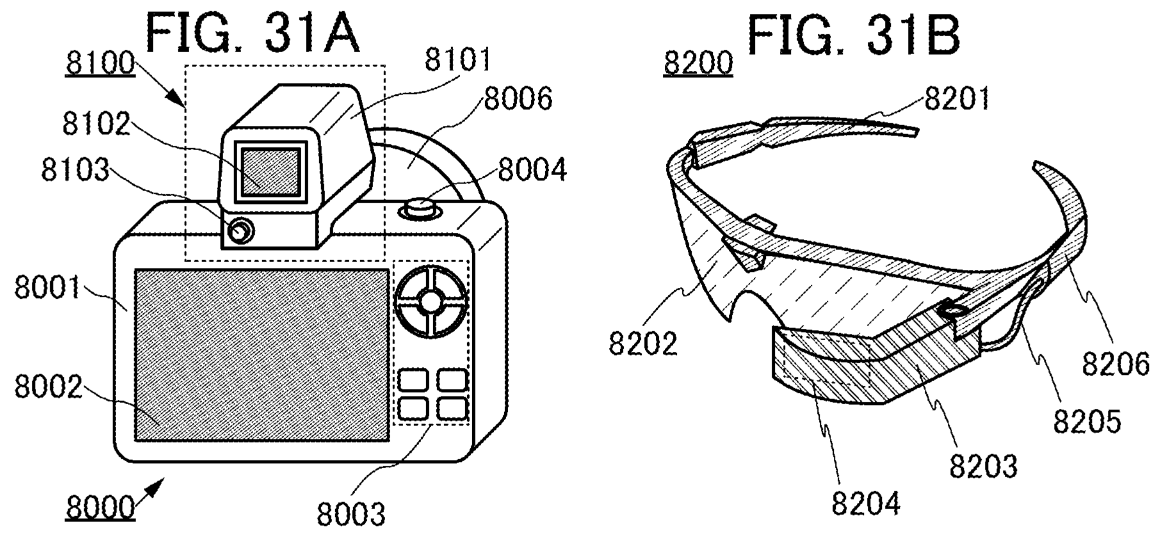
FIG. 31A
8100
8101
8102
8006
8103
8004
8001
8002
8000
8003
FIG. 31B
8200
8201
8202
8206
8205
8203
8204
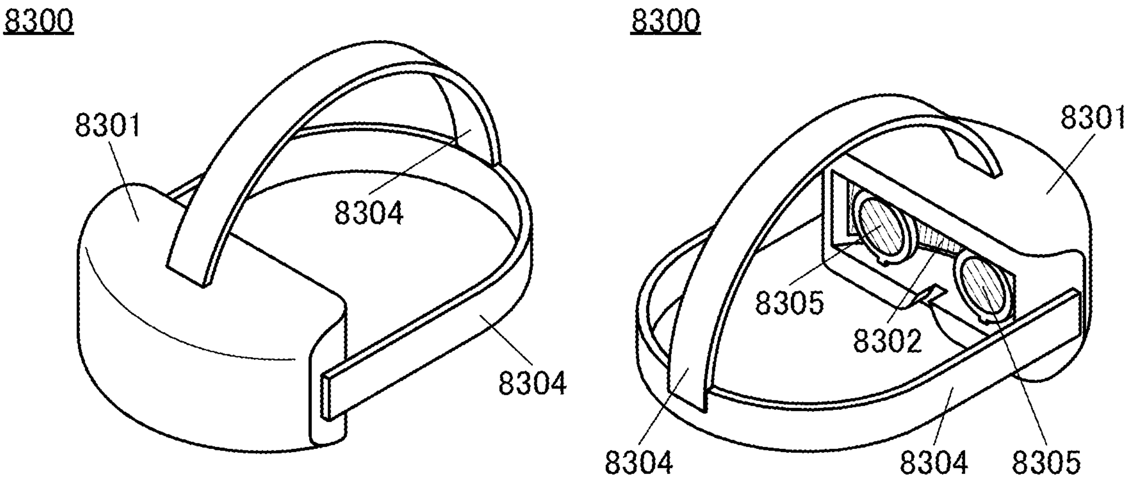
FIG. 31C
8300
8301
8304
8304
FIG. 31D
8300
8301
8305
8302
8304
8304
8305
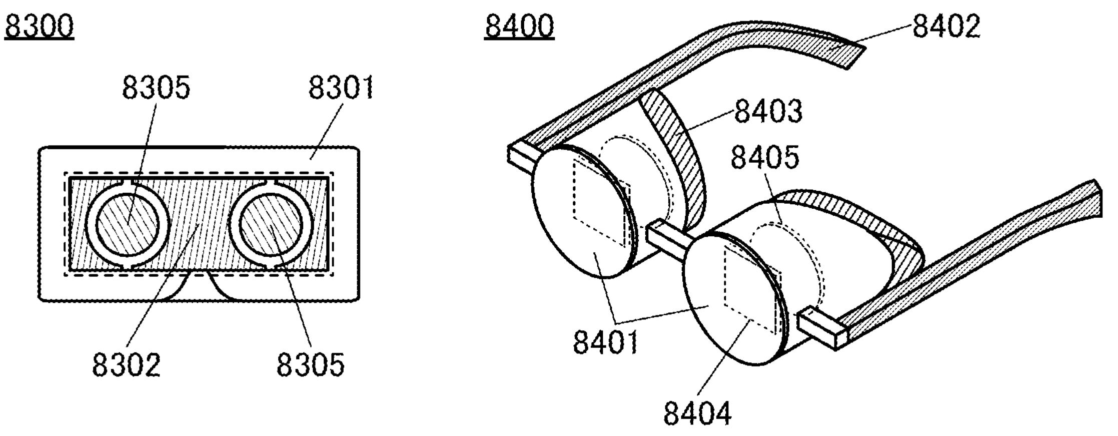
FIG. 31E
8300
8305
8301
8302
8305
FIG. 31F
8400
8402
8403
8405
8401
8404

DISPLAY APPARATUS

This application is a 371 of international application PCT/IB2022/054651 filed on May 19, 2022, which is incorporated herein by reference.

TECHNICAL FIELD

One embodiment of the present invention relates to a display apparatus. One embodiment of the present invention relates to an image capturing device. One embodiment of the present invention relates to a display apparatus having an image capturing function.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, display apparatuses have been required to have higher resolution in order to display high-definition images. In addition, display apparatuses used in information terminal devices such as smartphones, tablet terminals, and laptop PCs (personal computers) have been required to have lower power consumption as well as higher resolution. Furthermore, display apparatuses have been required to have a variety of functions such as a touch panel function and a function of capturing images of fingerprints for authentication, in addition to a function of displaying images.

Light-emitting apparatuses including light-emitting elements have been developed, for example, as display apparatuses. Light-emitting elements (also referred to as EL elements) utilizing an electroluminescence (hereinafter referred to as EL) phenomenon have features such as ease of reduction in thickness and weight, high-speed response to an input signal, and driving with a direct-constant voltage source, and have been used in display apparatuses. For example, Patent Document 1 discloses a flexible light-emitting apparatus including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having an image capturing function. Another object is to provide a high-resolution image capturing device or a high-resolution display apparatus. Another object is to provide a display apparatus or an image capturing device with a high aperture ratio. Another object is to provide an image capturing device or a display apparatus capable of image capturing with high sensitivity. Another object is to provide a display apparatus capable of obtaining biological information such as fingerprints. Another object is to provide a display apparatus that functions as a touch panel.

An object of one embodiment of the present invention is to provide a highly reliable display apparatus, a highly reliable image capturing device, or a highly reliable electronic device. An object of one embodiment of the present invention is to provide a display apparatus, an image capturing device, an electronic device, or the like that has a novel structure. An object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a display apparatus including a light-emitting element, a light-receiving element, a first resin layer, and a light-blocking layer. A first pixel electrode, a first organic layer, and a common electrode are stacked in this order in the light-emitting element. A second pixel electrode, a second organic layer, and the common electrode are stacked in this order in the light-receiving element. The first organic layer includes a first light-emitting layer, and the second organic layer includes a photoelectric conversion layer. The light-blocking layer includes a portion positioned between the light-emitting element and the light-receiving element in a plan view. The first resin layer is provided to cover the light-emitting element and the light-receiving element. The first resin layer includes portions positioned between the light-emitting element and the light-blocking layer and between the light-receiving element and the light-blocking layer. The first resin layer includes a portion with a thickness smaller than an arrangement interval between the light-emitting element and the light-receiving element in a region overlapping with the light-blocking layer.

In the above, a first spacer is preferably included. The first spacer includes a portion overlapping with the light-emitting element, and a portion positioned, in a plan view, between the light-emitting element and the light-receiving element. The first spacer preferably includes an opening portion overlapping with the light-receiving element. The light-blocking layer is preferably positioned between the first resin layer and the first spacer. The light-blocking layer preferably includes a portion covering an inner wall of the opening portion of the first spacer. In this case, the first resin layer preferably includes a portion smaller than the arrangement interval between the light-emitting element and the light-receiving element in a region overlapping with the first spacer and the light-blocking layer.

Another embodiment of the present invention is a display apparatus including a light-emitting element, a light-receiving element, a first resin layer, a light-blocking layer, and a second spacer. A first pixel electrode, a first organic layer, and a common electrode are stacked in this order in the light-emitting element. A second pixel electrode, a second organic layer, and the common electrode are stacked in this order in the light-receiving element. The first organic layer includes a first light-emitting layer, and the second organic layer includes a photoelectric conversion layer. The second spacer includes a portion overlapping with the light-receiving element, and a portion positioned, in a plan view, between the light-emitting element and the light-receiving element. The second spacer does not overlap with the light-emitting element. The light-blocking layer is provided to cover a top surface and a side surface of a side end portion of the second spacer. The first resin layer is provided to cover the light-emitting element, the light-receiving element, the second spacer, and the light-blocking layer.

Another embodiment of the present invention is a display apparatus including a light-emitting element, a light-receiving element, a first resin layer, a light-blocking layer, and a protective layer. A first pixel electrode, a first organic layer, and a common electrode are stacked in this order in the light-emitting element. A second pixel electrode, a second organic layer, and the common electrode are stacked in this order in the light-receiving element. The first organic layer includes a first light-emitting layer, and the second organic layer includes a photoelectric conversion layer. The protective layer is provided to cover the light-emitting element and the light-receiving element. The protective layer includes portions positioned between the first resin layer and the light-emitting element and between the first resin layer and the light-receiving element. The light-blocking layer includes a portion positioned between the light-emitting element and the light-receiving element in a plan view. The light-blocking layer includes a portion in contact with the protective layer. The first resin layer is divided with the light-blocking layer as a boundary.

In any of the above, a second resin layer positioned in a region between the light-emitting element and the light-receiving element is preferably included. In this case, the second resin layer preferably includes a portion not overlapping with the first organic layer, the second organic layer, the first pixel electrode, and the second pixel electrode but overlapping with the common electrode.

In the above, the second resin layer is preferably divided into a first portion positioned on a side of the light-emitting element and a second portion positioned on a side of the light-receiving element. The common electrode is preferably provided to cover the first portion and the second portion and fill a gap between the first portion and the second portion.

In any of the above, a first insulating layer positioned between the light-emitting element and the light-receiving element is preferably included. The first insulating layer is preferably in contact with an end portion of the first organic layer and an end portion of the second organic layer.

In any of the above, a first layer and a second layer are preferably included between the light-emitting element and the light-receiving element. The first layer overlaps with the second organic layer and contains the same material as the first organic layer. The second layer overlaps with the first organic layer and contains the same material as the second organic layer. The end portion of the first organic layer and an end portion of the first layer are preferably provided to face each other in the region between the light-emitting element and the light-receiving element. The end portion of the second organic layer and an end portion of the second layer are preferably provided to face each other in the region between the light-emitting element and the light-receiving element.

Effect of the Invention

According to one embodiment of the present invention, a display apparatus having an image capturing function can be provided. A high-resolution image capturing device or a high-resolution display apparatus can be provided. A display apparatus or an image capturing device with a high aperture ratio can be provided. An image capturing device or a display apparatus capable of high-sensitivity image capturing can be provided. A display apparatus capable of obtaining biological information such as fingerprints can be provided. A display apparatus functioning as a touch panel can be provided.

According to one embodiment of the present invention, a highly reliable display apparatus, a highly reliable image capturing device, or a highly reliable electronic device can be provided. A display apparatus, an image capturing device, an electronic device, or the like having a novel structure can be provided. At least one of problems of the conventional technique can be at least reduced.

Note that the description of these effects does not preclude the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIG. 1A to FIG. 1D are diagrams illustrating a structure example of a display apparatus.

FIG. 10A and FIG. 10B are diagrams each illustrating a structure example of a display apparatus.

FIG. 13A and FIG. 13B are diagrams each illustrating a structure example of a display apparatus.

FIG. 14A and FIG. 14B are diagrams each illustrating a structure example of a display apparatus.

FIG. 22A, FIG. 22B, and FIG. 22D are cross-sectional views each illustrating an example of a display apparatus. FIG. 22C and FIG. 22E are diagrams each illustrating an example of an image.

FIG. 22F to FIG. 22H are top views each illustrating an example of a pixel.

FIG. 24A is a cross-sectional view illustrating a structure example of a display apparatus. FIG. 24B to FIG. 24I are top views each illustrating an example of a pixel.

FIG. 26A to FIG. 26G are diagrams each illustrating a structure example of a display apparatus.

FIG. 30A to FIG. 30D are diagrams each illustrating an example of an electronic device.

FIG. 31A to FIG. 31F are diagrams each illustrating an example of an electronic device.

MODE FOR CARRYING OUT THE INVENTION

Figure 2A:
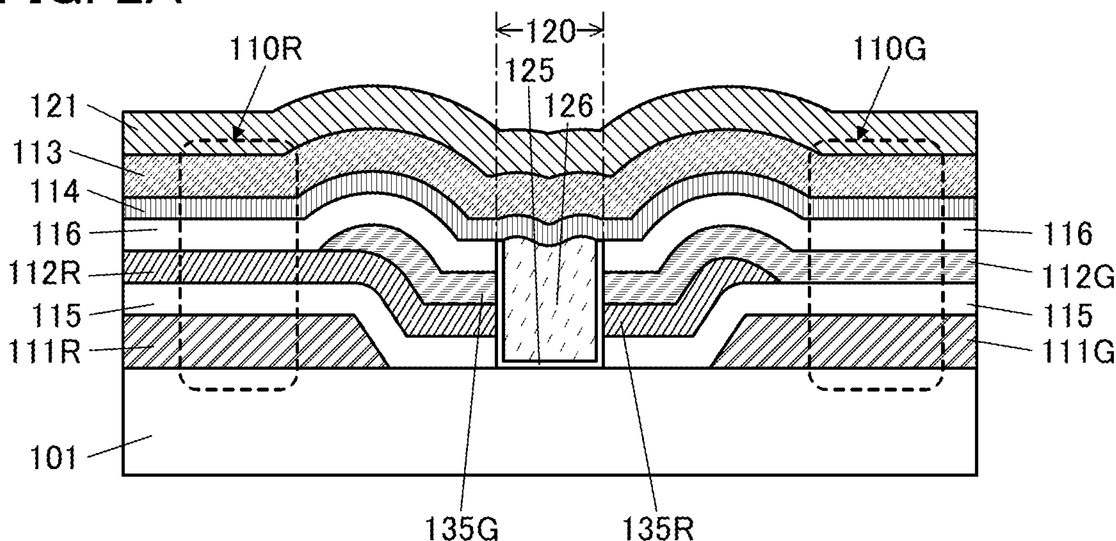
FIG. 2A and FIG. 2B are diagrams illustrating a structure example of a display apparatus.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not necessarily limited to the illustrated scale.

Note that in this specification and the like, ordinal numbers such as "first" and "second" are used in order to avoid confusion among components and do not limit the number.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacking order (or formation order) of a stacked body or the like is described, even in the case where a surface on which the stacked body is provided (e.g., a formation surface, a support surface, an adhesion surface, or a planar surface) is positioned above the stacked body in the drawings, the direction and the opposite direction are expressed using "under" and "over", respectively, in some cases.

In addition, in this specification and the like, the term "film" and the term "layer" can be interchanged with each other. For example, in some cases, the term "conductive layer" and the term "insulating layer" can be interchanged with the term "conductive film" and the term "insulating film," respectively.

Note that in this specification, an EL layer means a layer containing at least a light-emitting substance (also referred to as a light-emitting layer) or a stacked body including the light-emitting layer provided between a pair of electrodes of a light-emitting element.

In this specification and the like, a display panel that is one embodiment of a display apparatus has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display apparatus of one embodiment of the present invention and an example of a manufacturing method of the display apparatus will be described.

One embodiment of the present invention is a display apparatus including a light-emitting element (also referred to as a light-emitting device) and a light-receiving element (also referred to as a light-receiving device). The light-emitting element includes a pair of electrodes and an EL layer between them. The light-receiving element includes a pair of electrodes and an active layer between them. The light-emitting element is preferably an organic EL element (organic electroluminescent element). The light-receiving element is preferably an organic photodiode (organic photoelectric conversion element).

The display apparatus preferably includes two or more light-emitting elements emitting light of different colors. The light-emitting elements emitting light of different colors include respective EL layers containing different materials. For example, three kinds of light-emitting elements emitting light of red (R), green (G), and blue (B) are included, whereby a full-color display apparatus can be achieved.

One embodiment of the present invention is capable of image capturing by a plurality of light-receiving elements and thus functions as an image capturing device. In this case, the light-emitting elements can be used as a light source for image capturing. Moreover, one embodiment of the present invention is capable of displaying an image with the plurality of light-emitting elements and thus functions as a display apparatus. Accordingly, one embodiment of the present invention can be regarded as a display apparatus that has an image capturing function or an image capturing device that has a display function.

For example, in the display apparatus of one embodiment of the present invention, light-emitting elements are arranged in a matrix in a display portion, and light-receiving elements are also arranged in a matrix in the display portion. Hence, the display portion has a function of displaying an image and a function of a light-receiving portion. An image can be captured by the plurality of light-receiving elements provided in the display portion, so that the display apparatus can function as an image sensor, a touch panel, or the like. That is, the display portion can capture an image or detect an object approaching or touching, for example. Furthermore, since the light-emitting elements provided in the display portion can be used as a light source at the time of receiving light, a light source does not need to be provided separately from the display apparatus; thus, a highly functional display apparatus can be provided without increasing the number of electronic components.

In one embodiment of the present invention, when an object reflects light emitted from the light-emitting element included in the display portion, the light-receiving element can detect the reflected light; thus, image capturing, touch (including non-contact touch) detecting, or the like can be performed even in a dark environment.

Furthermore, when a finger, a palm, or the like touches the display portion in the display apparatus of one embodiment of the present invention, an image of the fingerprint or the palm print can be captured. Thus, an electronic device including the display apparatus of one embodiment of the present invention can perform personal authentication by using the captured image of the fingerprint, the palm print, or the like. Accordingly, an image capturing device for the fingerprint authentication, the palm-print authentication, or the like does not need to be additionally provided, and the number of components of the electronic device can be reduced. Since the light-receiving elements are arranged in a matrix in the display portion, an image of a fingerprint, a palm print, or the like can be captured in any position in the display portion, which can provide a highly convenient electronic device.

It is known that in the case where some or all of EL layers are separately formed for light-emitting elements of different colors, the EL layers are formed by an evaporation method using a shadow mask such as a fine metal mask (hereinafter, also referred to as an FMM). However, this method causes a deviation from the designed shape and position of an island-shaped organic film due to various influences such as the accuracy of the FMM, the positional deviation between the FMM and a substrate, a warp of the FMM, and the vapor-scattering-induced expansion of outline of the deposited film; accordingly, it is difficult to achieve a high resolution and a high aperture ratio of the display apparatus. Thus, a measure has been taken for pseudo improvement in resolution (also referred to pixel density) by employing a unique pixel arrangement such as a PenTile arrangement, for example.

In the manufacturing method using an FMM, two adjacent island-shaped organic films can be formed to partly overlap with each other in order to achieve higher resolution and a higher aperture ratio as much as possible. Thus, the distance between light-emitting regions can be significantly shortened compared with the case where the two adjacent island-shaped organic films do not overlap with each other. However, when the two adjacent island-shaped organic films are formed to overlap with each other, leakage current might be generated through the organic films formed to overlap with each other between two adjacent light-emitting elements and unintentional light emission might occur. This causes a decrease in luminance, a decrease in contrast, or the like, leading to a reduction in display quality. Furthermore, power efficiency, power consumption, or the like is adversely affected by the leakage current.

In addition, in the case where the leakage current is also generated between the light-emitting element and the light-receiving element, the leakage current is a factor of noise in an image capturing by the light-receiving element; thus, the sensitivity of the image capturing (a signal-noise ratio (S/N ratio)) might be reduced.

In view of the above, the organic films are separately formed using the FMM so as to partly overlap with each other between the light-emitting element and the light-receiving element adjacent to each other or between two adjacent light-emitting elements in one embodiment of the present invention. Specifically, a layer containing a light-emitting compound in the light-emitting element (also referred to as a light-emitting layer) and a layer containing a photoelectric conversion material in the light-receiving element (also referred to as an active layer or a photoelectric conversion layer) are separately formed using the FMM. In that case, the organic film that can be shared between the light-emitting element and the light-receiving element is not separately formed from other organic films and a film shared between the light-emitting elements and between the light-emitting element and the light-receiving element may be used. An organic stacked film in which a light-emitting layer, an active layer, and other organic films are stacked is positioned between the light-emitting element and the light-receiving element adjacent to each other. Next, part of the organic stacked film is etched by a photolithography method, so that the organic stacked film is divided. Accordingly, a current leakage path between the light-emitting element and the light-receiving element can be cut. Therefore, noise in an image capturing using the light-receiving element can be reduced and an image capturing with high sensitivity can be performed.

Accordingly, the leakage current between the light-emitting element and the light-receiving element (also referred to as side leakage or side leakage current) is inhibited, and an image can be captured with a high S/N ratio and high accuracy. Thus, a clear image can be captured even with faint light. Therefore, the luminance of the light-emitting element used as a light source in image capturing can be low, leading to reduced power consumption.

Moreover, a current leakage path between two adjacent light-emitting elements can be cut. Thus, it is possible to increase luminance, contrast, and power efficiency or to reduce power consumption, for example.

Furthermore, an insulating layer is preferably formed to protect a side surface of the organic stacked film that is exposed by etching. This can increase the reliability of the display apparatus.

The organic film formed using the FMM may be provided to overlap not only with a pixel electrode of a target element but also with a pixel electrode of an element adjacent to the target element. Accordingly, the pixel electrodes can be arranged with higher density. In this case, part of the organic film separated from the adjacent element overlaps with the pixel electrode of one element.

An electrode electrically connected to a common electrode is preferably provided between the two adjacent light-emitting elements or between the light-emitting element and the light-receiving element. The electrode can be used as an auxiliary electrode or an auxiliary wiring for supplementing the conductivity of the common electrode. Alternatively, the electrode can be used for connecting the common electrode and the auxiliary wiring. Accordingly, an influence of a drop in voltage due to the electric resistance of the common electrode can be reduced even in a large-sized display apparatus.

Hereinafter, structure examples and manufacturing method examples of a display apparatus of one embodiment of the present invention will be described with reference to drawings.

Structure Example 1

FIG. 1A illustrates a schematic top view of a display apparatus 100. The display apparatus 100 includes a plurality of light-emitting elements 110R exhibiting red, a plurality of light-emitting elements 110G exhibiting green, a plurality of light-emitting elements 110B exhibiting blue, and a plurality of light-receiving elements 110*s*. In FIG. 1A, light-emitting regions of the light-emitting elements and the light-receiving element are denoted by R, G, B, and S to easily differentiate the light-emitting elements.

The light-emitting elements 110R, the light-emitting elements 110G, the light-emitting elements 110B, and the light-receiving elements 110S are arranged in a matrix. FIG. 1A illustrates a structure in which two elements are alternately arranged in one direction. Note that the arrangement method of the light-emitting elements is not limited thereto; another arrangement method such as stripe arrangement, S stripe arrangement, delta arrangement, Bayer arrangement, or zigzag arrangement may be used, or PenTile arrangement, diamond arrangement, or the like can be used.

As the light-emitting elements 110R, the light-emitting elements 110G, and the light-emitting elements 110B, EL elements such as OLEDs (Organic Light Emitting Diodes) or QLEDs (Quantum-dot Light Emitting Diodes) are preferably used. As a light-emitting substance contained in the EL element, a substance that emits fluorescent light (a fluorescent material), a substance that emits phosphorescent light (a phosphorescent material), a substance that exhibits thermally activated delayed fluorescence (a thermally activated delayed fluorescent (TADF) material), and the like can be given. As the light-emitting substance contained in the EL element, not only organic compounds but also inorganic compounds (e.g., quantum dot materials) can be used.

As the light-receiving element 110S, a pn photodiode or a pin photodiode can be used, for example. The light-receiving element 110S functions as a photoelectric conversion element that detects light incident on the light-receiving element 110S and generates charge. The amount of generated charge in the photoelectric conversion element is determined depending on the amount of incident light. It is particularly preferable to use an organic photodiode including a layer containing an organic compound as the light-receiving element 110S. An organic photodiode, which is easily made thin, lightweight, and large in area and has a high degree of freedom for shape and design, can be used in a variety of devices.

FIG. 1A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by the dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, the top surface of the connection electrode 111C can have a belt-like shape, an L-like shape, a U-like shape (a square bracket shape), a quadrangular shape, or the like.

FIG. 1A illustrates connection portions 140. The connection portions 140 are each a portion where the common electrode 113 and an electrode 111A are connected to each other. The electrode 111A itself may function as an auxiliary wiring, or may function as an electrode or a wiring for connecting an auxiliary wiring and the common electrode 113. The arrangement method of the connection portions 140 is not limited: the connection portions 140 may be arranged periodically or non-periodically (randomly).

FIG. 1B, FIG. 1C, and FIG. 1D are schematic cross-sectional views taken along the dashed-dotted line A1-A2, the dashed-dotted line B1-B2, and the dashed-dotted line C1-C2 in FIG. 1A, respectively. FIG. 1B illustrates a schematic cross-sectional view of the light-emitting element 110G, the light-emitting element 110R, and the light-receiving element 110S, FIG. 1C illustrates a schematic cross-sectional view of the connection portion 140, and FIG. 1D illustrates a schematic cross-sectional view of the connection electrode 111C.

FIG. 1B illustrates cross sections of the light-emitting element 110R, the light-emitting element 110G, and the light-receiving element 110S. The light-emitting element 110R includes a pixel electrode 111R, an organic layer 115, an organic layer 112R, an organic layer 116, an organic layer 114, and the common electrode 113. The light-emitting element 110G includes a pixel electrode 111G, the organic layer 115, an organic layer 112G, the organic layer 116, the organic layer 114, and the common electrode 113. The light-receiving element 110S includes a pixel electrode 111S, the organic layer 115, an organic layer 155, the organic layer 116, the organic layer 114, and the common electrode 113. The organic layer 114 and the common electrode 113 are shared by the light-emitting element 110R, the light-emitting element 110G, the light-receiving element 110S, and the light-emitting element 110B (not illustrated). The organic layer 114 can also be referred to as a common layer.

The organic layer 112R included in the light-emitting element 110R contains at least a light-emitting organic compound that emits red light. The organic layer 112G included in the light-emitting element 110G contains at least a light-emitting organic compound that emits green light. An organic layer 112B included in the light-emitting element 110B (not illustrated) contains at least a light-emitting organic compound that emits blue light. The organic layer 112R, the organic layer 112G, and the organic layer 112B can each be referred to as a light-emitting layer.

The organic layer 155 included in the light-receiving element 110S contains a photoelectric conversion material having sensitivity in a wavelength range of visible light or infrared light. A wavelength range to which the photoelectric conversion material contained in the organic layer 155 is sensitive preferably includes one or more of the wavelength range of light emitted from the light-emitting element 110R, the wavelength range of light emitted from the light-emitting element 110G, and the wavelength range of light emitted from the light-emitting element 110B. Alternatively, a photoelectric conversion material having sensitivity to infrared light, which has a longer wavelength than light emitted from the light-emitting element 110R, may be used. The organic layer 155 can also be referred to as an active layer or a photoelectric conversion layer.

Hereafter, the term "light-emitting element 110" is sometimes used to describe matters common to the light-emitting element 110R, the light-emitting element 110G, and the light-emitting element 1101B. In the same manner, in the description common to the components that are distinguished by alphabets, such as the organic layer 112R, the organic layer 112G, and the organic layer 112B, reference numerals without alphabets are sometimes used.

In each light-emitting element, a stacked film positioned between the pixel electrode and the common electrode 113 can be referred to as an EL layer. In the light-receiving element 110S, a stacked film positioned between the pixel electrode 111S and the common electrode 113 can be referred to as a PD layer.

In each light-emitting element or the light-receiving element 110S, the organic layer 115 is positioned between the pixel electrode 111 and the organic layer 112 or the organic layer 155. The organic layer 116 is positioned between the organic layer 114 and the organic layer 112 or the organic layer 155. The organic layer 114 is positioned between the organic layer 116 and the common electrode 113.

The organic layer 115, the organic layer 116, and the organic layer 114 can each independently include one or more of an electron-injection layer, an electron-transport layer, a hole-injection layer, and a hole-transport layer. For example, it is possible to employ a structure in which the organic layer 115 includes a stacked-layer structure of a hole-injection layer and a hole-transport layer from the pixel electrode 111 side, the organic layer 116 includes an electron-transport layer, and the organic layer 114 includes an electron-injection layer. Alternatively, it is possible to employ a structure in which the organic layer 115 has a stacked-layer structure of an electron-injection layer and an electron-transport layer from the pixel electrode 111 side, the organic layer 116 includes a hole-transport layer, and the organic layer 114 includes a hole-injection layer.

Note that as for a layer positioned between a pair of electrodes of the light-emitting element or the light-receiving element 110S, such as the organic layer 112, the organic layer 114, the organic layer 115, the organic layer 116, or the organic layer 155, the name "organic layer" implies a "layer that constitutes an organic EL element or an organic photoelectric conversion element" and does not necessarily mean that an organic layer contains an organic compound. For example, a film not containing an organic compound but containing only an inorganic compound or an inorganic substance can be used for the organic layer 112, the organic layer 114, the organic layer 115, and the organic layer 116.

The pixel electrode 111R, the pixel electrode 111G, and a pixel electrode 111B (not illustrated) are provided for the respective light-emitting elements. The common electrode 113 and the organic layer 114 are provided as continuous layers shared by the light-emitting elements and the light-receiving element 110S. A conductive film that transmits visible light is used for either the respective pixel electrodes or the common electrode 113, and a reflective conductive film is used for the other. When the respective pixel electrodes are light-transmitting electrodes and the common electrode 113 is a reflective electrode, a bottom-emission display apparatus can be obtained. When the respective pixel electrodes are reflective electrodes and the common electrode 113 is a light-transmitting electrode, a top-emission display apparatus can be obtained. Note that when both the respective pixel electrodes and the common electrode 113 are light-transmitting electrodes, a dual-emission display apparatus can be obtained.

A protective layer 121 is provided over the common electrode 113 so as to cover the light-emitting element 110R, the light-emitting element 110G, the light-receiving element 110S, and the light-emitting element 110B (not illustrated). The protective layer 121 has a function of preventing diffusion of impurities such as water into the light-emitting elements from the above.

A slit 120 is provided between the light-emitting element and the light-receiving element 110S adjacent to each other or between two adjacent light-emitting elements. The slit 120 corresponds to a portion where the organic layer 115, the organic layer 116, and the organic layer 112 or the organic layer 155 positioned between the light-emitting element and the light-receiving element 110S adjacent to each other or between the two adjacent light-emitting elements are etched.

In the slit 120, an insulating layer 125 and a resin layer 126 are provided. The insulating layer 125 is provided along the sidewalls and bottom surface of the slit 120. The resin layer 126 is provided over the insulating layer 125 and has a function of filling a depressed portion positioned in the slit 120 and planarizing the top surface. The depressed portion of the slit 120 is filled with the resin layer 126 for planarization, whereby coverage with the organic layer 114, the common electrode 113, and the protective layer 121 can be improved.

The slit 120 can be formed at the same time as the formation of an opening portion for an external connection terminal such as the connection electrode 111C; thus, they can be formed without increasing the number of steps. Since the slit 120 includes the insulating layer 125 and the resin layer 126, an effect of preventing a short circuit between the pixel electrode 111 and the common electrode 113 is produced. The resin layer 126 has an effect of improving adhesion of the organic layer 114. That is, providing the resin layer 126 improves adhesion of the organic layer 114, so that film separation of the organic layer 114 can be inhibited.

The insulating layer 125 is provided in contact with a side surface of the organic layer (e.g., the organic layer 115); thus, a structure where the organic layer and the resin layer 126 are not in contact with each other can be obtained. When the organic layer and the resin layer 126 are in contact with each other, the organic layer might be dissolved by an organic solvent or the like included in the resin layer 126. In view of this, the insulating layer 125 is provided between the organic layer and the resin layer 126 as described in this embodiment to protect the side surface of the organic layer. Note that the slit 120 can have a structure that allows division of at least any one or more of a hole-injection layer, a hole-transport layer, an electron-blocking layer, a light-emitting layer, an active layer, a hole-blocking layer, an electron-transport layer, and an electron-injection layer.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film, which is formed by an ALD method, is used as the insulating layer 125, the insulating layer 125 having few pinholes and an excellent function of protecting the EL layer can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 125 can be formed by a sputtering method, a CVD method, a PLD method, an ALD method, or the like. The insulating layer 125 is preferably formed by an ALD method achieving good coverage.

An insulating layer containing an organic material can be suitably used as the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the resin layer 126, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used.

Moreover, for the resin layer 126, a photosensitive resin can be used. A photoresist may be used for the photosensitive resin. As the photosensitive resin, a positive photosensitive material or a negative photosensitive material can be used.

A colored material (e.g., a material containing a black pigment) may be used for the resin layer 126 so that the resin layer 126 has a function of blocking stray light from an adjacent pixel and inhibiting color mixture. As the colored material, a resin material that can be used in a color filter (a color filter material) can be used. Using a resin material obtained by mixing color filter materials of two or three or more colors is particularly preferred to enhance the effect of blocking visible light. In particular, mixing color filter materials of three or more colors enables the formation of a black or nearly black resin layer.

A reflective film (e.g., a metal film containing one or more selected from silver, palladium, copper, titanium, aluminum, and the like) may be provided between the insulating layer 125 and the resin layer 126 so that light emitted from the light-emitting layer is reflected by the reflective film; hence, the function of increasing the light extraction efficiency may be added.

Although the top surface of the resin layer 126 is preferably as flat as possible, its surface has a gently curved surface shape in some cases. FIG. 1B and the like illustrate an example in which the top surface of the resin layer 126 has a wave shape with a depressed portion and a projected portion; however, one embodiment of the present invention is not limited thereto. For example, the top surface of the resin layer 126 may be a convex surface, a concave surface, or a flat surface.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, a top surface of the organic insulating film can be flat, and accordingly, coverage with the inorganic insulating film over the organic insulating film is improved, leading to an improvement in barrier properties. Moreover, this structure is preferable because when a component (e.g., a color filter, an electrode of a touch sensor, a lens array, or the like) is provided above the protective layer 121, the flat top surface of the protective layer 121 allows the component to be less affected by an uneven shape caused by the lower components.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as an indium gallium oxide or an indium gallium zinc oxide may be used for the protective layer 121.

FIG. 1C illustrates the connection portion 140 in which the electrode 111A is electrically connected to the common electrode 113. In the connection portion 140, an opening portion is provided in the insulating layer 125 and the resin layer 126 over the electrode 111A. In the opening portion, the electrode 111A and the common electrode 113 are electrically connected to each other with the organic layer 114 therebetween.

FIG. 1C illustrates a connection portion 130 in which the connection electrode 111C is electrically connected to the common electrode 113. In the connection portion 130, the common electrode 113 is provided over the connection electrode 111C with the organic layer 114 therebetween. The insulating layer 125 is provided in contact with a side surface of the connection electrode 111C, and the resin layer 126 is provided over the insulating layer 125.

Note that the organic layer 114 is not necessarily provided in the connection portion 130. In this case, in the connection portion 130, the common electrode 113 is provided over and in contact with the connection electrode 111C and the protective layer 121 is provided to cover the common electrode 113.

The connection portion 130 and the connection portion 140 can be formed in a similar manner and they have similar structures; however, the resin layer 126 is thicker in the connection portion 140 than in the connection portion 130. This is because the surroundings of the connection portion 130 are relatively flat, while the connection portion 140 is surrounded by the light-emitting element, the light-receiving element, or the like.

Next, a preferable structure of the slit 120 and its vicinity is described in detail. FIG. 2A is a schematic cross-sectional view including part of the light-emitting element 110R, part of the light-emitting element 110G, and a region therebetween in FIG. 1B.

As illustrated in FIG. 2A, an end portion of the pixel electrode 111 preferably has a tapered shape. This can improve the step coverage with the organic layer 115 and the like. Note that in this specification and the like, an end portion of an object having a tapered shape indicates that the end portion of the object has a cross-sectional shape in which the angle between a surface of the object and a surface on which the object is formed is greater than 0° and less than 900 in a region of the end portion, and the thickness continuously increases from the end portion. Although the pixel electrode 111R and the like illustrated here have a single-layer structure but may include a plurality of layers stacked.

The organic layer 115 is provided to cover the pixel electrode 111R. The organic layer 115 is provided to cover the pixel electrode 111G. These organic layers 115 are formed by dividing a continuous film with the slit 120.

The organic layer 112R is provided to cover the organic layer 115 on the light-emitting element 110R side with respect to the slit 120. A layer 135R is provided over the organic layer 115 on the light-emitting element 110G side with respect to the slit 120. The layer 135R can also be referred to as a cut piece formed when part of a film to be the organic layer 112R is divided by the slit 120 and remains on the light-emitting element 110G side. The layer 135R and the organic layer 112R are provided apart from each other with the slit 120 therebetween.

The organic layer 112G is provided to cover the organic layer 115 on the light-emitting element 110G side with respect to the slit 120. A layer 135G is provided over the organic layer 112R on the light-emitting element 110R side with respect to the slit 120. The layer 135G can also be referred to as a cut piece formed when part of a film to be the organic layer 112G is divided by the slit 120 and remains on the light-emitting element 110R side. The layer 135G and the organic layer 112G are provided apart from each other with the slit 120 therebetween.

An end portion (a side surface) of the organic layer 112R and an end portion of the layer 135R face each other with the slit 120 therebetween. Similarly, an end portion of the organic layer 112G and an end portion of the layer 135G face each other with the slit 120 therebetween.

Note that one or both of the layer 135R and the layer 135G are not formed in some cases owing to the position and the width of the slit 120, the formation position of the organic layer 112R, the formation position of the organic layer 112G, and the like. Specifically, in the case where an end portion of the organic layer 112R before the formation of the slit 120 overlaps with the formation position of the slit 120, the layer 135R is not formed in some cases.

The organic layer 116 is provided to cover the organic layer 112R and the layer 135G. The organic layer 116 is provided to cover the organic layer 112G and the layer 135R. These organic layers 116 are formed by dividing a continuous film with the slit 120 like the organic layers 115.

The insulating layer 125 is provided inside the slit 120 and in contact with side surfaces of a pair of organic layers 115, a side surface of the organic layer 112R, a side surface of the organic layer 112G, a side surface of the layer 135R, a side surface of the layer 135G, and side surfaces of a pair of organic layers 116. The insulating layer 125 is provided to cover the top surface of a substrate 101.

The resin layer 126 is provided in contact with the top and side surfaces of the insulating layer 125. The resin layer 126 has a planarization function for a depressed portion of the formation surface of the organic layer 114.

The organic layer 114, the common electrode 113, and the protective layer 121 are formed in this order to cover the top surfaces of the organic layer 116, the insulating layer 125, and the resin layer 126. Note that the organic layer 114 is not necessarily provided when not needed.

Here, the layer 135R and the layer 135G are positioned at end portions of the film to be the organic layer 112R and the film to be the organic layer 112G. In a deposition method using an FMM, the thickness of the organic film tends to be gradually smaller in a portion closer to its end portion; thus, the layer 135R and the layer 135G have portions with smaller thicknesses than the organic layer 112R and the organic layer 112G. The layer 135R and the layer 135G may each have a thickness that is small enough not to be observed in a cross-sectional observation. Although the layer 135R or the layer 135G exists, the boundary between the layer 135R and the organic layer 112G or the boundary between the layer 135G and the organic layer 112R is difficult to observe in a cross-sectional observation in some cases.

In contrast, since a light-emitting compound (e.g., a fluorescent material, a phosphorescent material, or a quantum dot) is contained in each of the layer 135R and the layer 135G, light emission through photoluminescence can be obtained by irradiation with light such as ultraviolet light or visible light in a plan view. By observation of this light emission with an optical microscope or the like, it is possible to confirm the existence of the layer 135R and the layer 135G. Specifically, the layer 135R and the organic layer 112G overlap with each other in the portion where the layer 135R is positioned; therefore, when the portion is irradiated with ultraviolet light or the like, both light from the layer 135R and light from the organic layer 112G are observed. From the emission spectra, wavelengths, emission colors, and the like, it is possible to confirm that the layer 135R or the layer 135G includes a material that is the same as the organic layer 112R or the organic layer 112G. The compound contained in the layer 135R or the layer 135G can also be estimated in some cases.

An end portion of the layer 135R on the side opposite to the slit 120 extends to a region overlapping with the pixel electrode 111G. That is, the layer 135R includes a portion overlapping with both the pixel electrode 111G and the organic layer 112G. Similarly, the layer 135G includes a portion overlapping with both the pixel electrode 111R and the organic layer 112R.

Here, although an example is illustrated in which the organic layer 112R and the organic layer 112G are separately formed using an FMM and the other organic layers (the organic layer 115 and the organic layer 116) are formed as continuous films, one embodiment of the present invention is not limited thereto. For example, one or both of the organic layer 115 and the organic layer 116 may also be separately formed using the FMM. At this time, a cut piece of the organic layer 115 or the organic layer 116 remains in the vicinity of the slit 120 as in the layer 135R and the like in some cases.

Figure 2B:
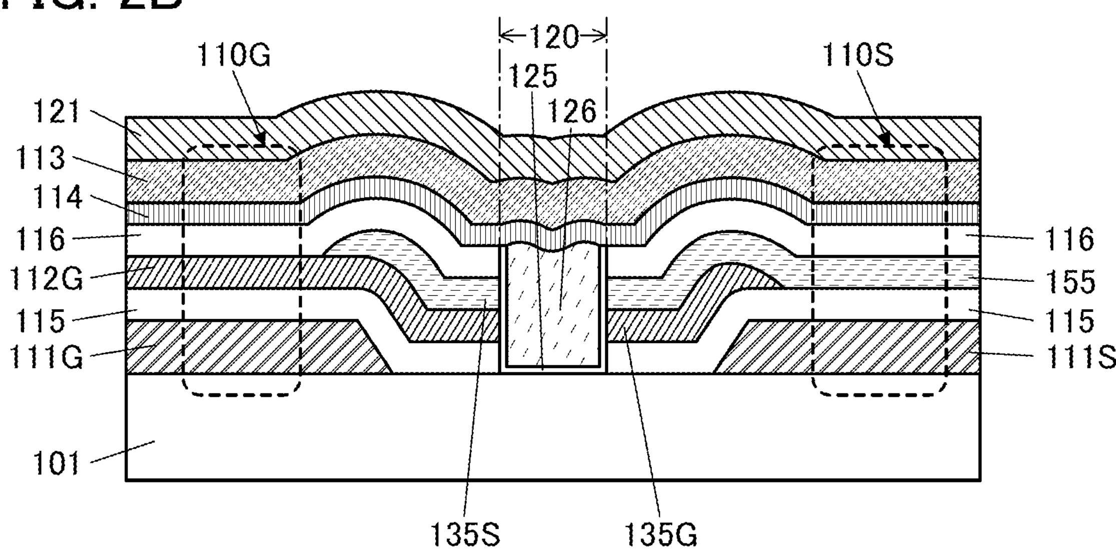

FIG. 2B is a schematic cross-sectional view of part of the light-emitting element 110G, part of the light-receiving element 110S, and the slit 120 positioned therebetween.

A layer 135S is provided over the organic layer 112G on the light-emitting element 110G side with respect to the slit 120. The layer 135S can also be referred to as a cut piece formed when part of a film to be the organic layer 155 is divided by the slit 120 and remains on the light-emitting element 110G side. An end portion of the layer 135S on the slit 120 side and an end portion of the organic layer 155 on the slit 120 side are provided to face each other with the slit 120 therebetween.

The layer 135G is provided to be sandwiched between the organic layer 115 and the organic layer 155 on the light-receiving element 110S side with respect to the slit 120. An end portion of the layer 135G on the slit 120 side and an end portion of the organic layer 112G on the slit 120 side are provided to face each other with the slit 120 therebetween.

An end portion of the layer 135S on the side opposite to the slit 120 extends to a region overlapping with the pixel electrode 111G. That is, the layer 135S includes a portion overlapping with both the pixel electrode 111G and the organic layer 112G. Similarly, the layer 135G includes a portion overlapping with both the pixel electrode 111S and the organic layer 155.

In the enlarged views illustrated in FIG. 2A and FIG. 2B, the region between the light-emitting element 110R and the light-emitting element 110G and the region between the light-emitting element 110G and the light-receiving element 110S are described; however, a region between the light-emitting element 110R and the light-emitting element 110B, a region between the light-emitting element 110G and the light-emitting element 110B, a region between the light-emitting element 110R and the light-receiving element 110S, and a region between the light-emitting element 110B and the light-receiving element 110S also have a similar structure.

Figures 3A, 3B:
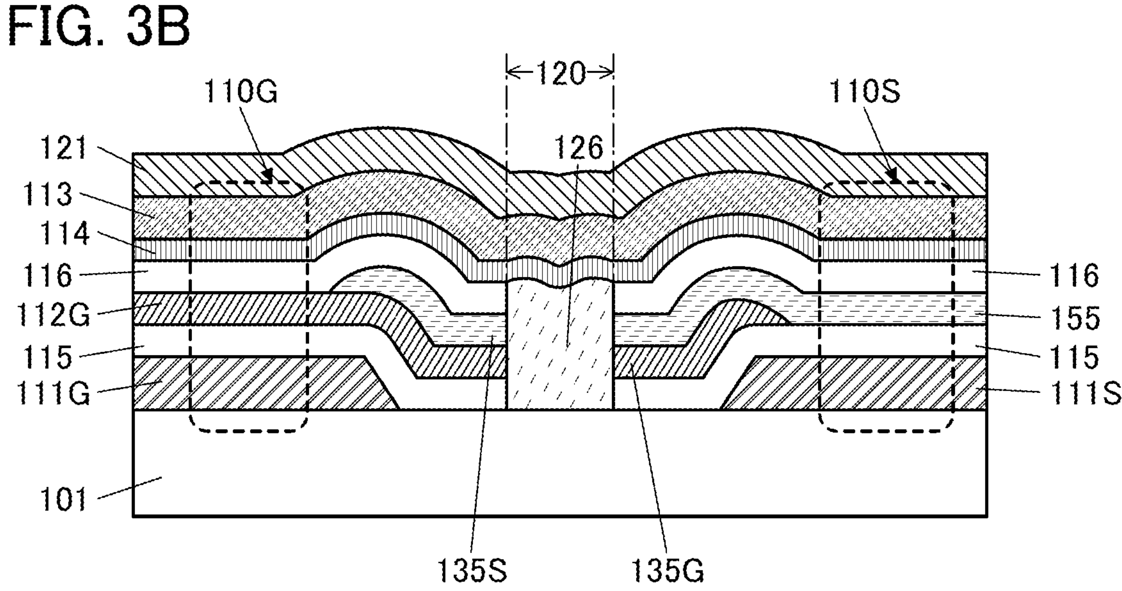
FIG. 3A and FIG. 3B are diagrams illustrating a structure example of a display apparatus.

FIG. 3A and FIG. 3B are schematic cross-sectional views not including the insulating layer 125. In FIG. 3A, the resin layer 126 is provided in contact with the side surfaces of the pair of organic layers 115, the side surface of the organic layer 112R, the side surface of the organic layer 112G, the side surface of the layer 135R, the side surface of the layer 135G, and the side surfaces of the pair of organic layers 116. In FIG. 3B, the resin layer 126 is provided in contact with a side surface of the organic layer 155 and a side surface of the layer 135S.

In this case, part of the EL layer or part of the PD layer is dissolved by a solvent used for forming a film to be the resin layer 126 in some cases. Therefore, water or alcohol such as ethyl alcohol, methyl alcohol, isopropyl alcohol (IPA), or glycerin is preferably used as the solvent for the resin layer 126 in the case where the insulating layer 125 is not provided. Note that without limitation to this, a solvent that does not dissolve or does not easily dissolve the EL layer and the PD layer is used.

In this manner, the display apparatus of one embodiment of the present invention can have a structure in which an insulator covering an end portion of the pixel electrode is not provided. In other words, a structure not provided with an insulator between the pixel electrode and the EL layer is employed. With such a structure, light emission can be efficiently extracted from the EL layer, leading to extremely low viewing angle dependence. For example, in the display apparatus of one embodiment of the present invention, the viewing angle (the maximum angle with a certain contrast ratio maintained when a screen is seen from an oblique direction) can be greater than or equal to 100° and less than 180°, preferably greater than or equal to 150° and less than or equal to 170°. Note that the viewing angle refers to that in both the vertical direction and the horizontal direction. The display apparatus of one embodiment of the present invention can have improved viewing angle characteristics and high image visibility.

Modification Example

Figure 4A:
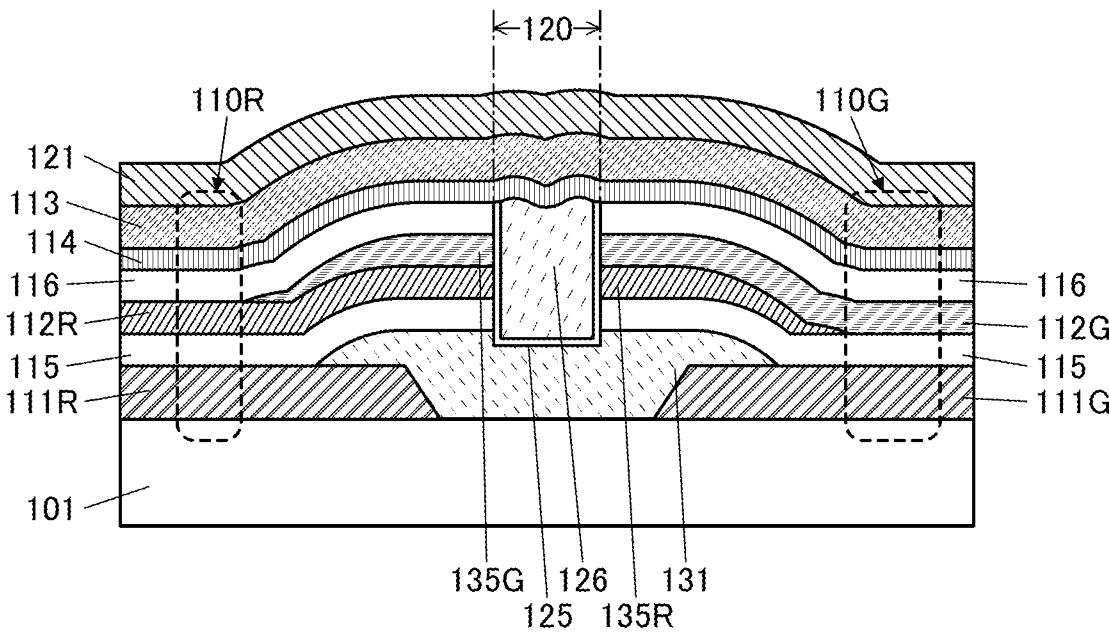
FIG. 4A and FIG. 4B are diagrams illustrating a structure example of a display apparatus.
Figure 4B:
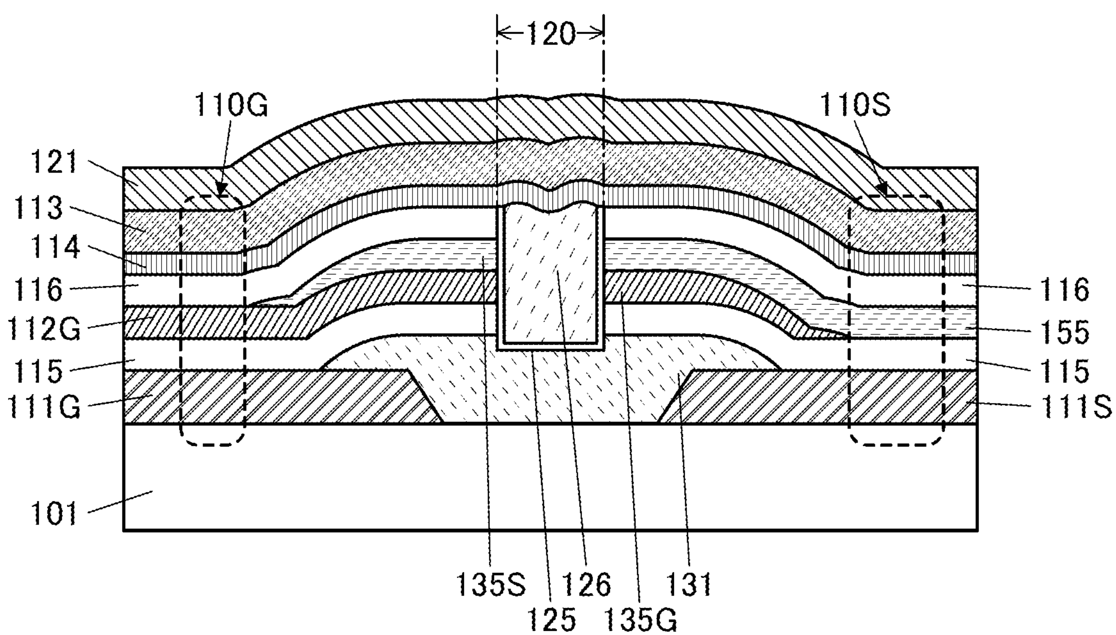

FIG. 4A and FIG. 4B are modification examples of FIG. 2A and FIG. 2B, respectively. FIG. 4A and FIG. 4B illustrate an example where an insulating layer 131 covering the end portions of the pixel electrodes is provided.

The insulating layer 131 has a function of planarizing a formation surface of the organic layer 115. End portions of the insulating layer 131 are preferably tapered. When an organic resin is used for the insulating layer 131, a surface of the insulating layer 131 can be moderately curved. Thus, coverage with a film formed over the insulating layer 131 can be improved. The insulating layer 131 has a function of preventing an unintentional electrical short circuit between two adjacent pixel electrodes 111. Furthermore, when a metal mask is used in the formation of the organic layer 112, the organic layer 155, or the like, the insulating layer 131 may have a function of a spacer that prevents the pixel electrode 111 from touching the metal mask.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

As illustrated in FIG. 4A and FIG. 4B, the insulating layer 131 may have a depressed portion in a region overlapping with the slit 120. This depressed portion can be formed by etching of part of an upper portion of the insulating layer 131 at the time of etching for forming the slit 120. Part of the insulating layer 125 is formed to fit in the depressed portion of the insulating layer 131, which can improve the adhesion between them.

The slit 120 is provided in a region overlapping with the insulating layer 131. The layer 135R, the layer 135G, and the layer 135S are also provided in a region overlapping with the insulating layer 131.

FIG. 4A and FIG. 4B illustrate an example where the end portions of the layer 135R, the layer 135G, and the layer 135S on the side opposite to the slit 120 extend beyond the end portion of the insulating layer 131.

Figure 5A:
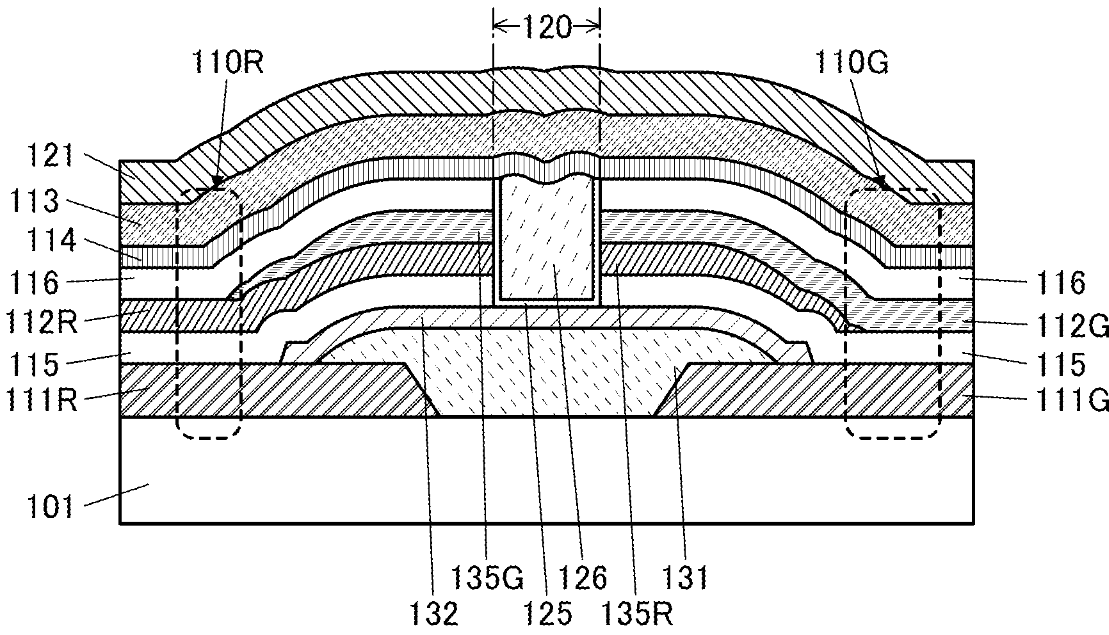
FIG. 5A and FIG. 5B are diagrams illustrating a structure example of a display apparatus.
Figure 5B:
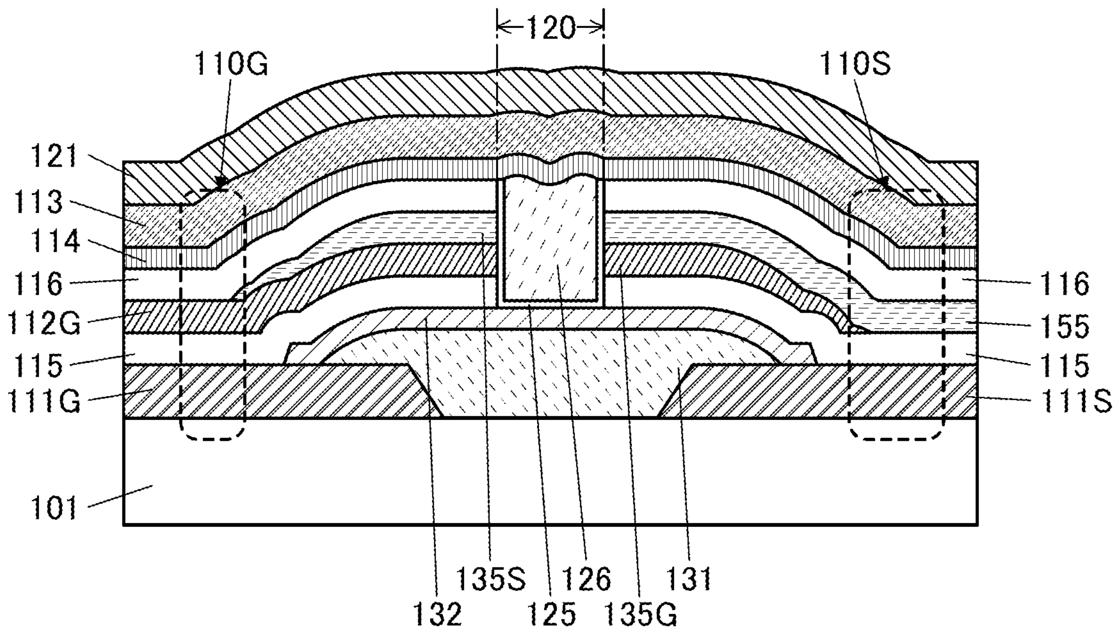

FIG. 5A and FIG. 5B are each an example in which an insulating layer 132 is provided over the insulating layer 131.

The insulating layer 132 overlaps with the end portions of the pixel electrodes 111 with the insulating layer 131 therebetween. The insulating layer 132 is provided to cover the end portion of the insulating layer 131. The insulating layer 132 includes a portion in contact with the top surface of the pixel electrode 111.

An end portion of the insulating layer 132 preferably has a tapered shape. Thus, the step coverage with a film formed over the insulating layer 132, such as the EL layer provided to cover the end portion of the insulating layer 132, can be improved.

It is preferable that the thickness of the insulating layer 132 be smaller than that of the insulating layer 131. When the insulating layer 132 is formed to be thin, the step coverage with a film formed over the insulating layer 132 can be improved.

Examples of inorganic insulating materials that can be used for the insulating layer 132 include oxides and nitrides such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

Films containing the above inorganic insulating materials may be stacked for the insulating layer 132. For example, a stacked-layer structure in which a silicon oxide film or a silicon oxynitride film is stacked over a silicon nitride film, or a stacked-layer structure in which a silicon oxide film or a silicon oxynitride film is stacked over an aluminum oxide film can be employed. The silicon oxide film and the silicon oxynitride film are films especially not easily etched; hence, it is preferable that the films be placed on the upper side. Furthermore, the silicon nitride film and the aluminum oxide film are films through which water, hydrogen, oxygen, and the like are not easily diffused; hence, the films function as barrier layers inhibiting the gas released from the insulating layer 131 from diffusing into the light-emitting elements when the films are placed on the insulating layer 131 side.

The slit 120 is provided in a region overlapping with the insulating layer 132. The layer 135R, the layer 135G, and the layer 135S are also provided in a region overlapping with the insulating layer 132.

Provision of the insulating layer 132 can prevent the top surface of the insulating layer 131 from being etched at the time of forming the slit 120.

FIG. 5A and FIG. 5B illustrate an example where the end portions of the layer 135R, the layer 135G, and the layer 135S on the side opposite to the slit 120 extend beyond the end portion of the insulating layer 131 and the end portion of the insulating layer 132.

Structure Example 2

More specific structure examples are described below.

Figures 6A, 6B:
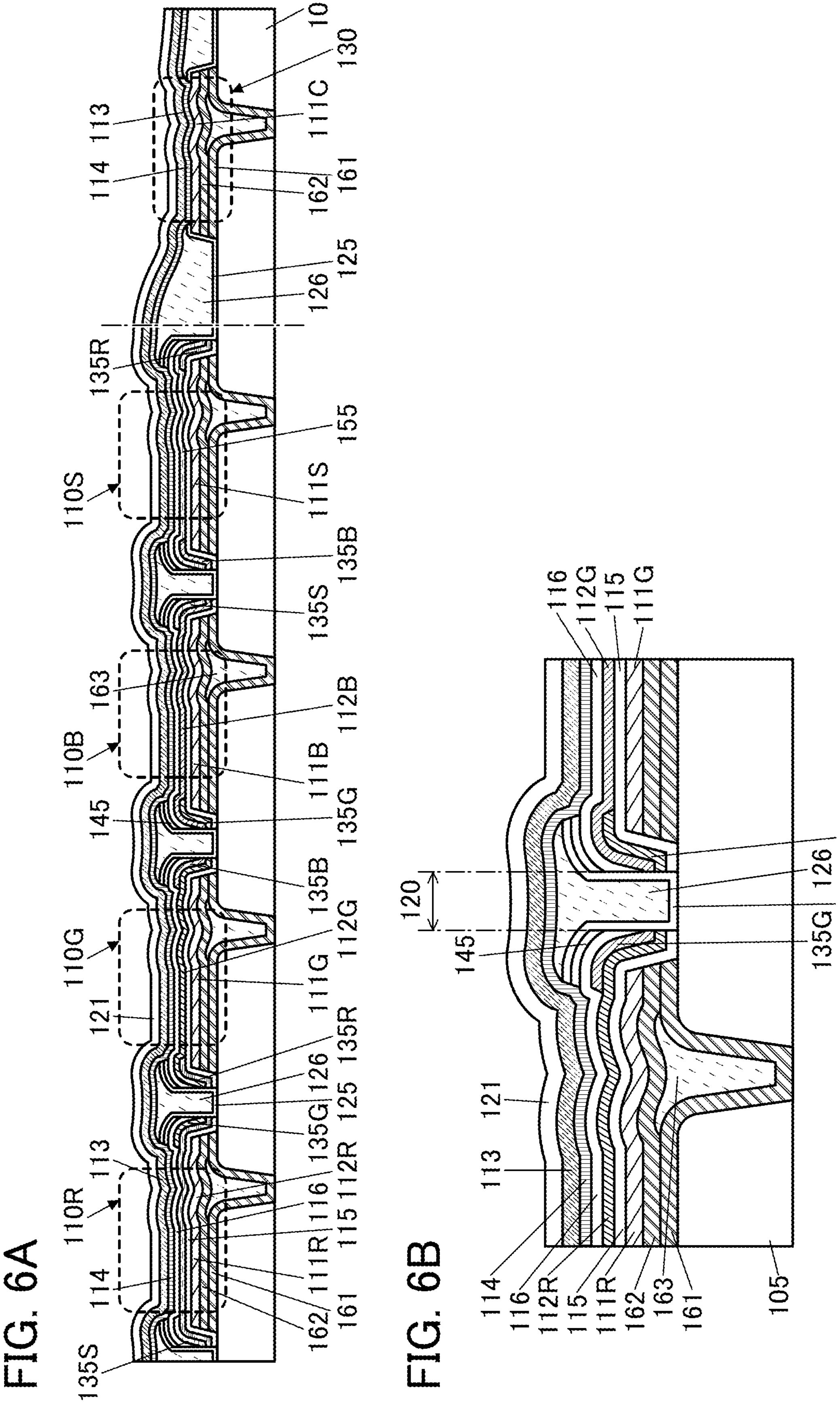
FIG. 6A and FIG. 6B are diagrams illustrating a structure example of a display apparatus.

FIG. 6A is a schematic cross-sectional view of a display apparatus described below. FIG. 6A illustrates a cross section of a region including the light-emitting element 110R, the light-emitting element 110G, the light-emitting element 110B, the light-receiving element 110S, and the connection portion 130. FIG. 6B is an enlarged schematic cross-sectional view of the slit 120 positioned between the light-emitting element 110R and the light-emitting element 110G and its vicinity.

The light-emitting element 110B includes the pixel electrode 111B, the organic layer 115, the organic layer 112B, the organic layer 116, the organic layer 114, and the common electrode 113. In FIG. 6A, a layer 135B that is part (a cut piece) of the organic layer 112B divided by the slit 120 is provided in the vicinity of the light-emitting element 110R and the vicinity of the light-receiving element 110S.

A conductive layer 161, a conductive layer 162, and a resin layer 163 are provided below the pixel electrode 111.

The conductive layer 161 is provided over an insulating layer 105. The conductive layer 161 includes a portion penetrating the insulating layer 105 in an opening provided in the insulating layer 105. The conductive layer 161 functions as a wiring or an electrode electrically connecting the wiring, the transistor, the electrode, or the like (not illustrated), which are positioned below the insulating layer 105, to the pixel electrode 111.

A depressed portion is formed in a portion of the conductive layer 161 that is positioned in the opening in the insulating layer 105. The resin layer 163 is provided to fill the depressed portion and functions as a planarization film. Although the top surface of the resin layer 163 is preferably as flat as possible, its surface has a gently curved surface shape in some cases. Although FIG. 6A and the like illustrate an example in which the top surface of the resin layer 163 has a wave shape with a depressed portion and a projected portion; however, one embodiment of the present invention is not limited thereto. For example, the top surface of the resin layer 163 may be a convex surface, a concave surface, or a flat surface.

The conductive layer 162 is provided over the conductive layer 161 and the resin layer 163. The conductive layer 162 has a function as an electrode electrically connecting the conductive layer 161 and the pixel electrode 111.

Here, in the case where the light-emitting element 110 is a top-emission light-emitting element, a film having a reflective property with respect to visible light is used as the conductive layer 162 and a film having a transmitting property with respect to visible light is used as the pixel electrode 111, whereby the conductive layer 162 can serve as a reflective electrode. Furthermore, the conductive layer 162 and the pixel electrode 111 can also be provided over the opening portion (also referred to as a contact portion) of the insulating layer 105 with the resin layer 163 therebetween; thus, a portion overlapping with the contact portion can also be a light-emitting region. Therefore, the aperture ratio can be increased.

Similarly, in the case where the light-receiving element 110S is a photoelectric conversion element that receives light from above, a film having a reflective property can be used as the conductive layer 162 and a film having a light-transmitting property can be used as the pixel electrode 111. Furthermore, since the contact portion can also function as a light-receiving region, the light-receiving area is increased and the light-receiving sensitivity can be increased.

In addition, the thicknesses of the pixel electrodes 111 may be different. At this time, the pixel electrode 111 can be used as an optical adjustment layer for microcavity. In the case of using microcavity, a film having a transmitting property and a reflective property is used as the common electrode.

FIG. 6A and FIG. 6B illustrate an example in which the shape of the resin layer 126 is different from the above.

As illustrated in FIG. 6B, an upper portion of the resin layer 126 has a shape having a larger width than the slit 120. As described later, the insulating layer 125 is processed using the resin layer 126 as an etching mask; thus, a portion covered with the upper portion of the resin layer 126 remains. Moreover, part of a sacrificial layer 145 used in the manufacturing step of the display apparatus remains for the same reason. Specifically, the sacrificial layer 145 is provided over the organic layer 116 in the vicinity of the slit 120. Part of the insulating layer 125 is provided to cover the top surface of the sacrificial layer 145. In addition, the resin layer 126 is provided to cover the sacrificial layer 145 and the insulating layer 125.

At that time, an end portion of the insulating layer 125 and an end portion of the sacrificial layer 145 each preferably have a tapered shape. This can improve the step coverage with the organic layer 114 and the like.

As illustrated in FIG. 6A and FIG. 6B, the layer 135R, the layer 135G, the layer 135B, and the layer 135S are in contact with the insulating layer 125 and each have a region overlapping with the insulating layer 125, the sacrificial layer 145, and the resin layer 126. Furthermore, the layer 135R, the layer 135G, the layer 135B, and the layer 135S each include a portion overlapping with the pixel electrode of the adjacent light-emitting element or light-receiving element.

Figure 7:
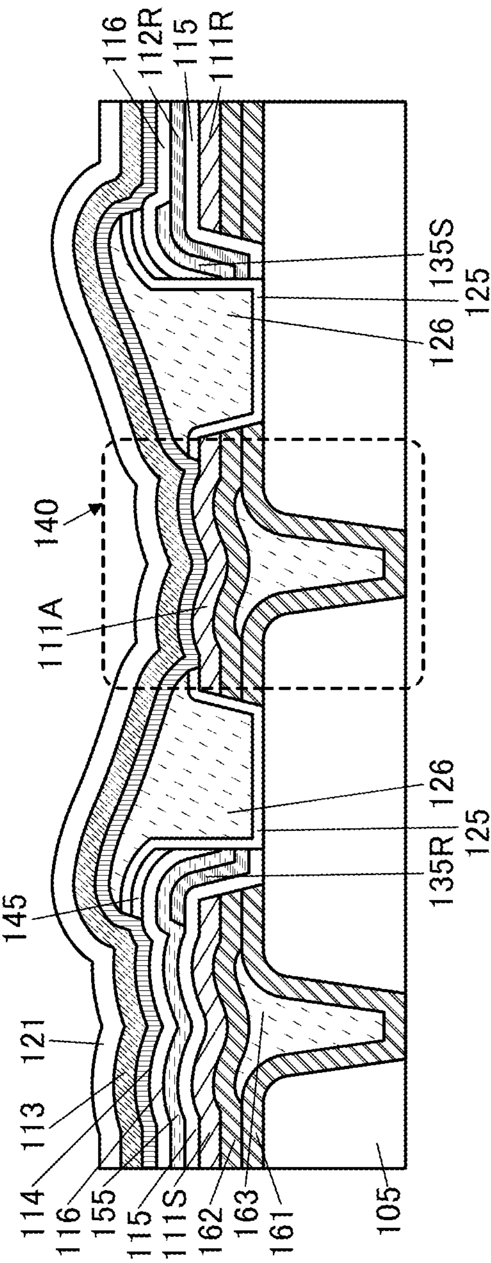
FIG. 7 is a diagram illustrating a structure example of a display apparatus.

FIG. 7 illustrates a schematic cross-sectional view of the connection portion 140 and the vicinity thereof. In FIG. 7, an example is illustrated in which the connection portion 140 is provided between the light-emitting element 110R and the light-receiving element 110S. Although the case where the connection portion 140 is provided between the light-emitting element 110R and the light-receiving element 110S is illustrated here, the structure is not limited thereto: the connection portion 140 may be provided between the light-emitting element 110G and the light-receiving element 110S or between the light-emitting element 110B and the light-receiving element 110S.

In the connection portion 140, the conductive layer 161, the resin layer 163, and the conductive layer 162 are stacked, and the electrode 111A is provided over the conductive layer 162. The electrode 111A is surrounded by the insulating layer 125 and the resin layer 126. The resin layer 126 and the insulating layer 125 include an opening portion overlapping with the electrode 111A, and the electrode 111A and the organic layer 114 are provided to be in contact with each other in the opening portion. The electrode 111A is electrically connected to the common electrode 113 with the organic layer 114 therebetween.

It is preferable that the organic layer 115, the organic layer 112R, the organic layer 112G, the organic layer 112B, the organic layer 155, the organic layer 116, and the like be not provided over the electrode 111A. Furthermore, it is preferable that the layer 135R, the layer 135G, the layer 135B, and the layer 135S be not provided over the electrode 111A.

Note that the connection portion 140 can be formed in a manner similar to that of the connection portion 130. Since the surrounding step shapes of the connection portion 140 and the connection portion 130 are different from each other, the cross-sectional shapes (e.g., the thickness or the width of a component) might be different even when the connection portion 140 and the connection portion 130 are formed in a similar manner.

[Stray Light]

In one embodiment of the present invention, a light-emitting element and a light-receiving element are arranged side by side on the same formation surface. Therefore, when light emitted from the light-emitting element is reflected or scattered in the display apparatus and enters the light-receiving element, the light becomes a factor of noise in image capturing by the light-receiving element. Unlike current leakage, such noise becomes large depending on luminance of light emitted from the light-emitting element. That is, noise due to stray light becomes large depending on the amount of current flowing through the light-emitting element and the amount of voltage applied to the light-emitting element.

Figures 8A, 8B:
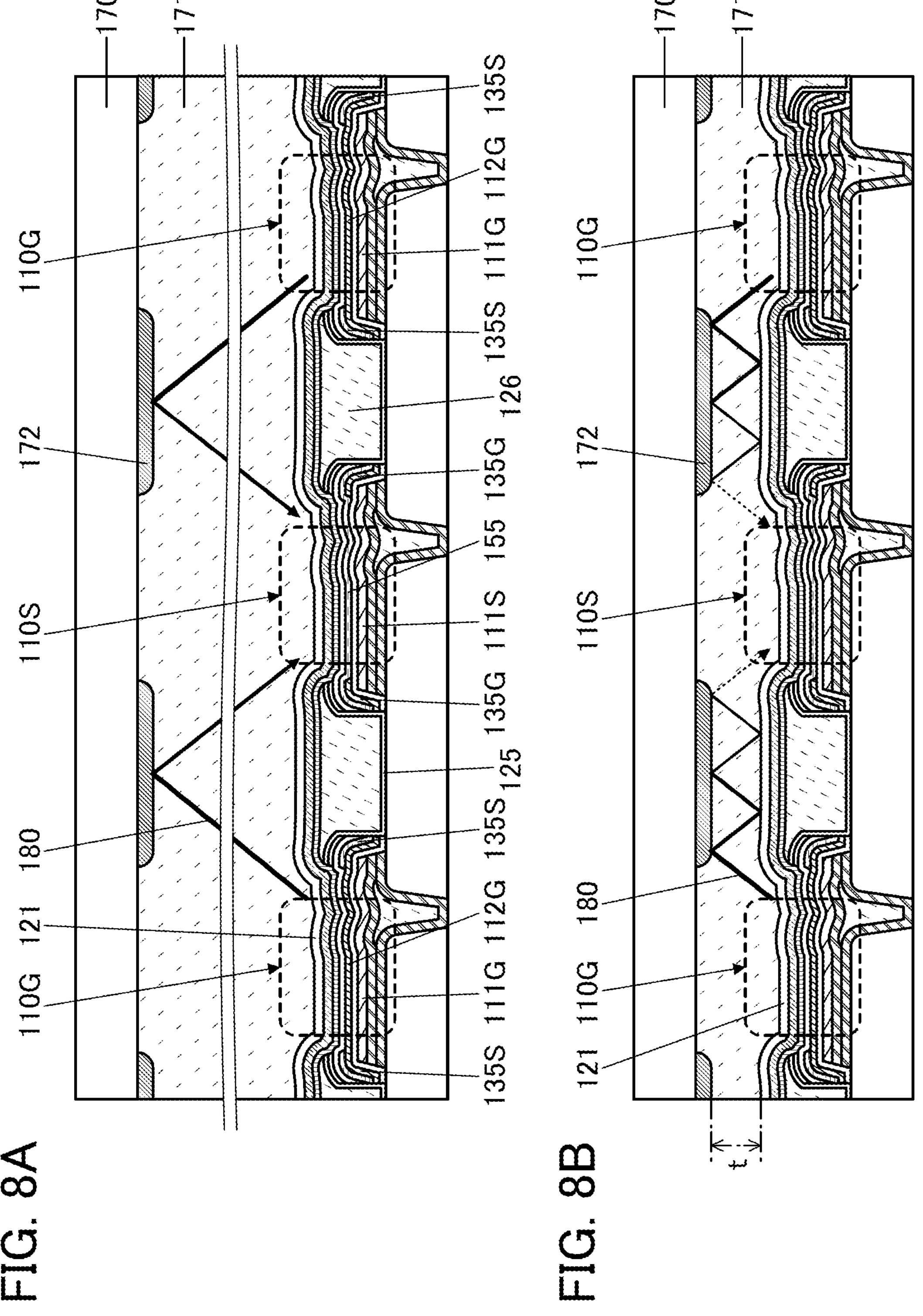
FIG. 8A and FIG. 8B are diagrams each illustrating a structure example of a display apparatus.

FIG. 8A illustrates a schematic cross-sectional view including the light-receiving element 110S and a pair of light-emitting elements 110G provided to be adjacent to the both sides of the light-receiving element 110S.

In FIG. 8A, a resin layer 171 and a substrate 170 are provided over the protective layer 121. A light-blocking layer 172 is provided on a surface of the substrate 170 on the resin layer 171 side. The light-blocking layer 172 has a function of blocking visible light. The light-blocking layer 172 includes openings overlapping with a light-emitting region of the light-emitting element and a light-receiving region of the light-receiving element in a plan view. The light-blocking layer 172 includes a region overlapping with the resin layer 126.

FIG. 8A illustrates an example where the thickness of the resin layer 171 in a region overlapping with the light-blocking layer 172 is larger than the arrangement interval (arrangement pitch) between the light-emitting element 110G and the light-receiving element 110S. Part of light 180 emitted from the light-emitting element 110G is reflected or scattered at an interface between the resin layer 171 and the light-blocking layer 172, and part of the reflected light or part of the scattered light enters the light-receiving element 110S. The thicker the resin layer 171 is, the larger the difference (also referred to as a gap) between the height of the light-receiving element 110S, the light-emitting element 110G, and the like and the height of the light-blocking layer 172 is; thus, part of the light 180 easily enters the light-receiving element 110S. For example, the light 180 emitted from the light-emitting element 110 might enter the light-receiving element 110S by one-time reflection at the interface between the resin layer 171 and the light-blocking layer 172. Therefore, attenuation of light intensity due to reflectance is small, and the intensity of the light entering the light-receiving element 110S is high.

In view of the above, when the resin layer 171 is thinned to make the gap small, the influence of stray light can be reduced. As illustrated in FIG. 8B, thickness t of the resin layer 171 in a portion sandwiched between the bottom surface of the light-blocking layer 172 and the top surface of the protective layer 121 is made small, whereby the light 180 repeats reflection a plurality of times in an optical path between the light-emitting element 110G and the light-receiving element 110S. The intensity of the light 180 is attenuated every reflection; thus, a narrow gap and a large number of times of reflection can reduce intensity of light reaching the light-receiving element 110S. Accordingly, the influence of stray light can be reduced, and a signal-noise ratio in image capturing can be increased.

Note that the stray light between the light-receiving element 110S and the light-emitting element 110G next thereto is described here for simple description, but one embodiment of the present invention is not limited thereto: the effect is exhibited in stray light from the light-emitting element 110R and the light-emitting element 110B that are adjacent to the light-receiving element 110S. Furthermore, the effect is exhibited in stray light from the light-emitting element 110R, the light-emitting element 110G, and the light-emitting element 110B that are apart from the light-receiving element 110S.

The thickness t of the resin layer 171 is preferably as small as possible in the portion sandwiched between the bottom surface of the light-blocking layer 172 and the top surface of the protective layer 121. The thickness t is at least smaller than the arrangement interval (arrangement pitch) between the light-receiving element 110S and the light-emitting element 110R, the light-emitting element 110G, or the light-emitting element 110B. Accordingly, the amount of light entering the light-receiving element 110S by one-time reflection can be effectively reduced, and intensity of stray light entering the light-receiving element 110S can be effectively reduced.

For example, the thickness t can be less than or equal to 30 μm, preferably less than or equal to 25 μm, further preferably less than or equal to 20 μm, still further preferably less than or equal to 15 μm, yet still further preferably less than or equal to 10 μm, yet still further preferably less than or equal to 8 μm. The lower limit of the thickness t is not particularly limited and is greater than or equal to 0 μm, e.g., greater than or equal to 0.5 μm, greater than or equal to 1 μm, greater than or equal to 2 μm, or greater than or equal to 3 μm. Note that part of the bottom surface of the light-blocking layer 172 and part of the top surface of the protective layer 121 may be in contact with each other, and in that case, the thickness t is 0 μm.

Figure 9:
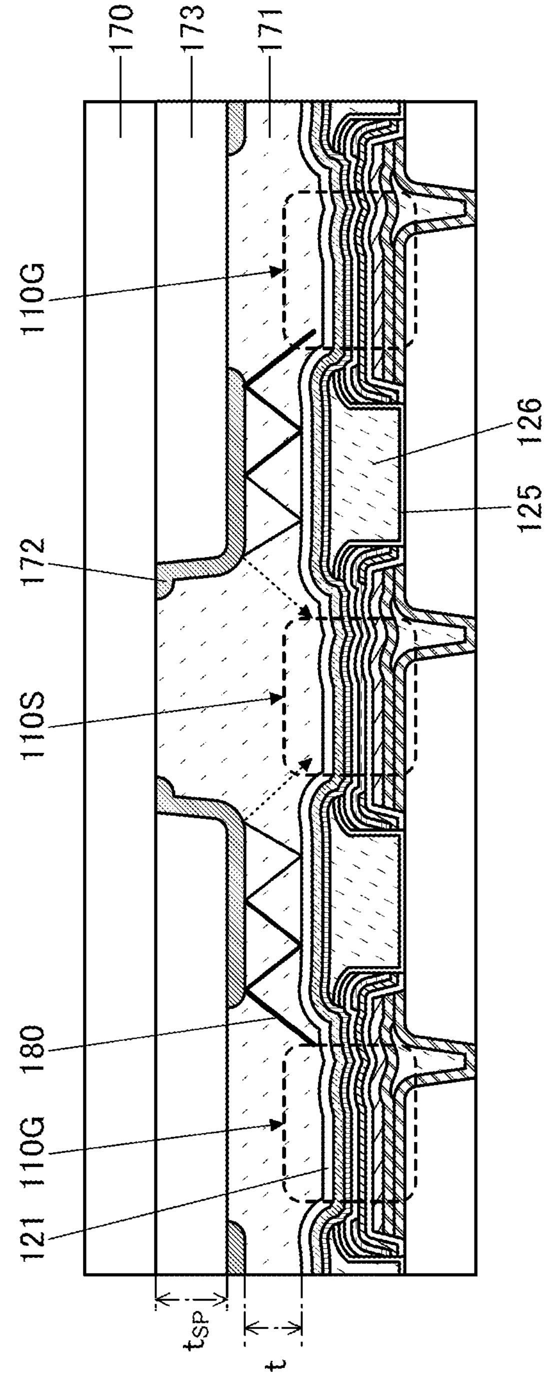
FIG. 9 is a diagram illustrating a structure example of a display apparatus.

FIG. 9 is an example where the gap is made small by a method different from that in FIG. 8B described above. A display apparatus illustrated in FIG. 9 includes a layer 173 functioning as a spacer. The layer 173 has a light-transmitting property.

The layer 173 is provided on the surface of the substrate 170 on the resin layer 171 side and includes an opening portion overlapping with the light-receiving element 110S. The layer 173 further includes a region overlapping with the light-emitting element 110G and a region overlapping with the resin layer 126. Although not illustrated, the layer 173 includes regions overlapping with the light-emitting element 110R and the light-emitting element 110B.

The light-blocking layer 172 is provided along a surface of the layer 173 on the resin layer 171 side. The light-blocking layer 172 is provided to cover the inner wall of the opening portion of the layer 173. The light-blocking layer 172 is provided along a surface of the substrate 170 inside the opening portion of the layer 173.

With such a structure, the thickness t of the resin layer 171 is small in a region between the light-emitting element 110G and the light-receiving element 110S, and thus influence of stray light can be reduced. Furthermore, the distance between the light-receiving element 110S and the light-blocking layer 172 can be large, and thus light entering from the outside to the light-receiving element 110S can be narrowed; therefore, a clearer image can be captured.

Here, the thickness of the layer 173 is regarded as thickness $t_{SP}$. The thickness $t_{SP}$ is preferably as large as possible, in which case the distance between the light-receiving element 110S and the light-blocking layer 172 can be large. The thickness $t_{SP}$ can be greater than or equal to 0.5 μm, preferably greater than or equal to 1 μm, further preferably greater than or equal to 2 μm. However, when the thickness $t_{SP}$ is too large, the display apparatus itself becomes thick; thus, the thickness $t_{SP}$ can be less than or equal to 30 μm, less than or equal to 20 μm, less than or equal to 10 μm, or less than or equal to 5 μm, for example.

Figures 10A, 10B:
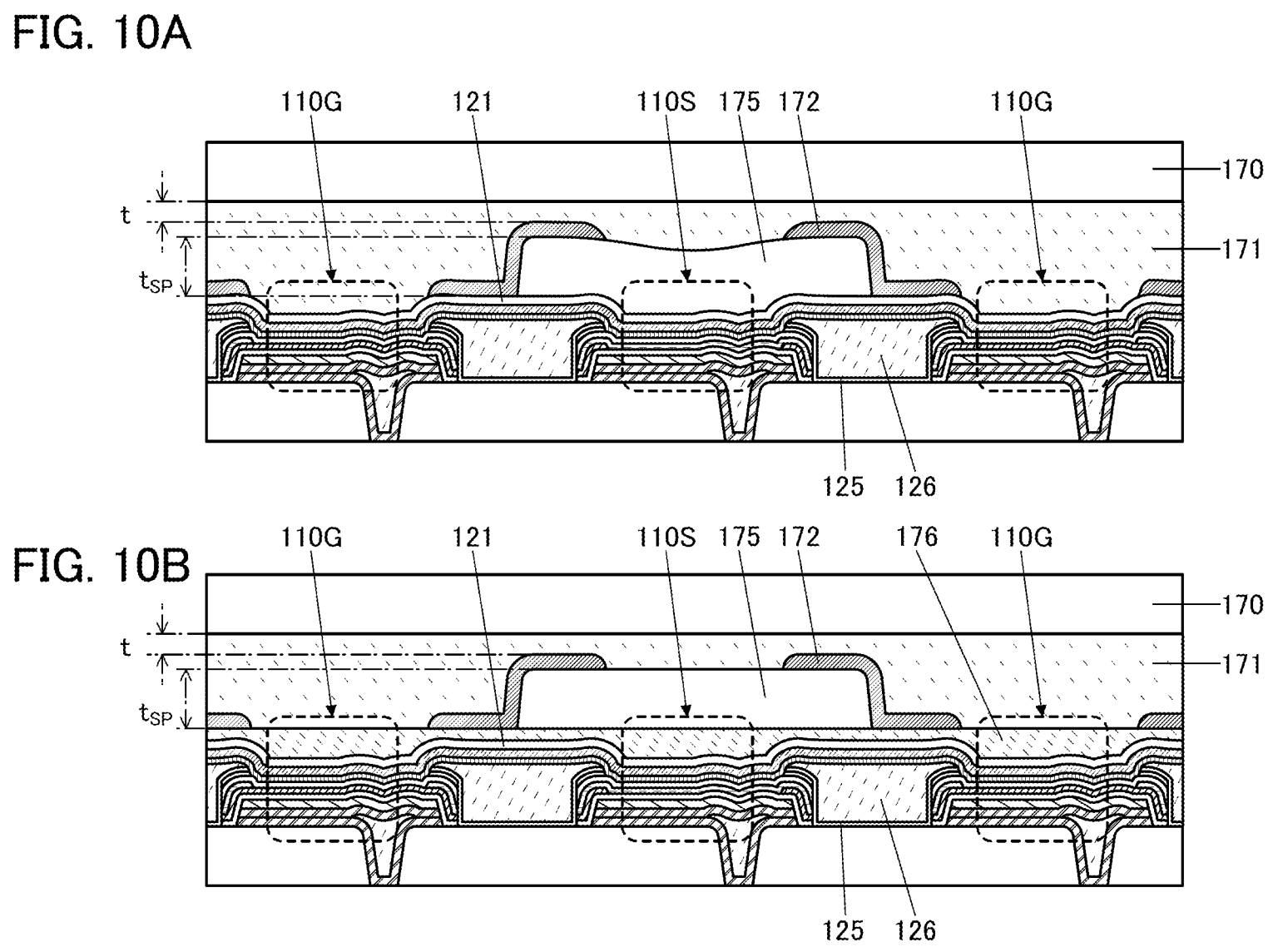

FIG. 10A and FIG. 10B are each an example where the gap is made small by a method different from the above. In FIG. 10A and FIG. 10B, a layer 175 functioning as a spacer is included over the light-receiving element 110S. The layer 175 has a light-transmitting property.

In FIG. 10A, the layer 175 is provided on and in contact with the protective layer 121. Meanwhile, in FIG. 10B, a resin layer 176 functioning as a planarization film is provided over the protective layer 121, and the layer 175 is formed over the resin layer 176. The resin layer 176 is preferably provided, in which case variations in the shape and thickness of the layer 175 can be reduced. Similar to the layer 175, the resin layer 176 has a light-transmitting property.

The light-blocking layer 172 is provided to cover the top surface and the side surface of a side end portion of the layer 175. The light-blocking layer 172 includes a region overlapping with the resin layer 126 with the layer 175 therebetween, a region covering the end portion of the layer 175, and a region overlapping with the resin layer 126 without the layer 175 therebetween.

Figures 11A, 11B:
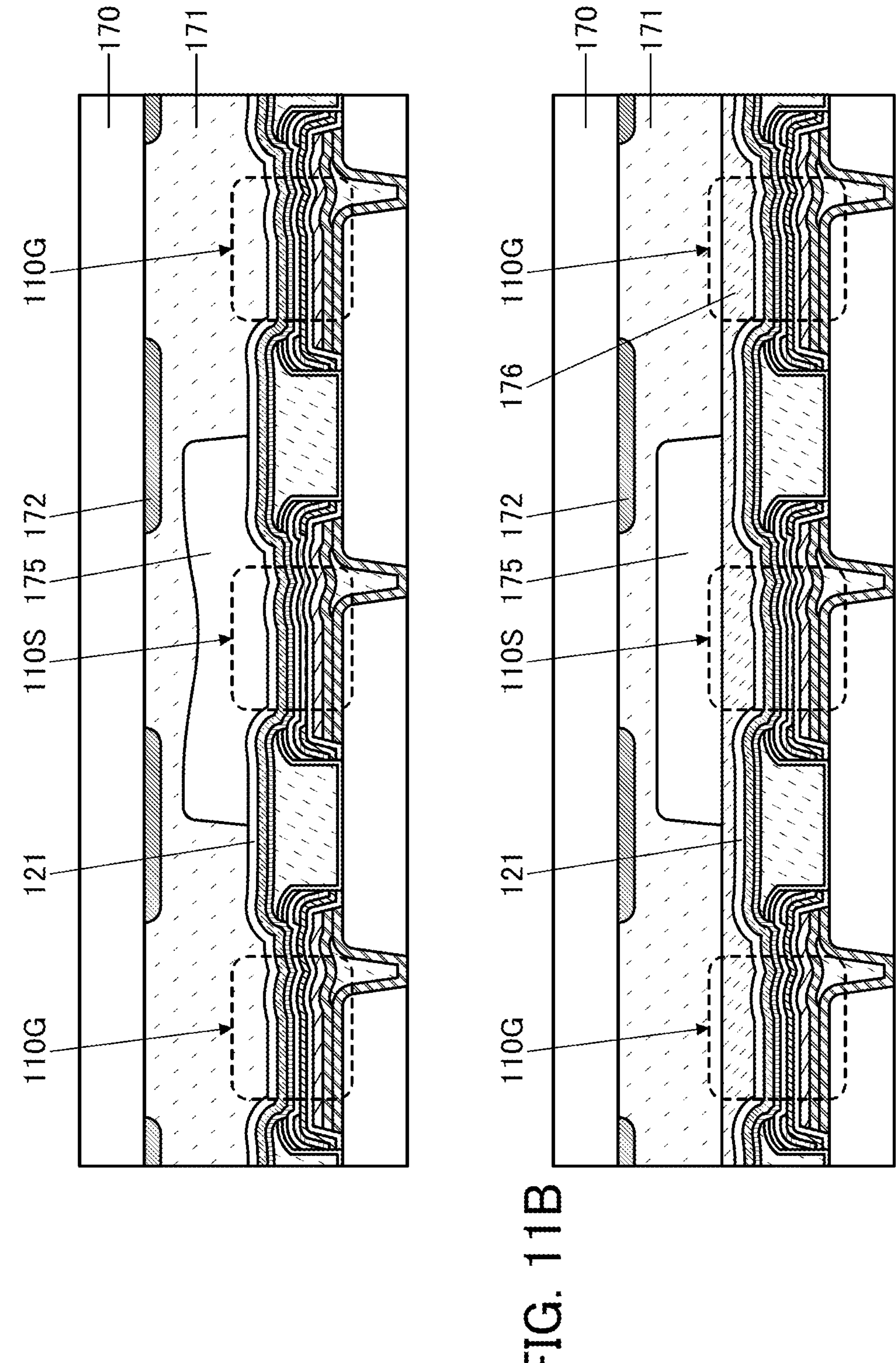
FIG. 11A and FIG. 11B are diagrams each illustrating a structure example of a display apparatus.

FIG. 11A and FIG. 11B are examples where the light-blocking layer 172 in FIG. 10A and FIG. 10B is formed on the surface of the substrate 170 on the resin layer 171 side. In this case, a material having a higher refractive index than the resin layer 171 is preferably used for the layer 175. Accordingly, stray light passing through the resin layer 171 is easily reflected at an interface between the resin layer 171 and the layer 175, and thus does not easily reach the light-receiving element 110S.

Figures 12A, 12B:
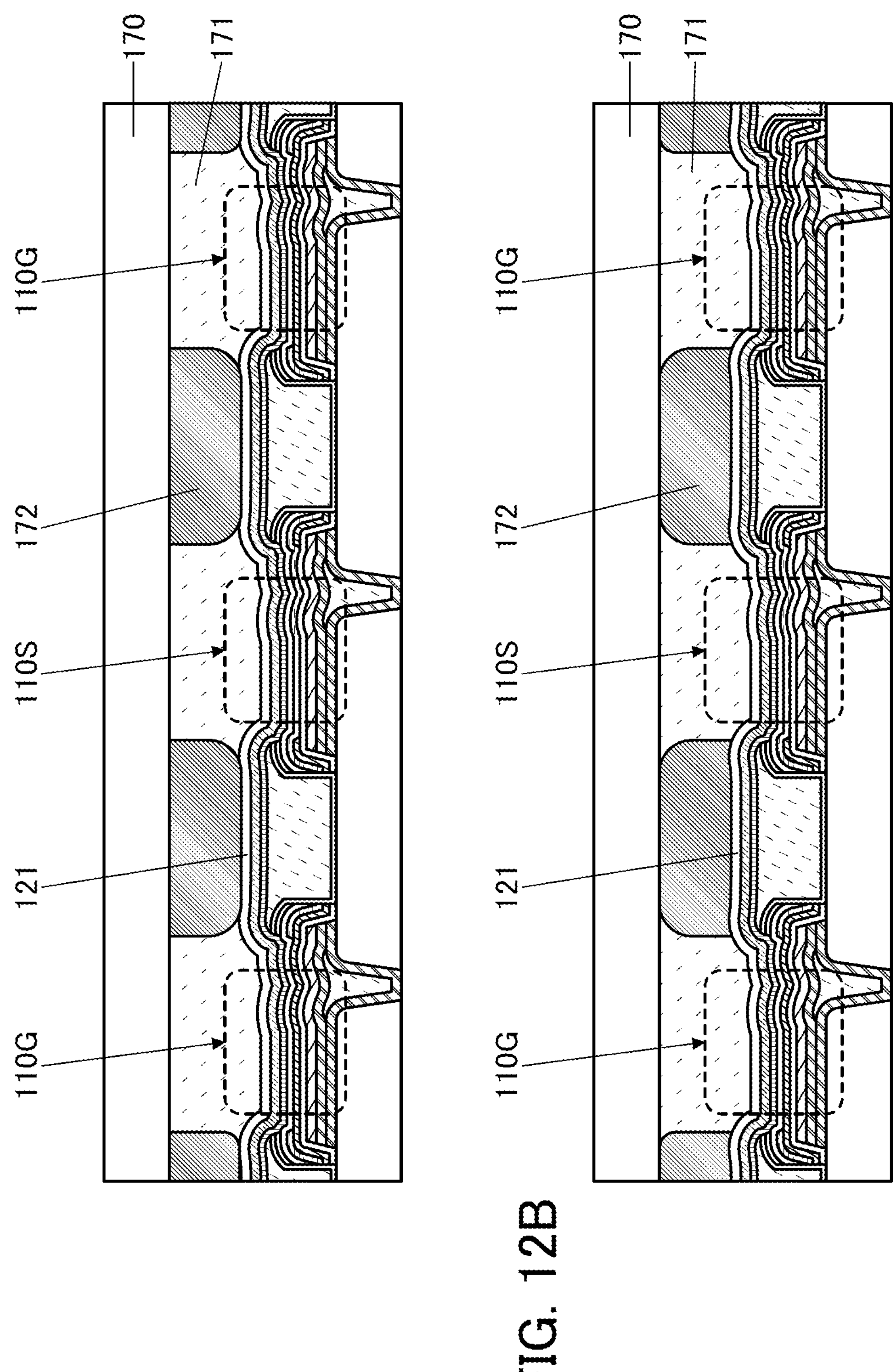
FIG. 12A and FIG. 12B are diagrams each illustrating a structure example of a display apparatus.

FIG. 12A and FIG. 12B each illustrate a structure where the light-blocking layer 172 also serves as a spacer. In FIG. 12A, the light-blocking layer 172 is provided on the substrate 170 side. In FIG. 12B, the light-blocking layer 172 is provided over the protective layer 121.

In FIG. 12A, the bottom surface of the light-blocking layer 172 and the upper surface of the protective layer 121 are in contact with each other, and the resin layer 171 is divided with the light-blocking layer 172 as a boundary. In FIG. 12B, the top surface of the light-blocking layer 172 and the bottom surface of the substrate 170 are in contact with each other, and the resin layer 171 is divided with the light-blocking layer 172 as a boundary. In such a manner, the resin layer 171 positioned between the light-emitting element 110G and the light-receiving element 110S is divided with the light-blocking layer 172, whereby stray light passing through the resin layer 171 can be effectively blocked.

Here, light emitted from the light-emitting element 110G and the like is emitted to the outside through the resin layer 171 and the substrate 170. Furthermore, light passing through the substrate 170 and the resin layer 171 enters the light-receiving element 110S. Therefore, it is preferable that refractive indexes of the substrate 170 and the resin layer 171 be controlled, and interface reflection be made as small as possible. For example, the difference between the refractive indexes of the substrate 170 and the resin layer 171 is preferably less than or equal to 0.15, in which case the interface reflection can be inhibited. In particular, the difference between the refractive indexes is preferably less than or equal to 0.1.

Note that an example is described here in which the light-blocking layer 172 is in contact with both the protective layer 121 and the substrate 170 to divide the resin layer 171; however, the light-blocking layer 172 and the protective layer 121 or the light-blocking layer 172 and the substrate 170 are not necessarily in contact with each other and may have a gap therebetween. In this case, the gap is preferably filled with the resin layer 171. Furthermore, the thickness of the resin layer 171 in the gap is preferably smaller than the thickness of the light-blocking layer 172.

Here, as stray light that enters the light-receiving element 110S, stray light that enters the light-receiving element 110S in a lateral direction from the light-emitting element 110G through the insulating layer 125 and the resin layer 126 is also given. In order to inhibit such stray light, a resin material absorbing visible light is preferably used for the resin layer 126. Furthermore, a resin material containing a pigment or dye can be used for the resin layer 126, for example.

A structure that allows more effective inhibition of stray light passing through the resin layer 126 is described below.

Figures 13A, 13B:
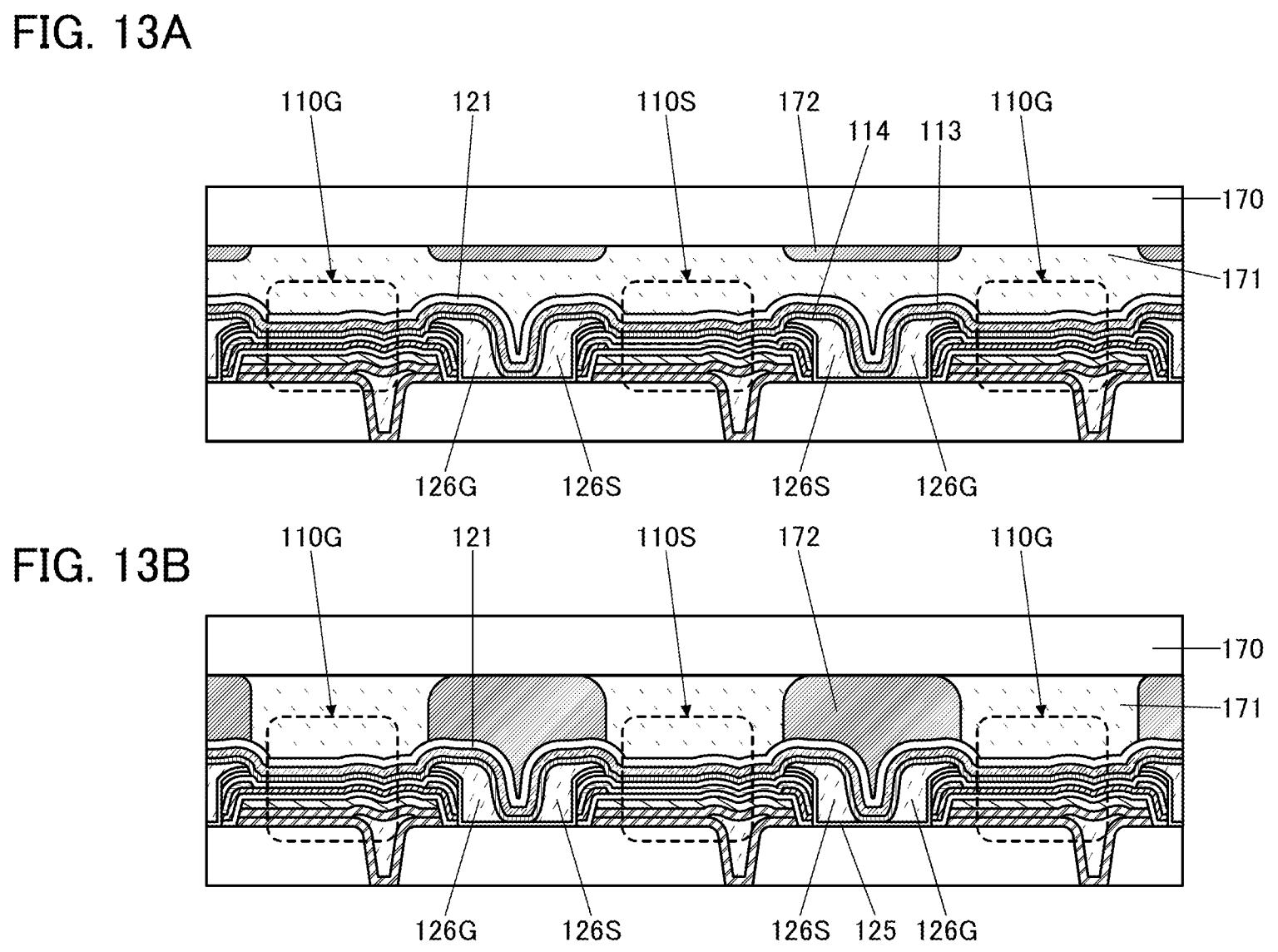

In FIG. 13A, an example of a display apparatus is illustrated in which the resin layer 126 is provided with a slit and divided into a resin layer 126G on the light-emitting element 110G side and a resin layer 126S on the light-receiving element 110S side. The organic layer 114, the common electrode 113, the protective layer 121, and the like are provided to cover the resin layer 126G and the resin layer 126S. The organic layer 114, the common electrode 113, and the protective layer 121 are provided to fill the gap between the resin layer 126G and the resin layer 126S and include a portion having a concave top surface.

FIG. 13B is an example where, in addition to the structure of FIG. 13A, the light-blocking layer 172 illustrated in FIG. 12B is applied. Part of the light-blocking layer 172 is provided to fill a depressed portion between the resin layer 126G and the resin layer 126S.

With such a structure, both stray light propagated through the resin layer 171 and stray light propagated through the resin layer 126 can be blocked, and thus a display apparatus with a high S/N ratio in image capturing can be achieved.

Figures 14A, 14B:
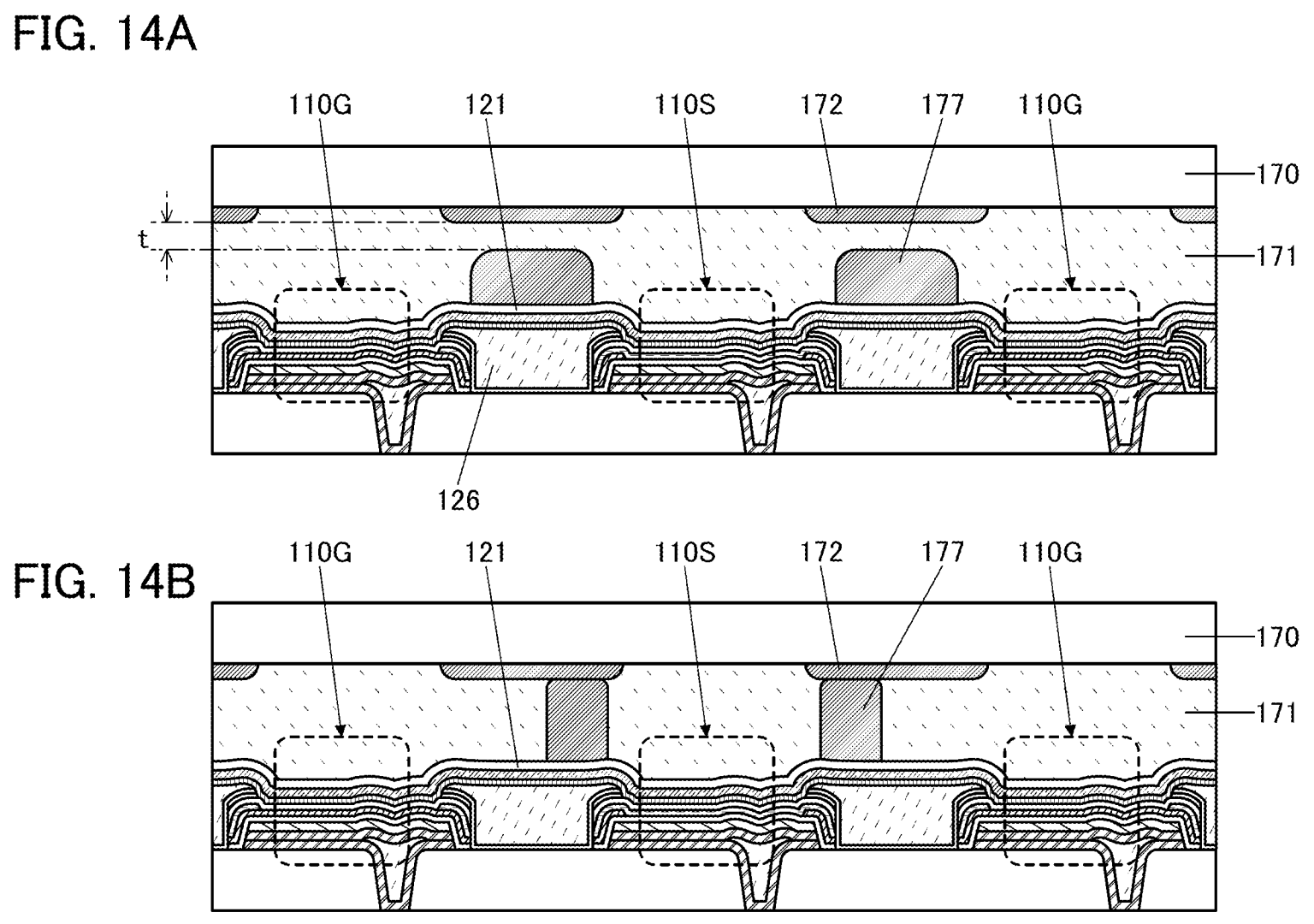

In FIG. 14A, an example of a display apparatus in which a light-blocking layer 177 is included in addition to the light-blocking layer 172 is illustrated.

The light-blocking layer 177 is provided over the protective layer 121 and in a region overlapping with the light-blocking layer 172 and the resin layer 126.

Similar to the light-blocking layer 172, a material absorbing visible light is preferably used for the light-blocking layer 177. For example, a material containing a black pigment may be used, or a resin material having a light-absorbing property (e.g., polyimide) may be used.

FIG. 14A illustrates an example where the light-blocking layer 172 and the light-blocking layer 177 are not in contact with each other. In this case, the thickness of the resin layer 171 in a portion sandwiched between the light-blocking layer 172 and the light-blocking layer 177 corresponds to the thickness t.

FIG. 14B illustrates an example where the light-blocking layer 172 and the light-blocking layer 177 are in contact with each other. This structure is preferable because stray light that might enter from the light-emitting element 110G to the light-receiving element 110*s* can be blocked.

Manufacturing Method Example

Figures 15A, 15B, 15C:
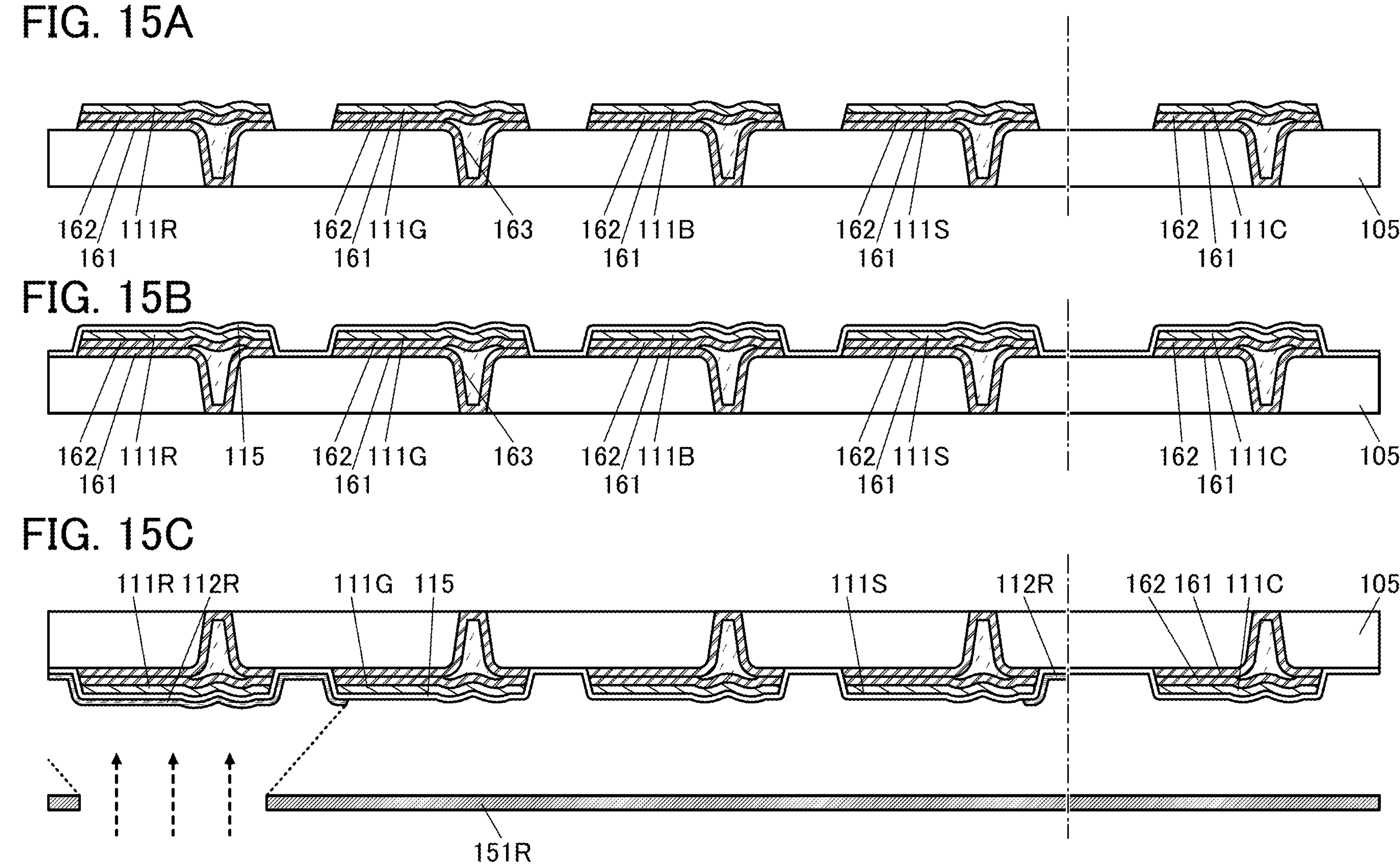
FIG. 15A to FIG. 15C are diagrams illustrating an example of a manufacturing method of a display apparatus.

An example of a method for manufacturing the display apparatus of one embodiment of the present invention will be described below with reference to drawings. Here, description is made using the display apparatus described in FIG. 6A as an example. FIG. 15A to FIG. 18C are schematic cross-sectional views in steps of the manufacturing method example of the display apparatus described below as an example. In FIG. 15A and the like, schematic cross-sectional views of the connection portion 130 and the vicinity thereof are also illustrated on the right side.

Note that thin films included in the display apparatus (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of the thermal CVD method is a metal organic chemical vapor deposition (MOCVD: Metal Organic CVD) method.

Alternatively, thin films included in the display apparatus (e.g., insulating films, semiconductor films, and conductive films) can be formed by a method such as spin coating, dipping, spray coating, ink-jetting, dispensing, screen printing, offset printing, a doctor knife method, a slit coater, a roll coater, a curtain coater, or a knife coater.

Thin films included in the display apparatus can be processed by a photolithography method or the like. Besides, a nanoimprinting method, a sandblasting method, a lift-off method, or the like may be used to process thin films. Island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and the resist mask is removed. In the other method, a photosensitive thin film is deposited and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion light exposure technique. As the light for exposure, extreme ultraviolet (EUV) light or X-rays may also be used. Furthermore, instead of the light used for the light exposure, an electron beam can also be used. It is preferable to use extreme ultraviolet light, X-rays, or an electron beam because extremely minute processing can be performed. Note that when light exposure is performed by scanning of a beam such as an electron beam, a photomask is not needed.

For etching of the thin films, a dry etching method, a wet etching method, a sandblast method, or the like can be used.

[Preparation for Substrate 101]

As the substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate or a polycrystalline semiconductor substrate using silicon, silicon carbide, or the like, a compound semiconductor substrate of silicon germanium or the like, a semiconductor substrate such as an SOI substrate, or the like can be used.

As the substrate 101, it is particularly preferable to use the semiconductor substrate or the insulating substrate where a semiconductor circuit including a semiconductor element such as a transistor is formed. The semiconductor circuit preferably forms a pixel circuit, a gate line driver circuit (gate driver), a source line driver circuit (source driver), or the like. In addition to the above, an arithmetic circuit, a memory circuit, or the like may be formed.

The insulating layer 105 is provided in the uppermost portion of the substrate 101. The insulating layer 105 includes a plurality of openings reaching a transistor, a wiring, an electrode, and the like provided over the substrate 101. The openings can be formed by a photolithography method.

For the insulating layer 105, an inorganic insulating material or an organic insulating material can be used.

[Formation of Conductive Layer 161, Resin Layer 163, Conductive Layer 162, and Pixel Electrode 111]

A conductive film to be the conductive layer 161 is deposited over the insulating layer 105. At this time, a depressed portion due to the opening of the insulating layer 105 is formed in the conductive film.

Then, the resin layer 163 is formed in the depressed portion of the conductive film.

It is preferable to use a photosensitive resin for the resin layer 163. At this time, the resin layer 163 can be formed in the following manner: a resin film is deposited first, the resin film is exposed to light through a photomask, and then the resin film is subjected to development treatment. After that, in order to adjust the level of the top surface of the resin layer 163, an upper portion of the resin layer 163 may be etched by ashing or the like.

In the case where a non-photosensitive resin is used for the resin layer 163, the resin layer 163 can be formed in the following manner: a resin film is deposited, and then an upper portion of the resin film is etched to have an optimum thickness until a surface of the conductive film to be the conductive layer 161 is exposed by ashing or the like.

Next, a conductive film to be the conductive layer 162 over the resin layer 163 and the conductive film to be the conductive layer 161 are deposited. After that, a resist mask is formed over the two conductive films by a photolithography method, and an unnecessary portion of the conductive film is removed by etching. Then, the resist mask is removed, so that the conductive layer 161 and the conductive layer 162 can be formed in the same step.

Note that although the conductive layer 161 and the conductive layer 162 are formed using the same photomask in the same step here, the conductive layer 161 and the conductive layer 162 may be separately formed using different photomasks. In this case, it is preferable that the conductive layer 161 and the conductive layer 162 be processed so that the conductive layer 161 is positioned inward from the outline of the conductive layer 162 in a plan view.

Next, a conductive film is formed to cover the conductive layer 161 and the conductive layer 162 and then part of the conductive film is removed by etching, whereby the pixel electrode 111 and the connection electrode 111C are formed (FIG. 15A). In that case, as illustrated in FIG. 15A, the pixel electrode 111 and the connection electrode 111C are preferably formed so as to cover the conductive layer 161 and the conductive layer 162, in which case the conductive layer 161 and the conductive layer 162 are not exposed to an etching atmosphere at the time of the formation of the pixel electrode 111 and the like.

[Formation of Organic Layer 115]

Next, the organic layer 115 is deposited over the pixel electrode 111 (FIG. 15B). The organic layer 115 is preferably deposited without using an FMM.

Note that the organic layer 115 may be separately formed using the FMM. In that case, the description of the organic layer 112R and the like below can be referred to.

The organic layer 115 can be preferably formed by a vacuum evaporation method. Note that without limitation to this, the organic layer 115 can be formed by a sputtering method, an inkjet method, or the like. The above-described deposition method can be used as appropriate.

[Formation of Organic Layer 112R, Organic Layer 112G, Organic Layer 112B, and Organic Layer 155]

Next, the organic layer 112R having an island shape is formed so as to cover a region that overlaps with the pixel electrode 111R and is over the organic layer 115.

In this case, the organic layer 112R is formed so as to overlap with one or more of the pixel electrode 111G, the pixel electrode 111B, and the pixel electrode 111S of an adjacent pixel. The organic layer 112R and the like are separately formed so as to not only make the organic layers overlap with each other but also make the organic layer overlap with a pixel electrode of the adjacent pixel, whereby the interval between the pixel electrodes can be made small, and the light-emitting element and the light-receiving element can be arranged with high density.

The organic layer 112R is preferably formed by a vacuum evaporation method using the FMM. Note that the island-shaped organic layer 112R may be formed by a sputtering method using the FMM or an inkjet method.

FIG. 15C illustrates a state in which the organic layer 112R is deposited through an FMM 151R. FIG. 15C illustrates a state of what is called face-down deposition, in which deposition is performed with the substrate turned upside down so that the film formation surface is placed face down.

In an evaporation method or the like using an FMM, an area wider than an opening pattern of the FMM is subjected to evaporation in many cases. Thus, even in the case where the FMM 151R that has the same opening pattern as a pattern of the pixel electrode 111R is used, the organic layer 112R can be deposited also in a region between the pixel electrode 111R and a pixel electrode adjacent to the pixel electrode 111R as indicated by the dashed line in FIG. 15C. Here, the organic layer 112R is also formed over the adjacent pixel electrode 111G and pixel electrode ills.

Figures 16A, 16B, 16C:
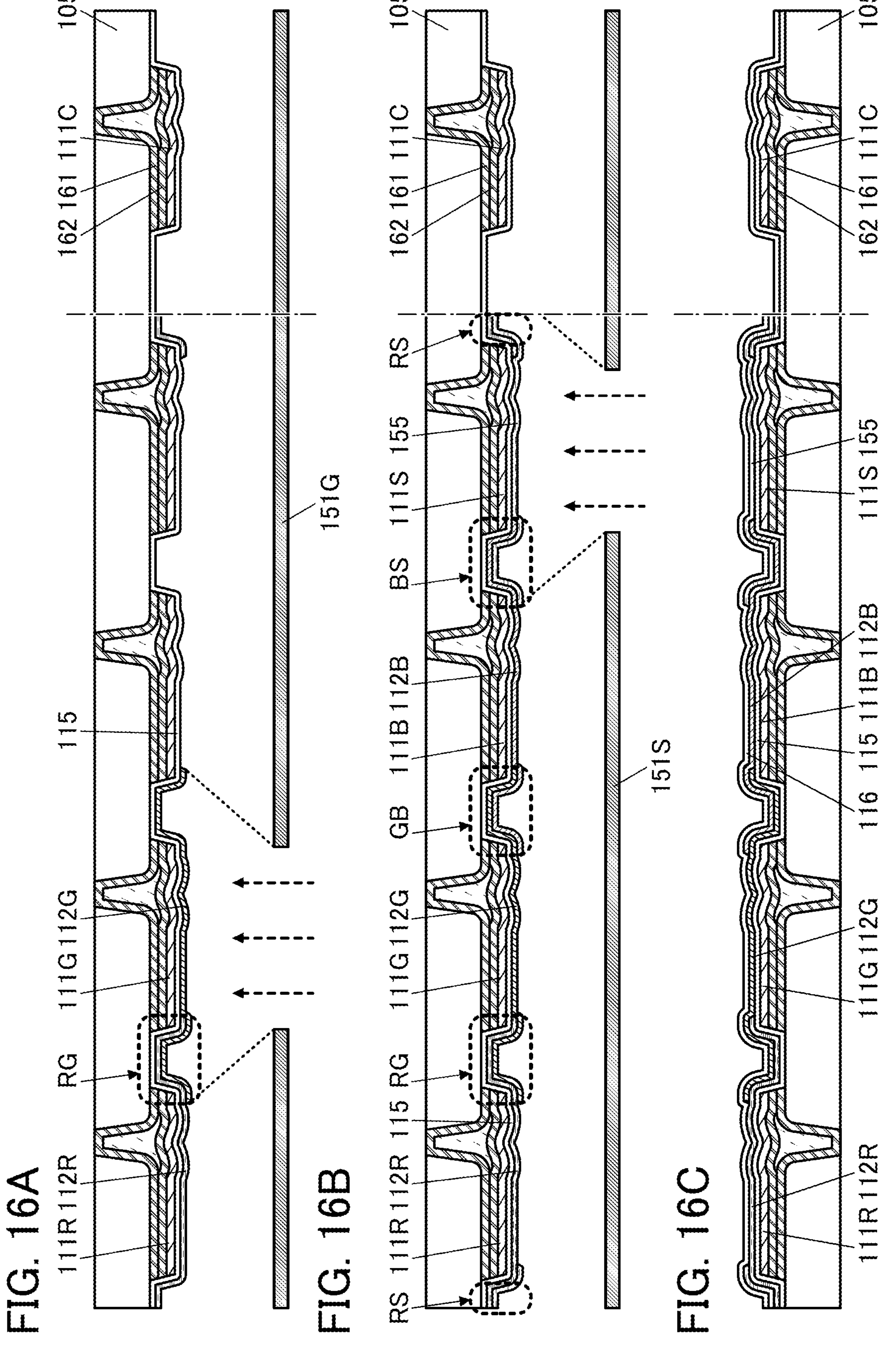
FIG. 16A to FIG. 16C are diagrams illustrating an example of a manufacturing method of a display apparatus.

Next, the organic layer 112G is formed over the pixel electrode 111G using an FMM 151G (FIG. 16A). Here, the organic layer 112G is also formed over the adjacent pixel electrode 111R and pixel electrode 111B.

As in the organic layer 112R, a pattern of the organic layer 112G is formed to extend beyond the pixel electrode 111G. As a result, a portion in which the organic layer 112G is stacked over the organic layer 112R is formed as indicated by a region RG in FIG. 16A.

Then, the organic layer 112B is formed over the pixel electrode 111B using an FMM 151B (not illustrated). After that, the organic layer 155 is formed over the pixel electrode 111S using an FMM 151S.

As in the organic layer 112R and the organic layer 112B, patterns of the organic layer 112B and the organic layer 155 are formed to extend beyond the pixel electrode 111B and the pixel electrode 111S, respectively. As a result, as illustrated in FIG. 16B, a region GB in which the organic layer 112B is stacked over the organic layer 112G, a region BS in which the organic layer 155 is stacked over the organic layer 112B, and a region RS in which the organic layer 155 is stacked over the organic layer 112R are formed. Although not illustrated here, a region in which the organic layer 155 is stacked over the organic layer 112G, a region in which the organic layer 112B is stacked over the organic layer 112R, and the like are formed.

Here, it is preferable that the organic layer 112R, the organic layer 112G, the organic layer 112B, and the organic layer 155 not be formed over the connection electrode 111C. FIG. 16B illustrates an example where, over the connection electrode 111C, the organic layer 115 is formed and the organic layer 112R, the organic layer 112G, and the organic layer 112B are not formed.

Note that although the organic layer 112R, the organic layer 112G, the organic layer 112B, and the organic layer 155 are formed in this order here, the formation order is not limited thereto.

[Formation of Organic Layer 116]

Next, the organic layer 116 is formed to cover the organic layer 112R, the organic layer 112G, the organic layer 112B, and the organic layer 155 (FIG. 16C). The organic layer 116 can be formed in a manner similar to that of the organic layer 115.

[Formation of Sacrificial Film 144 and Sacrificial Film 146]

Subsequently, a sacrificial film 144 is formed to cover the organic layer 116. After that, the sacrificial film 146 is formed over the sacrificial film 144.

As the sacrificial film 144, it is possible to use a film highly resistant to etching treatment performed on the organic layer 115, the organic layer 112, the organic layer 155, and the organic layer 116, i.e., a film having high etching selectivity. Furthermore, as the sacrificial film 144, it is possible to use a film having high etching selectivity with respect to a sacrificial film such as a sacrificial film 146 described later. Moreover, as the sacrificial film 144, it is particularly preferable to use a film that can be removed by a wet etching method less likely to cause damage to the organic layer 115, the organic layer 112, the organic layer 155, and the organic layer 116.

As the sacrificial film 144, for example, an inorganic film such as a metal film, an alloy film, a metal oxide film, a semiconductor film, or an inorganic insulating film, or an organic insulating film can be suitably used. The sacrificial film 144 can be formed by any of a variety of deposition methods such as a sputtering method, an evaporation method, a CVD method, and an ALD method.

Specifically, the sacrificial film 144, which is directly formed on the organic layer 116, is preferably formed by an ALD method or a vacuum evaporation method that give less deposition damage to a formation layer.

The sacrificial film 144 and the sacrificial film 146 are formed at a temperature lower than the upper temperature limit of the organic layer 112 and the organic layer 155. The typical substrate temperatures in formation of the sacrificial film 144 and the sacrificial film 146 are each lower than or equal to 200° C., preferably lower than or equal to 150° C., further preferably lower than or equal to 120° C., still further preferably lower than or equal to 100° C., yet still further preferably lower than or equal to 80° C.

For the sacrificial film 144, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, for the sacrificial film 144, a metal oxide such as an indium gallium zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of aluminum and yttrium Alternatively, for the sacrificial film 144, oxide such as aluminum oxide, hafnium oxide, or silicon oxide, nitride such as silicon nitride or aluminum nitride, or oxynitride such as silicon oxynitride can be used. Such an inorganic insulating material can be formed by a deposition method such as a sputtering method, a CVD method, or an ALD method.

Furthermore, an organic material may be used for the sacrificial film 144. For example, as the organic material, a material that can be dissolved in a solvent chemically stable with respect to at least the uppermost organic layer 116 of the EL layer may be used. In particular, a material that will be dissolved in water or alcohol (a water-soluble material or an alcohol-soluble material) can be suitably used for the sacrificial film 144. In deposition of the sacrificial film 144, it is preferable that application of such a material dissolved in a solvent such as water or alcohol be performed by a wet deposition method and then heat treatment for evaporating the solvent be performed. At this time, the heat treatment is preferably performed in a reduced-pressure atmosphere, in which case the solvent can be removed at a low temperature in a short time and thermal damage to the EL layer can be reduced accordingly.

The sacrificial film 144 may be formed by a wet process such as spin coating, dipping, spray coating, ink-jetting, dispensing, screen printing, offset printing, a doctor knife method, slit coating, roll coating, curtain coating, or knife coating.

For the sacrificial film 144, an organic resin material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used. A fluorine resin such as perfluoro polymer may be used for the sacrificial film 144.

The sacrificial film 146 is a film used for a hard mask when the sacrificial film 144 is etched later. In a later step of processing the sacrificial film 146, the sacrificial film 144 is exposed. Thus, the combination of films having high etching selectivity therebetween is selected for the sacrificial film 144 and the sacrificial film 146. It is thus possible to select a film that can be used for the sacrificial film 146 depending on an etching condition of the sacrificial film 144 and an etching condition of the sacrificial film 146.

A material of the sacrificial film 146 can be selected from a variety of materials depending on an etching condition of the sacrificial film 144 and an etching condition of the sacrificial film 146. For example, any of the films that can be used for the sacrificial film 144 can be used.

For example, as the sacrificial film 146, an oxide film can be used. Typically, it is possible to use an oxide film or an oxynitride film such as silicon oxide, silicon oxynitride, aluminum oxide, aluminum oxynitride, hafnium oxide, or hafnium oxynitride.

As the sacrificial film 146, a film of nitride can be used, for example. Specifically, it is possible to use a nitride such as silicon nitride, aluminum nitride, hafnium nitride, titanium nitride, tantalum nitride, tungsten nitride, gallium nitride, or germanium nitride.

For example, for the sacrificial film 144, an inorganic insulating material, such as aluminum oxide, hafnium oxide, or silicon oxide, formed by an ALD method is preferably used; and for the sacrificial film 146, a metal oxide containing indium, such as In—Ga—Zn oxide, formed by a sputtering method is preferably used. Alternatively, it is preferable to use a metal such as tungsten, molybdenum, copper, aluminum, titanium, or tantalum or an alloy containing the metal for the sacrificial film 146.

For example, an organic film (e.g., a PVA film) formed by an evaporation method or any of the above wet processes can be used as the sacrificial film 144, and an inorganic film (e.g., a silicon oxide film or a silicon nitride film) formed by a sputtering method can be used as the sacrificial film 146.

Alternatively, as the sacrificial film 146, an organic film that can be used for the organic layer 115, the organic layer 112, the organic layer 155, the organic layer 116, and the like may be used. For example, the same film as the organic film that is used for the organic layer 115, the organic layer 112, the organic layer 155, or the organic layer 116 can be used as the sacrificial film 146. The use of such an organic film is preferable, in which case the deposition apparatus for the sacrificial film 146 can be used for the organic layer 115, the organic layer 112, the organic layer 155, the organic layer 116, and the like. In addition, when the organic layer 115, the organic layer 112, the organic layer 155, the organic layer 116, and the like are etched using layers to be the sacrificial layer 147 and the sacrificial layer 145 as a mask, the sacrificial layer 147 can be removed at the same time, so that the process can be simplified.

[Formation of Resist Mask 143]

Figures 17A, 17B, 17C:
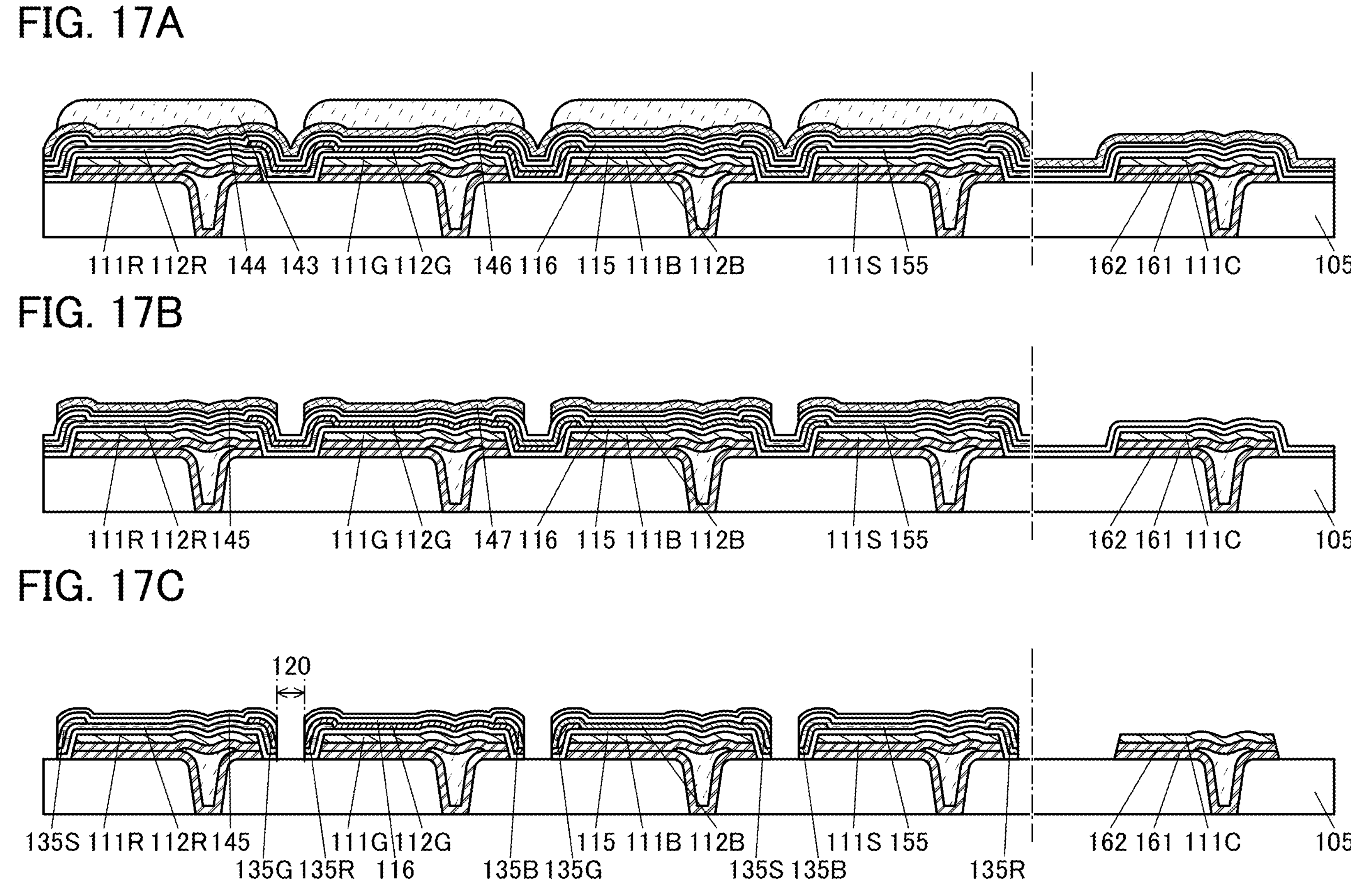
FIG. 17A to FIG. 17C are diagrams illustrating an example of a manufacturing method of a display apparatus.

Then, over the sacrificial film 146, a resist mask 143 is formed in positions overlapping with the pixel electrode 111R, the pixel electrode 111G, the pixel electrode 111B, and the pixel electrode 111S (FIG. 17A). In this case, a resist mask is not formed in a position overlapping with the connection electrode 111C. When the electrode 111A is formed, it is preferable that a resist mask be not formed in a position overlapping with the electrode 111A.

For the resist mask 143, a resist material containing a photosensitive resin such as a positive type resist material or a negative type resist material can be used.

Here, in the case where the sacrificial film 146 is not provided and the resist mask 143 is formed over the sacrificial film 144, if a defect such as a pinhole exists in the sacrificial film 144, there is a risk of dissolving the organic layer 115, the organic layer 112, the organic layer 155, the organic layer 116, and the like due to a solvent of the resist material. Such a defect can be prevented by using the sacrificial film 146.

Note that in the case where a material which does not dissolve the organic layer 115, the organic layer 112, the organic layer 155, and the organic layer 116 is used for a solvent of the resist material, for example, the resist mask 143 may be formed directly over the sacrificial film 144 without using the sacrificial film 146 in some cases.

[Etching of Sacrificial Film 146]

Next, part of the sacrificial film 146 that is not covered with the resist mask 143 is removed by etching, so that a patterned sacrificial layer 147 is formed.

In the etching of the sacrificial film 146, an etching condition with high selectivity is preferably employed so that the sacrificial film 144 is not removed by the etching. Either wet etching or dry etching can be performed for the etching of the sacrificial film 146; with use of dry etching, a reduction in a pattern of the sacrificial layer 147 can be inhibited.

[Removal of Resist Mask 143]

Next, the resist mask 143 is removed.

The removal of the resist mask 143 can be performed by wet etching or dry etching. It is particularly preferable to perform dry etching (also referred to as plasma ashing) using an oxygen gas as an etching gas to remove the resist mask 143.

In that case, the removal of the resist mask 143 is performed in a state where the organic layer 116 is covered with the sacrificial film 144; thus, the organic layer 115, the organic layer 112, the organic layer 155, and the organic layer 116 are less likely to be affected by the removal. This is suitable particularly for etching using an oxygen gas, such as plasma ashing, because exposure of the organic layer 115, the organic layer 112, the organic layer 155, and the organic layer 116 to oxygen might adversely affect the electrical characteristics. Even in the case where the resist mask 143 is removed by wet etching, the organic layer 116 and the like can be prevented from being dissolved because the organic layer 116 and the like are not exposed to a chemical solution.

[Etching of Sacrificial Film 144]

Next, part of the sacrificial film 144 is removed by etching with use of the sacrificial layer 147 as a hard mask, so that a patterned sacrificial layer 145 is formed (FIG. 17B).

Either wet etching or dry etching can be performed for the etching of the sacrificial film 144; the use of dry etching is preferable, in which case a reduction in a pattern can be inhibited.

[Etching of Organic Layer 116, Organic Layer 112, Organic Layer 155, and Organic Layer 115]

Then, part of the organic layer 116, part of the organic layer 112, part of the organic layer 155, and part of the organic layer 115, which are not covered with the sacrificial layer 145, are removed by etching, so that the slit 120 is formed. At the same time, the top surface of the connection electrode 111C is also exposed. Furthermore, when the electrode 111A is formed, the top surface of the electrode 111A is also exposed.

At this time, part of the organic layer 112R, part of the organic layer 112G, part of the organic layer 112B, and part of the organic layer 155 are each divided by etching, whereby the layer 135R which is a cut piece of the organic layer 112R, the layer 135G which is a cut piece of the organic layer 112G, the layer 135B which is a cut piece of the organic layer 112B, and the layer 135S which is a cut piece of the organic layer 155 are formed.

Specifically, for the etching of the organic layer 116, the organic layer 112, the organic layer 155, and the organic layer 115, it is preferable to perform dry etching using an etching gas that does not contain oxygen as its main component. This can inhibit the alteration of the organic layer 116, the organic layer 112, the organic layer 155, and the organic layer 115 to achieve a highly reliable display apparatus. Examples of the etching gas that does not contain oxygen as its main component include $CF_4$, $C_4F_8$, $SF_6$, $CHF_3$, $C_2$, $H_2O$, $BCl_3$, $H_2$, or a rare gas such as He. Alternatively, a mixed gas of the above gas and a dilution gas that does not contain oxygen can be used as the etching gas.

Note that etching of the organic layer 116, the organic layer 112, the organic layer 155, and the organic layer 115 are not limited to the above and may be performed by dry etching using another gas or wet etching.

In addition, when dry etching using, as an etching gas, an oxygen gas or a mixed gas containing an oxygen gas is used for the etching of the organic layer 116, the organic layer 112, the organic layer 155, and the organic layer 115, the etching rate can be increased. Consequently, etching under a low-power condition can be performed while the etching rate is kept adequately high; hence, damage due to the etching can be reduced. Furthermore, a defect such as attachment of a reaction product generated in the etching can be inhibited. For example, a mixed gas obtained by adding an oxygen gas to the etching gas not containing oxygen as its main component can be used as the etching gas.

The insulating layer 105 is exposed when the organic layer 116, the organic layer 112, the organic layer 155, and the organic layer 115 are etched. Accordingly, it is preferable to use a film highly resistant to etching of the organic layer 115 for the insulating layer 105. Note that at the time of etching of the organic layer 115, an upper portion of the insulating layer 105 is etched and a portion not covered with the organic layer 115 is thinned in some cases.

Note that at the time of etching of the organic layer 116, the organic layer 112, the organic layer 155, and the organic layer 115, the sacrificial layer 147 may also be etched at the same time. The organic layer 116, the organic layer 112, the organic layer 155, or the organic layer 115, and the sacrificial layer 147 are preferably etched by the same treatment because the process can be simplified to reduce the manufacturing cost of the display apparatus.

[Removal of Sacrificial Layer]

Then, the sacrificial layer 147 is removed to expose the top surface of the sacrificial layer 145 (FIG. 17C). At this time, the sacrificial layer 145 preferably remains. Note that the sacrificial layer 147 is not necessarily removed at this time.

[Formation of Insulating Film **125*f***]

Subsequently, an insulating film **125*f* is deposited to cover the sacrificial layer 145 and the slit 120**.

The insulating film **125*f* functions as a barrier layer that prevents diffusion of impurities such as water into the EL layer. The insulating film 125*f*** is preferably formed by an ALD method with excellent step coverage so as to suitably cover a side surface of the EL layer.

It is preferable that the insulating film **125*f* be formed using the same film as the sacrificial layer 145 because they can be etched at the same time in a later step. For example, an inorganic insulating material such as aluminum oxide, hafnium oxide, or silicon oxide, which is formed by an ALD method, is preferably used for the insulating film 125*f* and the sacrificial layer 145**.

Note that the materials that can be used for the insulating film **125*f* are not limited to this, and the above-described materials that can be used for the sacrificial film 144** can be used as appropriate.

[Formation of Resin Layer 126]

Figures 18A, 18B, 18C:
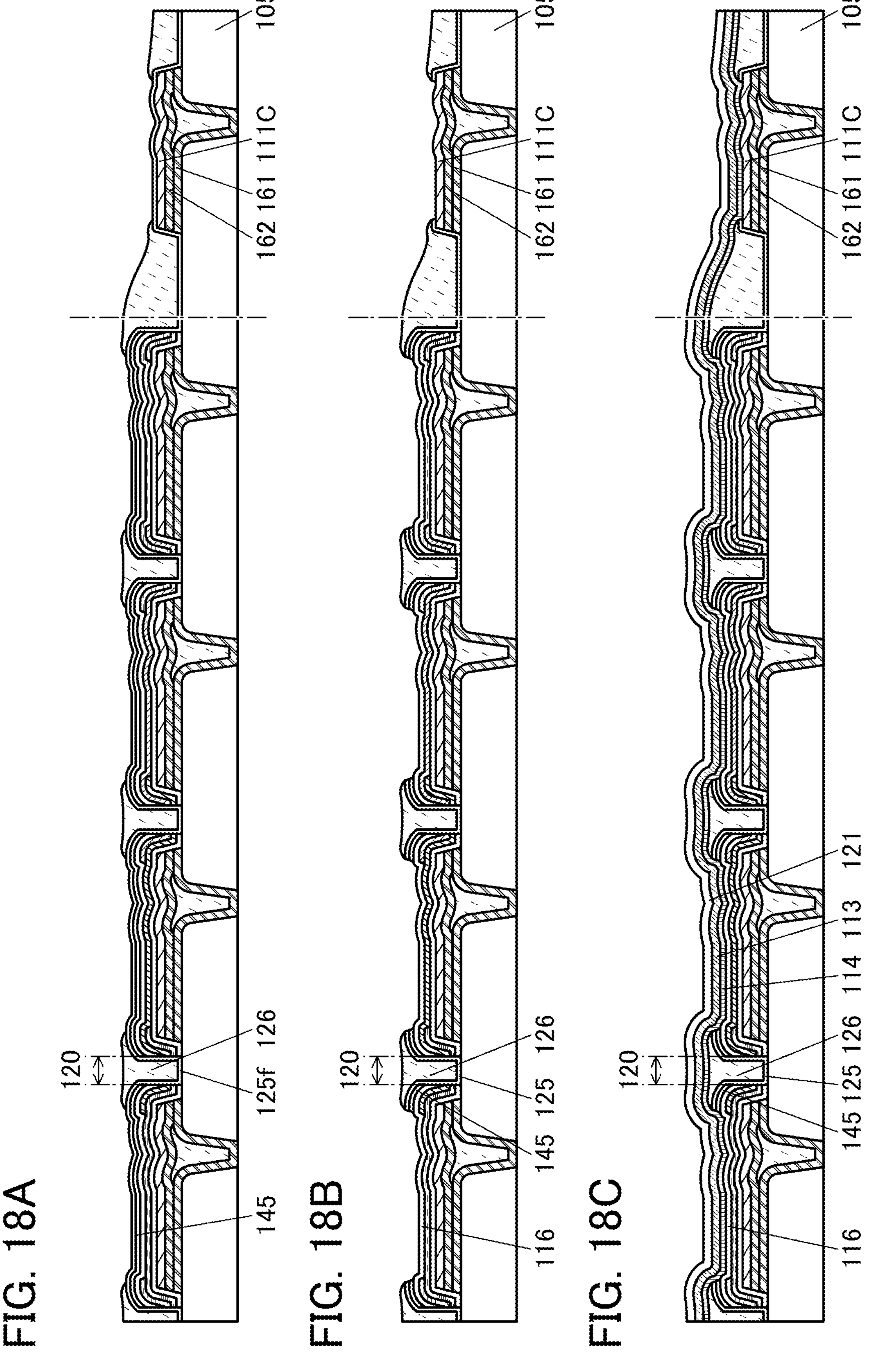
FIG. 18A to FIG. 18C are diagrams illustrating an example of a manufacturing method of a display apparatus.

Next, the resin layer 126 is formed in the region overlapping with the slit 120 (FIG. 18A). The resin layer 126 can be formed by a method similar to that of the resin layer 163. For example, a photosensitive resin is formed, and then light exposure and development are performed, whereby the resin layer 126 can be formed. The resin layer 126 may be formed in the following manner: a resin is formed entirely, and then the resin is partly etched by ashing or the like.

Here, an example in which the resin layer 126 is formed to have a larger width than the slit 120 is illustrated.

The resin layer 126 is provided not to cover the connection electrode 111C. When the electrode 111A is formed, the resin layer 126 is formed to cover the top surface of the electrode 111A not entirely.

[Etching of Insulating Film **125*f* and Sacrificial Layer 145**]

Next, portions of the insulating film **125*f* and the sacrificial layer 145 not covered with the resin layer 126 are removed by etching to expose the top surface of the organic layer 116. In this manner, the insulating layer 125 and the sacrificial layer 145 are formed in a region covered with the resin layer 126 (FIG. 18**B).

The insulating film **125*f* and the sacrificial layer 145 are preferably etched in the same step. It is particularly preferable that the etching of the sacrificial layer 145 be performed by wet etching that gives less etching damage to the organic layer 116**. For example, wet etching using a tetramethyl ammonium hydroxide (TMAH) solution, diluted hydrofluoric acid, oxalic acid, phosphoric acid, acetic acid, nitric acid, or a mixed solution of any of these acids is preferably performed.

Alternatively, one or both of the sacrificial film **125*f* and the sacrificial layer 145 are preferably removed by being dissolved in a solvent such as water or alcohol. For the alcohol in which the sacrificial film 125*f* or the sacrificial layer 145** can be dissolved, any of various alcohols such as ethyl alcohol, methyl alcohol, isopropyl alcohol (IPA), and glycerin can be used.

After the sacrificial film **125*f* and the sacrificial layer 145 are removed, drying treatment is preferably performed to remove water contained in the organic layer 115, the organic layer 112, the organic layer 155, the organic layer 116**, and the like and water adsorbed on the surfaces thereof. For example, heat treatment is preferably performed in an inert gas atmosphere or a reduced-pressure atmosphere. The heat treatment can be performed with a substrate temperature higher than or equal to 50° C. and lower than or equal to 200° C., preferably higher than or equal to 60° C. and lower than or equal to 150° C., or further preferably higher than or equal to 70° C. and lower than or equal to 120° C. Employing a reduced-pressure atmosphere is preferable, in which case drying at a lower temperature is possible.

The insulating film **125*f* and the sacrificial layer 145 are removed, whereby the top surface of the connection electrode 111C is exposed. When the electrode 111A is formed, the top surface of the electrode 111**A is exposed.

[Formation of Organic Layer 114]

Next, the organic layer 114 is formed to cover the organic layer 116, the insulating layer 125, the sacrificial layer 145, the resin layer 126, and the like.

The organic layer 114 can be deposited in a manner similar to that of the organic layer 115 or the like. In the case where the organic layer 114 is deposited by an evaporation method, the organic layer 114 may be deposited using a shielding mask so as not to be deposited over the connection electrode 111C.

[Formation of Common Electrode 113]

Next, the common electrode 113 is formed to cover the organic layer 114.

The common electrode 113 can be formed by a deposition method such as an evaporation method or a sputtering method. Alternatively, a film formed by an evaporation method and a film formed by a sputtering method may be stacked.

The common electrode 113 is preferably formed so as to cover a region where the organic layer 114 is deposited. That is, a structure in which an end portion of the organic layer 114 and the common electrode 113 overlap with each other can be obtained. The common electrode 113 may be formed using a shielding mask.

FIG. 18C illustrates an example in which the organic layer 114 is sandwiched between the connection electrode 111C and the common electrode 113 in the connection portion 130. In this case, for the organic layer 114, a material with as low electric resistance as possible is preferably used. Alternatively, it is preferable to form the organic layer 114 as thin as possible, in which case the electric resistance of the organic layer 114 in the thickness direction is reduced. For example, when a material which has an electron-injection property or a hole-injection property and whose thickness is greater than or equal to 1 nm and less than or equal to 5 nm, preferably greater than or equal to 1 nm and less than or equal to 3 nm is used for the organic layer 114, the electric resistance between the connection electrode 111C and the common electrode 113 can be made small enough to be negligible in some cases.

Note that also in the case of providing the connection portion 140, the organic layer 114 is interposed between the electrode 111A and the common electrode 113.

[Formation of Protective Layer]

Next, the protective layer 121 is formed over the common electrode 113 (FIG. 18C). An inorganic insulating film used for the protective layer 121 is preferably deposited by a sputtering method, a PECVD method, or an ALD method. In particular, an ALD method is preferable because it provides excellent step coverage and is less likely to cause a defect such as a pinhole. An organic insulating film is preferably deposited by an ink-jet method because a uniform film can be formed in a desired area.

Through the above-described processes, the display apparatus illustrated in FIG. 6A can be manufactured.

Although the case where the resin layer 126 is formed to have a larger width than the slit 120 is described above, the resin layer 126 may be formed to have the same width as the slit 120.

Figures 19A, 19B, 19C:
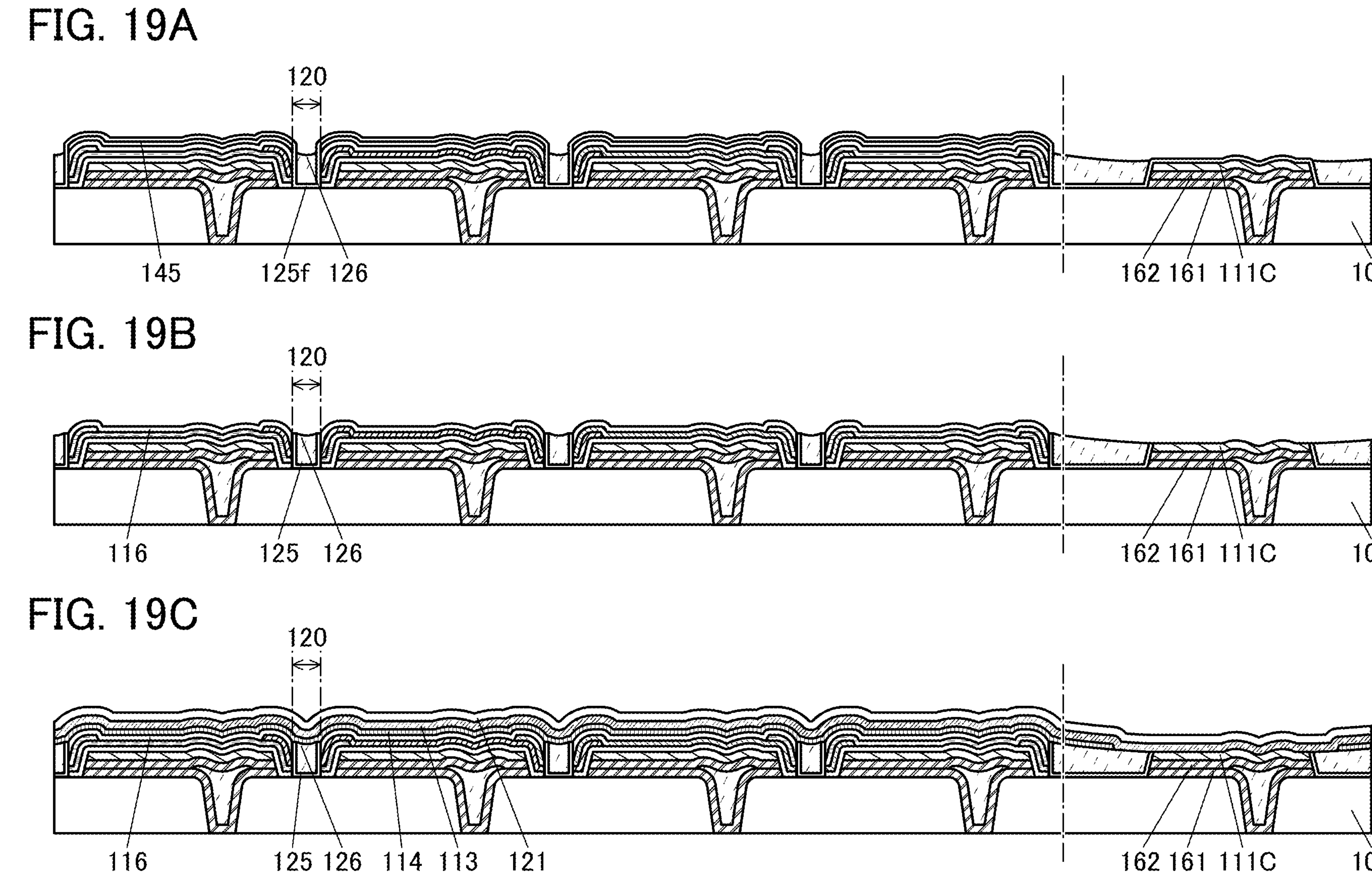
FIG. 19A to FIG. 19C are diagrams illustrating an example of a manufacturing method of a display apparatus.

FIG. 19A is a schematic cross-sectional view at the time when the resin layer 126 is formed after the insulating film **125*f*** is formed.

For example, as illustrated in FIG. 18A, the resin layer 126 having a larger width than the slit 120 is formed and then the upper portion of the resin layer 126 is etched by ashing or the like, whereby the resin layer 126 can be formed only inside the slit 120. In that case, it is preferable that the levels of the top surface of the resin layer 126 and the top surface of the adjacent organic layer 116 be as close as possible to each other. Accordingly, the steps at both ends of a portion overlapping with the slit 120 can be reduced; thus, the step coverage with the organic layer 114 and the like can be improved.

Subsequently, the insulating film 125*f* and the sacrificial layer 145 are etched in a manner similar to the above (FIG. 19B). At this time, the sacrificial layer 145 does not have a portion covered with the resin layer 126; thus, the sacrificial layer 145 is removed without leaving a cut piece.

Then, the organic layer 114, the common electrode 113, and the protective layer 121 are formed in a manner similar to the above, whereby the display apparatus illustrated in FIG. 19C can be manufactured.

FIG. 19C illustrates an example in which the organic layer 114 is not provided between the connection electrode 111C and the common electrode 113. Since the connection electrode 111C and the common electrode 113 are in contact with each other, the contact resistance between these electrodes can be extremely low, which leads to a reduction in power consumption.

The above is the description of the example of the manufacturing method of the display apparatus.

At least part of this embodiment can be implemented in combination with the other embodiments described in this specification as appropriate.

Embodiment 2

In this embodiment, structure examples of a display apparatus of one embodiment of the present invention are described. In this embodiment, a structure example of a display apparatus of one embodiment of the present invention will be described. Although a display apparatus capable of displaying an image is described here, when a light-emitting element is used as a light source, the display apparatus can be used as a display apparatus.

The display apparatus of this embodiment can be a high-definition display apparatus or a large-sized display apparatus. Accordingly, the display apparatus of this embodiment can also be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Apparatus 400]

Figure 20:
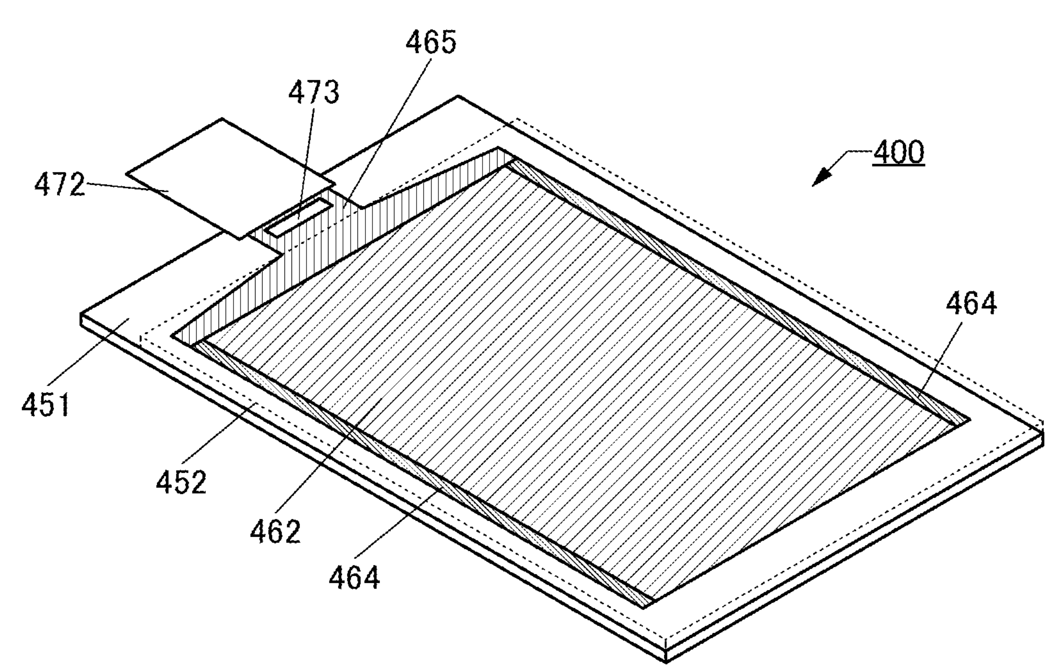
FIG. 20 is a diagram illustrating a structure example of a display apparatus.
Figures 21A, 21B:
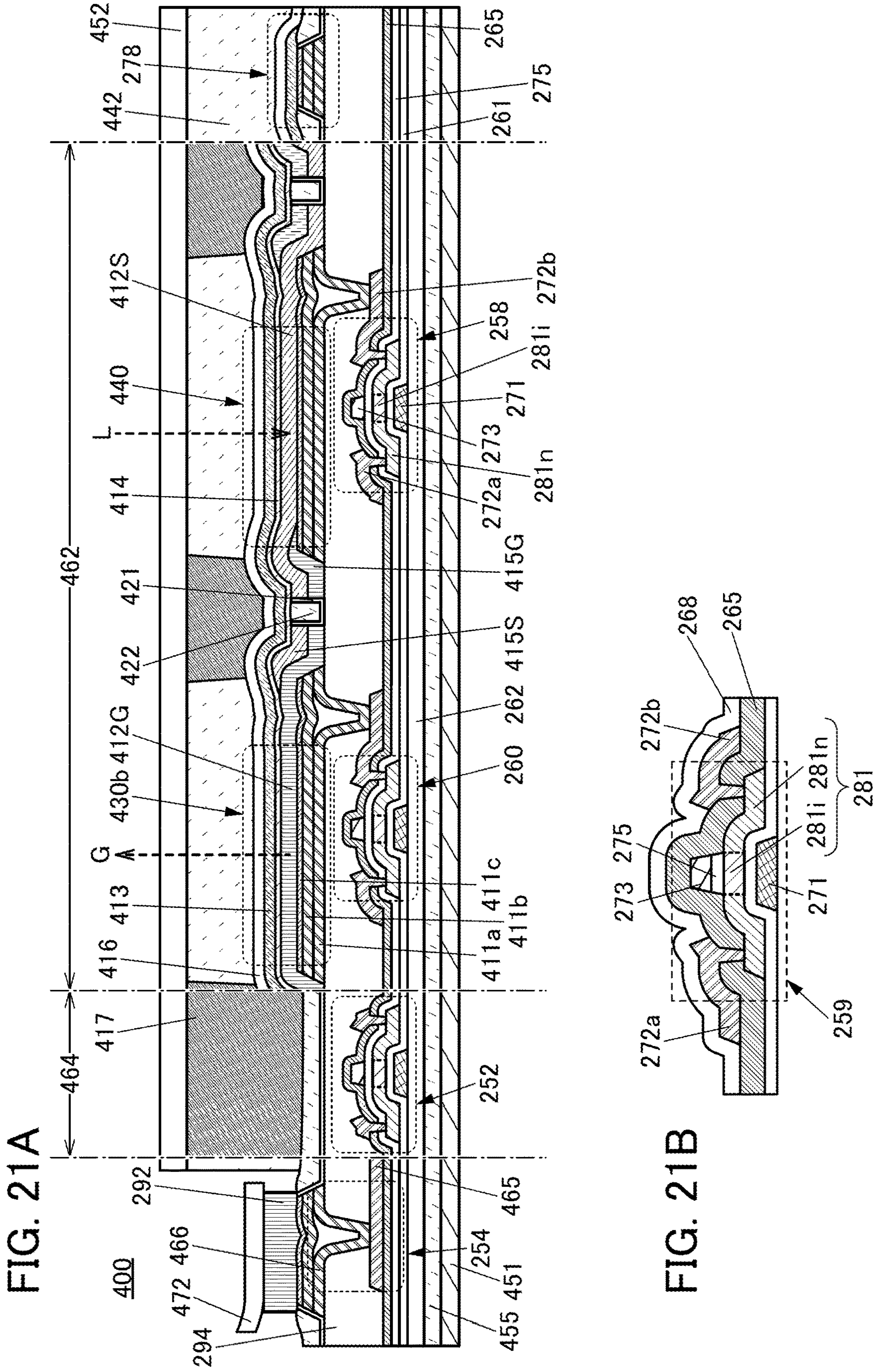
FIG. 21A is a diagram illustrating a structure example of a display apparatus.
FIG. 21B is a diagram illustrating a structure example of a transistor.

FIG. 20 is a perspective view of a display apparatus 400, and FIG. 21A is a cross-sectional view of the display apparatus 400.

The display apparatus 400 has a structure in which a substrate 452 and a substrate 451 are bonded to each other. In FIG. 20, the substrate 452 is denoted by a dashed line.

The display apparatus 400 includes a display portion 462, a circuit 464, a wiring 465, and the like. FIG. 20 illustrates an example in which an IC 473 and an FPC 472 are integrated on the display apparatus 400. Thus, the structure illustrated in FIG. 21 can be regarded as a display module including the display apparatus 400, the IC (integrated circuit), and the FPC.

For the circuit 464, for example, a scan line driver circuit can be used.

The wiring 465 has a function of supplying a signal and electric power to the display portion 462 and the circuit 464. The signal and electric power are input to the wiring 465 from the outside through the FPC 472 or input to the wiring 465 from the IC 473.

FIG. 20 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display apparatus 400 and the display module are not necessarily provided with an IC. The IC may be mounted on the FPC by a COF method or the like.

FIG. 21A illustrates an example of cross sections of part of a region including the FPC 472, part of the circuit 464, part of the display portion 462, and part of a region including a connection portion in the display apparatus 400. FIG. 21A specifically illustrates an example of a cross section of a region including a light-emitting element 430*b* that emits green light (G) and a light-receiving element 440 that receives reflected light (L) of the display portion 462.

The display apparatus 400 illustrated in FIG. 21A includes a transistor 252, a transistor 260, a transistor 258, the light-emitting element 430*b*, the light-receiving element 440, and the like between the substrate 451 and the substrate 452.

The light-emitting element or the light-receiving element that are described above as examples can be applied to the light-emitting element 430*b* and the light-receiving element 440, respectively.

Here, in the case where the pixel of the display apparatus includes three kinds of subpixels including light-emitting elements that emit light of different colors, as the three subpixels, subpixels of three colors of red (R), green (G), and blue (B), subpixels of three colors of yellow (Y), cyan (C), and magenta (M), and the like can be given. In the case where four subpixels are included, as the four subpixels, subpixels of four colors of R, G, B, and white (W), subpixels of four colors of R, G, B, and Y, and the like can be given. Alternatively, the subpixel may include a light-emitting element emitting infrared light.

As the light-receiving element 440, a photoelectric conversion element having sensitivity to light in a red, green, or blue wavelength range or a photoelectric conversion element having sensitivity to light in an infrared wavelength range can be used.

The substrate 452 and a protective layer 416 are bonded to each other with an adhesive layer 442. The adhesive layer 442 is provided so as to overlap with each of the light-emitting element 430*b* and the light-receiving element 440, and the display apparatus 400 employs a solid sealing structure. The substrate 452 is provided with a light-blocking layer 417.

The light-blocking layer 417 includes portions in contact with the protective layer 416 and the substrate 452. The adhesive layer 442 is divided with the light-blocking layer 417 as a boundary.

The light-emitting element 430*b* and the light-receiving element 440 each include a conductive layer 411*a*, a conductive layer 411*b*, and a conductive layer 411*c* as pixel electrodes. The conductive layer 411*b* has a reflective property with respect to visible light and functions as a reflective electrode. The conductive layer 411*c* has a transmitting property with respect to visible light and functions as an optical adjustment layer.

The conductive layer 411*a* included in the light-emitting element 430*b* is connected to a conductive layer 272*b* included in the transistor 260 through an opening provided in an insulating layer 294. The transistor 260 has a function of controlling the driving of the light-emitting element. In contrast, the conductive layer 411*a* included in the light-receiving element 440 is electrically connected to the conductive layer 272*b* included in the transistor 258. The transistor 258 has a function of controlling the timing of light exposure using the light-receiving element 440.

An EL layer 412G or a PD layer 412S is provided to cover the pixel electrode. An insulating layer 421 is provided in contact with a side surface of the EL layer 412G and a side surface of the PD layer 412S, and a resin layer 422 is provided to fill a depressed portion of the insulating layer 421. An organic layer 414, a common electrode 413, and the protective layer 416 are provided to cover the EL layer 412G and the PD layer 412S. With the protective layer 416 covering the light-emitting element, entry of impurities such as water into the light-emitting element can be inhibited, leading to an increase in the reliability of the light-emitting element.

A layer 415G and a layer 415S are provided in contact with the insulating layer 421. The layer 415G contains the same material as the EL layer 412G, and the layer 415S contains the same material as the PD layer 412S.

Part of the layer 415G includes a portion covering end portions of the conductive layer 411*a*, the conductive layer 411*b*, and the conductive layer 411*c* of the light-receiving element 440 and a portion overlapping with the PD layer 412S and the conductive layer 411*c*. Part of the layer 415S includes a portion covering end portions of the conductive layer 411*a*, the conductive layer 411*b*, and the conductive layer 411*c* of the light-emitting element 430*b* and a portion overlapping with the EL layer 412G and the conductive layer 411*c*.

Light G emitted from the light-emitting element 430*b* is emitted toward the substrate 452 side. The light-receiving element 440 receives light L incident through the substrate 452 and converts the light L into an electric signal. For the substrate 452, a material having a high transmitting property with respect to visible light is preferably used.

The transistor 252, the transistor 260, and the transistor 258 are all formed over the substrate 451. These transistors can be manufactured using the same material in the same step.

Note that the transistor 252, the transistor 260, and the transistor 258 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials and/or have different thicknesses.

The substrate 451 and an insulating layer 262 are bonded to each other with an adhesive layer 455.

In a manufacturing method of the display apparatus 400, first, a formation substrate provided with the insulating layer 262, the transistors, the light-emitting elements, the light-receiving element, and the like is bonded to the substrate 452 provided with the light-blocking layer 417 with the adhesive layer 442. Then, the substrate 451 is attached to a surface exposed by separation of the formation substrate, whereby the components formed over the formation substrate are transferred onto the substrate 451. The substrate 451 and the substrate 452 preferably have flexibility. This can increase the flexibility of the display apparatus 400.

A connection portion 254 is provided in a region of the substrate 451 where the substrate 452 does not overlap. In the connection portion 254, the wiring 465 is electrically connected to the FPC 472 through a conductive layer 466 and a connection layer 292. The conductive layer 466 can be obtained by processing the same conductive film as the pixel electrode. Thus, the connection portion 254 and the FPC 472 can be electrically connected to each other through the connection layer 292.

Each of the transistor 252, the transistor 260, and the transistor 258 includes a conductive layer 271 functioning as a gate, an insulating layer 261 functioning as a gate insulating layer, a semiconductor layer 281 including a channel formation region 281*i* and a pair of low-resistance regions 281*n*, a conductive layer 272*a* connected to one of the pair of low-resistance regions 281*n*, the conductive layer 272*b* connected to the other of the pair of low-resistance regions 281*n*, an insulating layer 275 functioning as a gate insulating layer, a conductive layer 273 functioning as a gate, and an insulating layer 265 covering the conductive layer 273. The insulating layer 261 is positioned between the conductive layer 271 and the channel formation region 281*i*. The insulating layer 275 is positioned between the conductive layer 273 and the channel formation region 281*i*.

The conductive layer 272*a* and the conductive layer 272*b* are connected to the corresponding low-resistance regions 281*n* through openings provided in the insulating layer 265. One of the conductive layer 272*a* and the conductive layer 272*b* functions as a source, and the other functions as a drain.

FIG. 21A illustrates an example in which the insulating layer 275 covers the top surface and the side surface of the semiconductor layer. The conductive layer 272*a* and the conductive layer 272*b* are connected to the corresponding low-resistance regions 281*n* through openings provided in the insulating layer 275 and the insulating layer 265.

Meanwhile, in a transistor 259 illustrated in FIG. 21B, the insulating layer 275 overlaps with the channel formation region 281*i* of the semiconductor layer 281 and does not overlap with the low-resistance regions 281*n*. The structure illustrated in FIG. 21B can be manufactured by processing the insulating layer 275 using the conductive layer 273 as a mask, for example. In FIG. 21B, the insulating layer 265 is provided to cover the insulating layer 275 and the conductive layer 273, and the conductive layer 272*a* and the conductive layer 272*b* are connected to the low-resistance regions 281*n* through the openings in the insulating layer 265. Furthermore, an insulating layer 268 covering the transistor may be provided.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is sandwiched between two gates is used for the transistor 252, the transistor 260, and the transistor 258. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide contains preferably at least indium or zinc and further preferably indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as an In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the ratio of the number of indium atoms in the metal oxide, the on-state current, field-effect mobility, or the like of the transistor can be improved.

For example, when the atomic ratio of the metal element is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio of the metal element is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio of the metal element is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, and In:M:Zn=1:3:4 or a composition in the neighborhood thereof. By increasing the ratio of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)—gate voltage (Vg) curve of a transistor, the tangent at a point where the slope of the curve is the steepest intersects the straight line of Id=1 pA.

Alternatively, the semiconductor layer of the transistor may contain silicon. Examples of silicon include amorphous silicon and crystalline silicon (e.g., low-temperature polysilicon (also referred to as LTPS) or single crystal silicon).

In particular, low-temperature polysilicon has relatively high mobility and can be formed over a glass substrate, and thus can be suitably used for a display apparatus. For example, a transistor including low-temperature polysilicon in a semiconductor layer (an LTPS transistor) can be used as the transistor 252 and the like included in the driver circuit, and a transistor including an oxide semiconductor in a semiconductor layer (an OS transistor) can be used as the transistor 260, the transistor 258, and the like provided in the pixel. When both an LTPS transistor and an OS transistor are used, the display apparatus with low power consumption and high driving capability can be achieved. Note that a structure in which an LTPS transistor and an OS transistor are used in combination is referred to as LTPO in some cases. As a favorable example, it is preferable to use an OS transistor as a transistor or the like functioning as a switch for controlling electrical continuity between wirings and an LTPS transistor as a transistor or the like for controlling current.

Alternatively, a semiconductor layer of a transistor may contain a layered material that functions as a semiconductor. The layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

Note that the display apparatus illustrated in FIG. 21A includes an OS transistor and a common layer which is divided between the light-emitting elements. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, a high chroma, and a high contrast ratio in an image displayed on the display apparatus. With the structure where the leakage current that might flow through the transistor and the lateral leakage current that might flow between light-emitting elements are extremely low, display with little leakage of light at the time of black display (what is called black floating) (such display is also referred to as deep black display) can be achieved.

In particular, in the case where a light-emitting device having an MML structure employs a separate coloring structure (an SBS structure), a layer provided between light-emitting elements (for example, also referred to as an organic layer or a common layer which is commonly used between the light-emitting elements) is disconnected; accordingly, display with no or extremely low side leakage can be achieved.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display apparatus.

An inorganic insulating film is preferably used as each of the insulating layer 261, the insulating layer 262, the insulating layer 265, the insulating layer 268, and the insulating layer 275. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that an end portion of the organic insulating film is positioned inward from the end portion of the display apparatus 400, to prevent the organic insulating film from being exposed at the end portion of the display apparatus 400.

An organic insulating film is suitable for the insulating layer 294 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on a surface of the substrate 452 on the substrate 451 side. A variety of optical members can be arranged on the outer side of the substrate 452. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorption layer, or the like may be provided on the outer side of the substrate 452.

FIG. 21A illustrates a connection portion 278. In the connection portion 278, the common electrode 413 is electrically connected to a wiring. FIG. 21A illustrates an example in which the wiring has the same stacked-layer structure as the pixel electrode.

For each of the substrate 451 and the substrate 452, glass, quartz, ceramic, sapphire, a resin, a metal, an alloy, a semiconductor, or the like can be used. The substrate on the side where light from the light-emitting element is extracted is formed using a material that transmits the light. When a flexible material is used for the substrate 451 and the substrate 452, the flexibility of the display apparatus can be increased. Furthermore, a polarizing plate may be used as the substrate 451 or the substrate 452.

For each of the substrate 451 and the substrate 452, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 451 and the substrate 452.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

For the connection layer 292, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display apparatus, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, a display apparatus of one embodiment of the present invention is described.

The display apparatus of one embodiment of the present invention includes a light-receiving element (also referred to as a light-receiving device) and a light-emitting element (also referred to as a light-emitting device). Alternatively, the display apparatus of one embodiment of the present invention may include a light-emitting and light-receiving element (also referred to as a light-emitting and light-receiving device) and a light-emitting element.

First, a display apparatus including a light-receiving element and a light-emitting element is described.

The display apparatus of one embodiment of the present invention includes a light-receiving element and a light-emitting element in a light-emitting and light-receiving unit. In the display apparatus of one embodiment of the present invention, the light-emitting elements are arranged in a matrix in the light-emitting and light-receiving unit, and an image can be displayed on the light-emitting and light-receiving unit. Furthermore, the light-receiving elements are arranged in a matrix in the light-emitting and light-receiving unit, and the light-emitting and light-receiving unit has one or both of an image capturing function and a sensing function. The light-emitting and light-receiving unit can be used as an image sensor, a touch sensor, or the like. That is, by detecting light with the light-emitting and light-receiving unit, an image can be captured and touch operation of an object (e.g., a finger or a stylus) can be detected. Furthermore, in the display apparatus of one embodiment of the present invention, the light-emitting elements can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting element included in the light-emitting and light-receiving unit, the light-receiving element can detect the reflected light (or the scattered light); thus, image capturing, touch operation detection, or the like is possible even in a dark place.

The light-emitting element included in the display apparatus of one embodiment of the present invention functions as a display element (also referred to as a display device).

As the light-emitting element, an EL element (also referred to as an EL device) such as an OLED or a QLED is preferably used. Examples of a light-emitting substance contained in the EL element include a substance exhibiting fluorescence (a fluorescent material), a substance exhibiting phosphorescence (a phosphorescent material), and a substance exhibiting thermally activated delayed fluorescence (a thermally activated delayed fluorescent (TADF) material). As the light-emitting substance contained in the EL element, not only organic compounds but also inorganic compounds (e.g., quantum dot materials) can be used. An LED such as a micro LED can also be used as the light-emitting element.

The display apparatus of one embodiment of the present invention has a function of detecting light with the use of a light-receiving element.

When the light-receiving elements are used as an image sensor, the display apparatus can capture an image using the light-receiving elements. For example, the display apparatus can be used as a scanner.

An electronic device including the display apparatus of one embodiment of the present invention can obtain data related to biological information such as a fingerprint or a palm print by using a function of an image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

When the light-receiving elements are used as the touch sensor, the display apparatus can detect touch operation of an object with the use of the light-receiving elements.

As the light-receiving element, a pn photodiode or a pin photodiode can be used, for example. The light-receiving element functions as a photoelectric conversion element (also referred to as a photoelectric conversion device) that detects light entering the light-receiving element and generates charge. The amount of charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

In the case where all the layers of the organic EL elements and the organic photodiodes are formed separately, the number of deposition steps becomes extremely large. However, a large number of layers of the organic photodiodes can have a structure in common with the organic EL elements; thus, concurrently depositing the layers that can have a common structure can inhibit an increase in the number of deposition steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer may be a layer shared by the light-receiving element and the light-emitting element. When the light-receiving element and the light-emitting element include a common layer in such a manner, the number of deposition steps and the number of masks can be reduced, thereby reducing the number of manufacturing steps and the manufacturing cost of the display apparatus. Furthermore, the display apparatus including the light-receiving element can be manufactured using an existing manufacturing apparatus and an existing manufacturing method for the display apparatus.

Next, a display apparatus including light-emitting and light-receiving elements and light-emitting elements is described. Note that functions, behavior, effects, and the like similar to those in the above are not described in some cases.

In the display apparatus of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the light-emitting and light-receiving unit of the display apparatus of one embodiment of the present invention has a function of displaying an image using both light-emitting and light-receiving elements and light-emitting elements.

The light-emitting and light-receiving element functions as both a light-emitting element and a light-receiving element, whereby the pixel can have a light-receiving function without an increase in the number of subpixels included in the pixel. Thus, the light-emitting and light-receiving unit of the display apparatus can be provided with one or both of an image capturing function and a sensing function while keeping the aperture ratio of the pixel (aperture ratio of each subpixel) and the resolution of the display apparatus. Accordingly, in the display apparatus of one embodiment of the present invention, the aperture ratio of the pixel can be more increased and the resolution can be increased more easily than in a display apparatus provided with a subpixel including a light-receiving element separately from a subpixel including a light-emitting element.

In the light-emitting and light-receiving unit of the display apparatus of one embodiment of the present invention, the light-emitting and light-receiving elements and the light-emitting elements are arranged in a matrix, and an image can be displayed on the light-emitting and light-receiving unit. The light-emitting and light-receiving unit can be used as an image sensor, a touch sensor, or the like. In the display apparatus of one embodiment of the present invention, the light-emitting elements can be used as a light source of the sensor. Thus, image capturing, touch operation detection, or the like is possible even in a dark place.

The light-emitting and light-receiving element can be manufactured by combining an organic EL element and an organic photodiode. For example, by adding an active layer of an organic photodiode to a stacked-layer structure of an organic EL element, the light-emitting and light-receiving element can be manufactured. Furthermore, in the light-emitting and light-receiving element manufactured by combining an organic EL element and an organic photodiode, concurrently depositing layers that can be shared by the organic EL element can inhibit an increase in the number of deposition steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer may be a layer shared by the light-emitting and light-receiving element and the light-emitting element.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element.

The display apparatus of this embodiment has a function of displaying an image with the use of the light-emitting elements and the light-emitting and light-receiving elements. That is, the light-emitting elements and the light-emitting and light-receiving elements function as display elements.

The display apparatus of this embodiment has a function of detecting light with the use of the light-emitting and light-receiving elements. The light-emitting and light-receiving element can detect light having a shorter wavelength than light emitted from the light-emitting and light-receiving element itself.

When the light-emitting and light-receiving elements are used as an image sensor, the display apparatus of this embodiment can capture an image using the light-emitting and light-receiving elements. When the light-emitting and light-receiving elements are used as a touch sensor, the display apparatus of this embodiment can detect touch operation of an object with the use of the light-emitting and light-receiving elements.

The light-emitting and light-receiving element functions as a photoelectric conversion element. The light-emitting and light-receiving element can be manufactured by adding an active layer of the light-receiving element to the above-described structure of the light-emitting element. For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of devices.

The display apparatus that is an example of the display apparatus of one embodiment of the present invention is specifically described below with reference to drawings.

Structure Example 1 of Display Apparatus

Structure Example 1-1

FIG. 22A is a schematic view of a display panel 200. The display panel 200 includes a substrate 201, a substrate 202, a light-receiving element 212, a light-emitting element 211R, a light-emitting element 211G, a light-emitting element 211B, a functional layer 203, and the like.

The light-emitting element 211R, the light-emitting element 211G, the light-emitting element 211B, the light-receiving element 212 are provided between the substrate 201 and the substrate 202. The light-emitting element 211R, the light-emitting element 211G, and the light-emitting element 211B emit red (R) light, green (G) light, and blue (B) light, respectively. Note that in the following description, the term "light-emitting element 211" may be used when the light-emitting element 211R, the light-emitting element 211G, and the light-emitting element 211B are not distinguished from each other.

The display panel 200 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 212. The light-receiving element 212 may be provided in all the pixels or may be provided in some of the pixels. In addition, one pixel may include a plurality of light-receiving elements 212.

FIG. 22A illustrates a finger 220 touching a surface of the substrate 202. Part of light emitted from the light-emitting element 211G is reflected at a contact portion of the substrate 202 and the finger 220. In the case where part of the reflected light is incident on the light-receiving element 212, the contact of the finger 220 with the substrate 202 can be detected. That is, the display panel 200 can function as a touch panel.

The functional layer 203 includes a circuit for driving the light-emitting element 211R, the light-emitting element 211G, and the light-emitting element 211B and a circuit for driving the light-receiving element 212. The functional layer 203 is provided with a switch, a transistor, a capacitor, a wiring, and the like. Note that in the case where the light-emitting element 211R, the light-emitting element 211G, the light-emitting element 2111B, and the light-receiving element 212 are driven by a passive-matrix method, a structure not provided with a switch, a transistor, or the like may be employed.

The display panel 200 preferably has a function of detecting a fingerprint of the finger 220. FIG. 22B schematically illustrates an enlarged view of the contact portion in a state where the finger 220 touches the substrate 202. FIG. 22B illustrates light-emitting elements 211 and the light-receiving elements 212 that are alternately arranged.

The fingerprint of the finger 220 is formed of depressed portions and projected portions. Therefore, as illustrated in FIG. 22B, the projected portions of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving elements 212 positioned directly below the contact surfaces or the non-contact surfaces is the sum of intensities of regularly reflected light and diffusely reflected light. As described above, regularly reflected light (indicated by solid arrows) is dominant near the depressed portions of the finger 220, where the finger 220 is not in contact with the substrate 202; whereas diffusely reflected light (indicated by dashed arrows) from the finger 220 is dominant near the projected portions of the finger 220, where the finger 220 is in contact with the substrate 202. Thus, the intensity of light received by the light-receiving element 212 positioned directly below the depressed portion is higher than the intensity of light received by the light-receiving element 212 positioned directly below the projected portion. Accordingly, a fingerprint image of the finger 220 can be captured.

In the case where an arrangement interval between the light-receiving elements 212 is smaller than a distance between two projected portions of a fingerprint, preferably a distance between a depressed portion and a projected portion adjacent to each other, a clear fingerprint image can be obtained. The distance between a depressed portion and a projected portion of a human's fingerprint is approximately 200 μm; thus, the arrangement interval between the light-receiving elements 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

FIG. 22C illustrates an example of a fingerprint image captured by the display panel 200. In an image-capturing range 223 in FIG. 22C, the outline of the finger 220 is indicated by a dashed line and the outline of a contact portion 221 is indicated by a dashed-dotted line. In the contact portion 221, a high-contrast image of a fingerprint 222 can be captured owing to a difference in the amount of light incident on the light-receiving elements 212.

The display panel 200 can also function as a touch panel or a pen tablet. FIG. 22D illustrates a state where a tip of a stylus 225 slides in a direction indicated with a dashed arrow while the tip of the stylus 225 touches the substrate 202.

As illustrated in FIG. 22D, when diffusely reflected light that is diffused at the contact surface of the tip of the stylus 225 and the substrate 202 is incident on the light-receiving element 212 with which the contact surface overlaps, the position of the tip of the stylus 225 can be detected with high accuracy.

FIG. 22E illustrates an example of a path 226 of the stylus 225 that is detected by the display panel 200. The display panel 200 can detect the position of a detection target, such as the stylus 225, with high position accuracy, so that high-definition drawing can be performed using a drawing application or the like. Unlike the case of using a capacitive touch sensor, an electromagnetic induction touch pen, or the like, the display panel 200 can detect even the position of a highly insulating object to be detected, the material of a tip portion of the stylus 225 is not limited, and a variety of writing materials (e.g., a brush, a glass pen, a quill pen, and the like) can be used.

Here, FIG. 22F to FIG. 22H illustrate examples of a pixel that can be used in the display panel 200.

The pixels illustrated in FIG. 22F and FIG. 22G each include the light-emitting element 211R for red (R), the light-emitting element 211G for green (G), the light-emitting element 211B for blue (B), and the light-receiving element 212. The pixels each include a pixel circuit for driving the light-emitting element 211R, the light-emitting element 211G, the light-emitting element 211B, and the light-receiving element 212.

FIG. 22F illustrates an example in which three light-emitting elements and one light-receiving element are provided in a matrix of 2×2. FIG. 22G illustrates an example in which three light-emitting elements are arranged in one line and one laterally long light-receiving element 212 is provided below the three light-emitting elements.

The pixel illustrated in FIG. 22H is an example including a light-emitting element 211W for white (W). Here, four light-emitting elements are arranged in one line and the light-receiving element 212 is provided below the four light-emitting elements.

Note that the pixel structure is not limited to the above structure, and a variety of arrangement methods can be employed.

Structure Example 1-2

An example of a structure including light-emitting elements emitting visible light, a light-emitting element emitting infrared light, and a light-receiving element is described below.

Figure 23A:
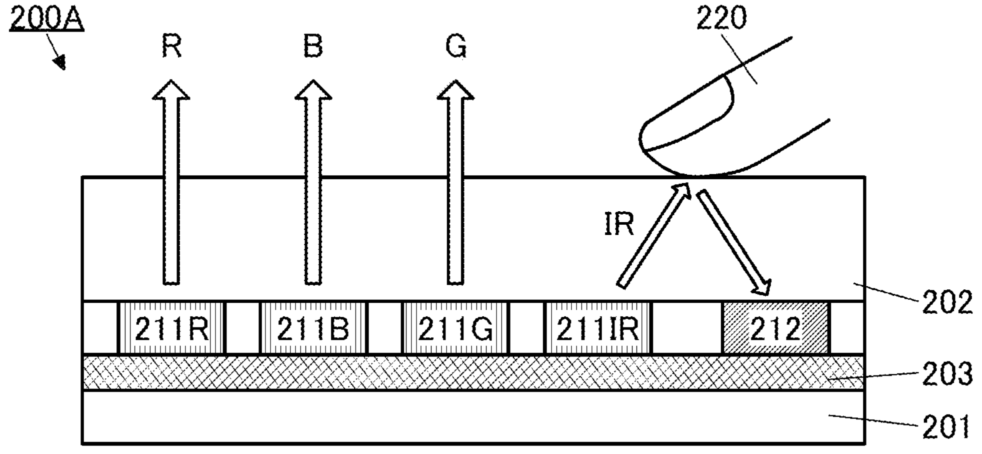
FIG. 23A is a cross-sectional view illustrating a structure example of a display apparatus.

A display panel 200A illustrated in FIG. 23A includes a light-emitting element 211IR in addition to the components illustrated in FIG. 22A as an example. The light-emitting element 211IR is a light-emitting element emitting infrared light IR. Moreover, in that case, an element capable of receiving at least the infrared light IR emitted from the light-emitting element 211IR is preferably used as the light-receiving element 212. As the light-receiving element 212, an element capable of receiving visible light and infrared light is further preferably used.

As illustrated in FIG. 23A, when the finger 220 touches the substrate 202, the infrared light IR emitted from the light-emitting element 211IR is reflected by the finger 220 and part of reflected light is incident on the light-receiving element 212, so that the positional information of the finger 220 can be obtained.

Figure 23B:
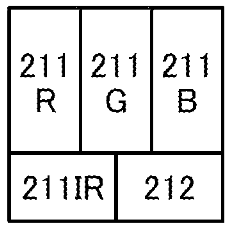
FIG. 23B to FIG. 23D are top views each illustrating an example of a pixel.
Figure 23C:
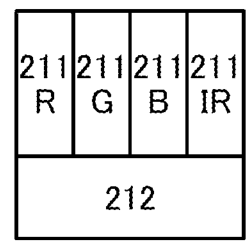
Figure 23D:
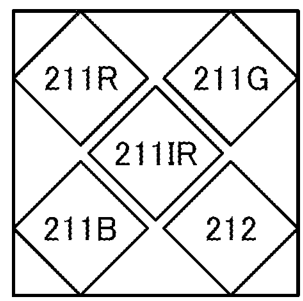

FIG. 23B to FIG. 23D illustrate examples of a pixel that can be used in the display panel 200A.

FIG. 23B illustrates an example in which three light-emitting elements are arranged in one line and the light-emitting element 211IR and the light-receiving element 212 are arranged below the three light-emitting elements in a horizontal direction. FIG. 23C illustrates an example in which four light-emitting elements including the light-emitting element 211IR are arranged in one line and the light-receiving element 212 is provided below the four light-emitting elements.

FIG. 23D illustrates an example in which three light-emitting elements and the light-receiving element 212 are arranged in all directions with the light-emitting element 211IR as the center.

Note that in the pixels illustrated in FIG. 23B to FIG. 23D, the positions of the light-emitting elements can be interchangeable, or the positions of the light-emitting element and the light-receiving element can be interchangeable.

Structure Example 1-3

An example of a structure including a light-emitting element emitting visible light and a light-emitting and light-receiving element emitting and receiving visible light is described below.

A display panel 200B illustrated in FIG. 24A includes the light-emitting element 211B, the light-emitting element 211G, and a light-emitting and light-receiving element 213R. The light-emitting and light-receiving element 213R has a function of a light-emitting element that emits red (R) light, and a function of a photoelectric conversion element that receives visible light. FIG. 24A illustrates an example in which the light-emitting and light-receiving element 213R receives green (G) light emitted from the light-emitting element 211G. Note that the light-emitting and light-receiving element 213R may receive blue (B) light emitted from the light-emitting element 211B. The light-emitting and light-receiving element 213R may receive both green light and blue light.

For example, the light-emitting and light-receiving element 213R preferably receives light having a shorter wavelength than light emitted from itself. Alternatively, the light-emitting and light-receiving element 213R may receive light (e.g., infrared light) having a longer wavelength than light emitted from itself. The light-emitting and light-receiving element 213R may receive light having approximately the same wavelength as light emitted from itself; however, in that case, the light-emitting and light-receiving element 213R also receives light emitted from itself, whereby its emission efficiency might be decreased. Therefore, the peak of the emission spectrum and the peak of the absorption spectrum of the light-emitting and light-receiving element 213R preferably overlap as little as possible.

Here, light emitted from the light-emitting and light-receiving element is not limited to red light. Furthermore, the light emitted from the light-emitting elements is not limited to the combination of green light and blue light. For example, the light-emitting and light-receiving element can be an element that emits green or blue light and receives light having a different wavelength from light emitted from itself.

The light-emitting and light-receiving element 213R serves as both a light-emitting element and a light-receiving element as described above, whereby the number of elements provided in one pixel can be reduced. Thus, higher resolution, a higher aperture ratio, higher definition, and the like can be easily achieved.

FIG. 24B to FIG. 24I illustrate examples of a pixel that can be used in the display panel 200B.

FIG. 24B illustrates an example in which the light-emitting and light-receiving element 213R, the light-emitting element 211G, and the light-emitting element 211B are arranged in one column. FIG. 24C illustrates an example in which the light-emitting element 211G and the light-emitting element 211B are alternately arranged in the vertical direction and the light-emitting and light-receiving element 213R is provided alongside the light-emitting elements.

FIG. 24D illustrates an example in which three light-emitting elements (the light-emitting element 211G, the light-emitting element 211B, and a light-emitting element 211X) and one light-emitting and light-receiving element are arranged in a matrix of 2×2. The light-emitting element 211X is an element that emits light of a color other than R, G, and B. The light of a color other than R, G, and B can be white (W) light, yellow (Y) light, cyan (C) light, magenta (M) light, infrared light (IR), ultraviolet light (UV), or the like. In the case where the light-emitting element 211X emits infrared light, the light-emitting and light-receiving element preferably has a function of detecting infrared light or a function of detecting both visible light and infrared light. The wavelength of light detected by the light-emitting and light-receiving element can be determined depending on the application of a sensor.

FIG. 24E illustrates two pixels. A region that includes three elements and is enclosed by a dotted line corresponds to one pixel. Each of the pixels includes the light-emitting element 211G, the light-emitting element 211B, and the light-emitting and light-receiving element 213R. In the left pixel in FIG. 24E, the light-emitting element 211G is provided in the same row as the light-emitting and light-receiving element 213R, and the light-emitting element 211B is provided in the same column as the light-emitting and light-receiving element 213R. In the right pixel in FIG. 24E, the light-emitting element 211G is provided in the same row as the light-emitting and light-receiving element 213R, and the light-emitting element 211B is provided in the same column as the light-emitting element 211G. In the pixel layout in FIG. 24E, the light-emitting and light-receiving element 213R, the light-emitting element 211G, and the light-emitting element 211B are repeatedly arranged in both the odd-numbered row and the even-numbered row, and in each column, the light-emitting elements or the light-emitting element and the light-emitting and the receiving elements arranged in the odd-numbered row and the even-numbered row emit light of different colors.

FIG. 24F illustrates four pixels which employ a PenTile arrangement; two adjacent pixels have different combinations of light-emitting elements or light-emitting and light-receiving elements that emit light of two different colors. FIG. 24F illustrates the top-surface shapes of the light-emitting elements or light-emitting and light-receiving elements.

The upper left pixel and the lower right pixel in FIG. 24F each include the light-emitting and light-receiving element 213R and the light-emitting element 211G. The upper right pixel and the lower left pixel each include the light-emitting element 211G and the light-emitting element 211B. That is, in the example illustrated in FIG. 24F, the light-emitting element 211G is provided in each pixel.

The top surface shape of the light-emitting elements and the light-emitting and light-receiving elements is not particularly limited and can be a circular shape, an elliptical shape, a polygonal shape, a polygonal shape with rounded corners, or the like. FIG. 24F and the like illustrate examples in which the top surface shapes of the light-emitting elements and the light-emitting and light-receiving elements are each a square tilted at approximately 450 (a diamond shape). Note that the top surface shape of the light-emitting elements and the light-emitting and light-receiving elements may vary depending on the color thereof, or the light-emitting elements and the light-emitting and light-receiving elements of some colors or every color may have the same top surface shape.

The sizes of light-emitting regions (or light-emitting and light-receiving regions) of the light-emitting elements and the light-emitting and light-receiving elements may vary depending on the color thereof, or the light-emitting elements and the light-emitting and light-receiving elements of some colors or every color may have light-emitting regions of the same size. For example, in FIG. 24F, the light-emitting region of the light-emitting element 211G provided in each pixel may have a smaller area than the light-emitting region (or the light-emitting and light-receiving region) of the other elements.

FIG. 24G is a modification example of the pixel arrangement of FIG. 24F. Specifically, the structure of FIG. 24G is obtained by rotating the structure of FIG. 24F by 45°. Although one pixel is regarded as including two elements in FIG. 24F, one pixel can be regarded as being formed of four elements as illustrated in FIG. 24G.

FIG. 24H is a modification example of the pixel arrangement of FIG. 24F. The upper left pixel and the lower right pixel in FIG. 24H each include the light-emitting and light-receiving element 213R and the light-emitting element 211G. The upper right pixel and the lower left pixel each include the light-emitting and light-receiving element 213R and the light-emitting element 2111B. That is, in the example illustrated in FIG. 24H, the light-emitting and light-receiving element 213R is provided in each pixel. The structure illustrated in FIG. 24H achieves higher-resolution image capturing than the structure illustrated in FIG. 24F because of having the light-emitting and light-receiving element 213R in each pixel. Thus, the accuracy of biometric authentication can be increased, for example.

FIG. 24I illustrates a modification example of the pixel arrangement in FIG. 24H, obtained by rotating the pixel arrangement in FIG. 24H by 45°.

In FIG. 24I, one pixel is described as being formed of four elements (two light-emitting elements and two light-emitting and light-receiving elements). One pixel including a plurality of light-emitting and light-receiving elements having a light-receiving function allows high-resolution image capturing. Accordingly, the accuracy of biometric authentication can be increased. For example, the resolution of image capturing can be the square root of 2 times the resolution of display.

A display apparatus that employs the structure illustrated in FIG. 24H or FIG. 24I includes p (p is an integer greater than or equal to 2) first light-emitting elements, q (q is an integer greater than or equal to 2) second light-emitting elements, and r (r is an integer greater than p and q) light-emitting and light-receiving elements. As for p and r, r=2p is satisfied. As for p, q, and r, r=p+q is satisfied. Either the first light-emitting elements or the second light-emitting elements emit green light, and the other light-emitting elements emit blue light. The light-emitting and light-receiving elements emit red light and have a light-receiving function.

In the case where touch operation is detected with the light-emitting and light-receiving elements, for example, it is preferable that light emitted from a light source be hard for a user to recognize. Since blue light has lower visibility than green light, light-emitting elements that emit blue light are preferably used as a light source. Accordingly, the light-emitting and light-receiving elements preferably have a function of receiving blue light. Note that without limitation to the above, light-emitting elements used as a light source can be selected as appropriate depending on the sensitivity of the light-emitting and light-receiving elements.

As described above, the display apparatus of this embodiment can employ any of various types of pixel arrangements.

At least part of this embodiment can be implemented in combination with the other embodiments described in this specification as appropriate.

Embodiment 4

In this embodiment, a light-emitting element (also referred to as a light-emitting device) and a light-receiving element (also referred to as a light-receiving device) that can be used in a light-emitting and light-receiving apparatus of one embodiment of the present invention will be described.

In this specification and the like, a device manufactured using a metal mask or an FMM (a fine metal mask, a high-resolution metal mask) may be referred to as a device having an MM (a metal mask) structure. In this specification and the like, a device manufactured without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device having a single structure includes one light-emitting unit between a pair of electrodes, and the light-emitting unit preferably includes one or more light-emitting layers. To obtain white light emission with the single structure, two or more light-emitting layers are selected such that emission of the light-emitting layers can produce an achromatic color. For example, in the case of two colors, when the emission color of a first light-emitting layer and the emission color of a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission in the tandem structure, the structure is made so that light from light-emitting layers of the plurality of light-emitting units can be combined to be white light. Note that a combination of emission colors for obtaining white light emission is similar to that in the case of a single structure. In the device having a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

[Device Structure]

Next, detailed structures of the light-emitting element, the light-receiving element, and the light-emitting and light-receiving element which can be used in the display apparatus of one embodiment of the present invention will be described.

The display apparatus of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

In this embodiment, a top-emission display apparatus is described as an example.

In this specification and the like, unless otherwise specified, in describing a structure including a plurality of components (e.g., light-emitting elements or light-emitting layers), alphabets are omitted when a common part of the components is described. For example, the term "light-emitting layer 383" is sometimes used to describe a common part of a light-emitting layer 383R, a light-emitting layer 383G, and the like.

Figure 25A:
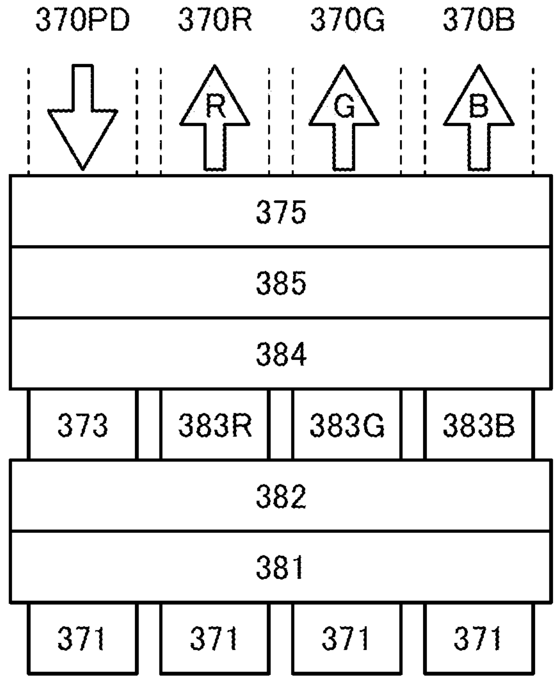
FIG. 25A and FIG. 25B are diagrams each illustrating a structure example of a display apparatus.

A display apparatus 380A illustrated in FIG. 25A includes a light-receiving element 370PD, a light-emitting element 370R that emits red (R) light, a light-emitting element 370G that emits green (G) light, and a light-emitting element 370B that emits blue (B) light.

Each of the light-emitting elements includes a pixel electrode 371, a hole-injection layer 381, a hole-transport layer 382, a light-emitting layer, an electron-transport layer 384, an electron-injection layer 385, and a common electrode 375 that are stacked in this order. The light-emitting element 370R includes the light-emitting layer 383R, the light-emitting element 370G includes the light-emitting layer 383G, and the light-emitting element 370B includes a light-emitting layer 383B. The light-emitting layer 383R contains a light-emitting substance that emits red light, the light-emitting layer 383G contains a light-emitting substance that emits green light, and the light-emitting layer 383B contains a light-emitting substance that emits blue light.

The light-emitting elements are electroluminescent elements that emit light to the common electrode 375 side by voltage application between the pixel electrode 371 and the common electrode 375.

The light-receiving element 370PD includes the pixel electrode 371, the hole-injection layer 381, the hole-transport layer 382, an active layer 373, the electron-transport layer 384, the electron-injection layer 385, and the common electrode 375 that are stacked in this order.

The light-receiving element 370PD is a photoelectric conversion element that receives light entering from the outside of the display apparatus 380A and converts it into an electric signal.

This embodiment is described assuming that the pixel electrode 371 functions as an anode and the common electrode 375 functions as a cathode in both of the light-emitting element and the light-receiving element. In other words, the light-receiving element is driven by application of reverse bias between the pixel electrode 371 and the common electrode 375, whereby light incident on the light-receiving element can be detected and charge can be generated and extracted as current.

In the display apparatus of this embodiment, an organic compound is used for the active layer 373 of the light-receiving element 370PD. The light-receiving element 370PD can share the layers other than the active layer 373 with the light-emitting elements. Therefore, the light-receiving element 370PD can be formed concurrently with the formation of the light-emitting elements only by adding a step of depositing the active layer 373 in the formation step of the light-emitting elements. The light-emitting elements and the light-receiving element 370PD can be formed over one substrate. Accordingly, the light-receiving element 370PD can be incorporated into the display apparatus without a significant increase in the number of manufacturing steps.

The display apparatus 380A is an example in which the light-receiving element 370PD and the light-emitting elements have a common structure except that the active layer 373 of the light-receiving element 370PD and the light-emitting layers 383 of the light-emitting elements are separately formed. Note that the structures of the light-receiving element 370PD and the light-emitting elements are not limited thereto. The light-receiving element 370PD and the light-emitting elements may include separately formed layers in addition to the active layer 373 and the light-emitting layers 383. The light-receiving element 370PD and the light-emitting elements preferably include at least one layer used in common (common layer). Thus, the light-receiving element 370PD can be incorporated into the display apparatus without a significant increase in the number of manufacturing steps.

A conductive film that transmits visible light is used as the electrode through which light is extracted, which is either the pixel electrode 371 or the common electrode 375. A conductive film that reflects visible light is preferably used as the electrode through which light is not extracted.

The light-emitting elements included in the display apparatus of this embodiment preferably employ a micro-optical resonator (microcavity) structure. Therefore, one of the pair of electrodes of the light-emitting element is preferably an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between the electrodes, whereby light emitted from the light-emitting element can be intensified.

Note that the transflective electrode can have a stacked-layer structure of a reflective electrode and an electrode having a property of transmitting visible light (also referred to as a transparent electrode).

The light transmittance of the transparent electrode is greater than or equal to 40%. For example, an electrode having a visible light (light with a wavelength greater than or equal to 400 nm and less than 750 nm) transmittance higher than or equal to 40% is preferably used in the light-emitting elements. The transflective electrode has a visible light reflectance higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity less than or equal to $1\times10^{-2}$ Ωcm. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 383. In addition to the light-emitting layer 383, the light-emitting element may further include a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer that injects holes from an anode to the hole-transport layer and contains a material with a high hole-injection property. As the material with a high hole-injection property, an aromatic amine compound or a composite material containing a hole-transport material and an acceptor material (an electron-accepting material) can be used.

In the light-emitting elements, the hole-transport layer is a layer that transports holes, which are injected from the anode by the hole-injection layer, to the light-emitting layer. In the light-receiving element, the hole-transport layer is a layer that transports holes, which are generated in the active layer on the basis of incident light, to the anode. The hole-transport layer is a layer that contains a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer that transports electrons, which are injected from the cathode by the electron-injection layer, to the light-emitting layer. In the light-receiving element, the electron-transport layer is a layer that transports electrons, which are generated in the active layer on the basis of incident light, to the cathode. The electron-transport layer is a layer that contains an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 383 is a layer that contains a light-emitting substance. The light-emitting layer 383 can contain one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 383 may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer 383 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In a combination of materials for forming an exciplex, the HOMO level (the highest occupied molecular orbital level) of the hole-transport material is preferably higher than or equal to the HOMO level of the electron-transport material. The LUMO level (the lowest unoccupied molecular orbital level) of the hole-transport material is preferably higher than or equal to the LUMO level of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 373 includes a semiconductor. Examples of the semiconductor include an inorganic semiconductor such as silicon and an organic semiconductor including an organic compound. This embodiment illustrates an example in which an organic semiconductor is used as the semiconductor included in the active layer 373. An organic semiconductor is preferably used, in which case the light-emitting layer 383 and the active layer 373 can be formed by the same method (e.g., a vacuum evaporation method) and thus the same manufacturing apparatus can be used.

Examples of an n-type semiconductor material contained in the active layer 373 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, since fullerene has a spherical shape, fullerene has a high electron-accepting property even when π-electron conjugation widely spreads. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-$C_{71}$-butyric acid methyl ester (abbreviation: $PC_{70}BM$), [6,6]-Phenyl-$C_{61}$-butyric acid methyl ester (abbreviation: $PC_{60}BM$), and 1',1",4',4"-Tetrahydro-di[1,4]methanonaphthaleno[1,2:2',3',56,60:2",3" ][5,6]fullerene-$C_{60}$ (abbreviation: ICBA).

Another example of an n-type semiconductor material includes a perylenetetracarboxylic derivative such as N,N'-dimethyl-3,4,9,10-perylenetetracarboxylic diimide (abbreviation: Me-PTCDI).

Another example of an n-type semiconductor material includes 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 373 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 373 is preferably formed by co-evaporation of an n-type semiconductor and a p-type semiconductor. Alternatively, the active layer 373 may be formed by stacking an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer 373, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

Figure 25B:
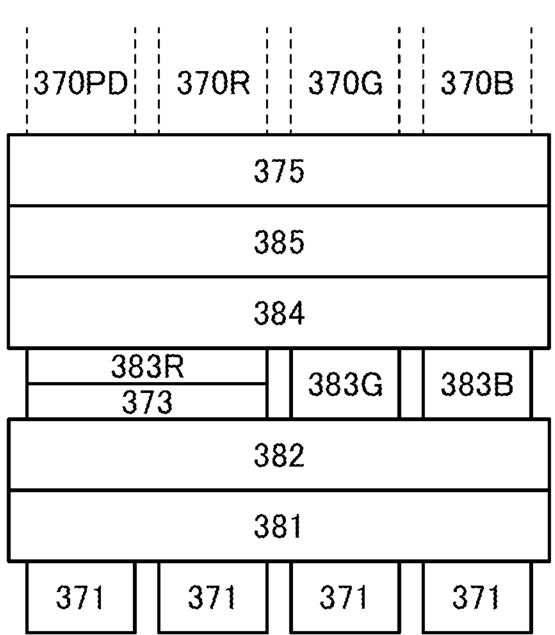

A display apparatus 380B illustrated in FIG. 25B is different from the display apparatus 380A in that the light-receiving element 370PD and the light-emitting element 370R have the same structure.

The light-receiving element 370PD and the light-emitting element 370R share the active layer 373 and the light-emitting layer 383R.

Here, it is preferable that the light-receiving element 370PD have the same structure as the light-emitting element that emits light with a wavelength longer than that of the light desired to be detected. For example, the light-receiving element 370PD having a structure in which blue light is detected can have a structure which is similar to that of one or both of the light-emitting element 370R and the light-emitting element 370G. For example, the light-receiving element 370PD having a structure in which green light is detected can have a structure similar to that of the light-emitting element 370R.

When the light-receiving element 370PD and the light-emitting element 370R have a common structure, the number of deposition steps and the number of masks can be smaller than those for the structure in which the light-receiving element 370PD and the light-emitting element 370R include separately formed layers. As a result, the number of manufacturing steps and the manufacturing cost of the display apparatus can be reduced.

When the light-receiving element 370PD and the light-emitting element 370R have a common structure, a margin for misalignment can be narrower than that for the structure in which the light-receiving element 370PD and the light-emitting element 370R include separately formed layers. Accordingly, the aperture ratio of a pixel can be increased, so that the light extraction efficiency of the display apparatus can be increased. This can extend the life of the light-emitting element. Furthermore, the display apparatus can exhibit a high luminance. Moreover, the resolution of the display apparatus can also be increased.

The light-emitting layer 383R contains a light-emitting material that emits red light. The active layer 373 contains an organic compound that absorbs light with a wavelength shorter than that of red light (e.g., one or both of green light and blue light). The active layer 373 preferably contains an organic compound that does not easily absorb red light and that absorbs light with a wavelength shorter than that of red light. In that case, red light can be efficiently extracted from the light-emitting element 370R, and the light-receiving element 370PD can detect light with a wavelength shorter than that of red light with high accuracy.

Although the light-emitting element 370R and the light-receiving element 370PD have the same structure in an example of the display apparatus 380B, the light-emitting element 370R and the light-receiving element 370PD may include optical adjustment layers with different thicknesses.

A display apparatus 380C illustrated in FIG. 26A and FIG. 26B includes a light-emitting and light-receiving element 370SR that emits red (R) light and has a light-receiving function, the light-emitting element 370G, and the light-emitting element 370B. The above description of the display apparatus 380A and the like can be referred to for the structures of the light-emitting element 370G and the light-emitting element 370B.

The light-emitting and light-receiving element 370SR includes the pixel electrode 371, the hole-injection layer 381, the hole-transport layer 382, the active layer 373, the light-emitting layer 383R, the electron-transport layer 384, the electron-injection layer 385, and the common electrode 375 which are stacked in this order. The light-emitting and light-receiving element 370SR has the same structure as the light-emitting element 370R and the light-receiving element 370PD illustrated in the display apparatus 380B.

FIG. 26A illustrates the case where the light-emitting and light-receiving element 370SR functions as a light-emitting element. FIG. 26A illustrates an example in which the light-emitting element 370B emits blue light, the light-emitting element 370G emits green light, and the light-emitting and light-receiving element 370SR emits red light.

FIG. 26B illustrates the case where the light-emitting and light-receiving element 370SR functions as a light-receiving element. FIG. 26B illustrates an example in which the light-emitting and light-receiving element 370SR receives blue light emitted from the light-emitting element 370B and green light emitted from the light-emitting element 370G.

The light-emitting element 370B, the light-emitting element 370G, and the light-emitting and light-receiving element 370SR each include the pixel electrode 371 and the common electrode 375. In this embodiment, the case where the pixel electrode 371 functions as an anode and the common electrode 375 functions as a cathode is described as an example. The light-emitting and light-receiving element 370SR is driven by application of reverse bias between the pixel electrode 371 and the common electrode 375, whereby light incident on the light-emitting and light-receiving element 370SR can be detected and charge can be generated and extracted as current.

It can be said that the light-emitting and light-receiving element 370SR has a structure in which the active layer 373 is added to the light-emitting element. That is, the light-emitting and light-receiving element 370SR can be formed concurrently with the light-emitting elements only by adding a step of depositing the active layer 373 in the formation step of the light-emitting element. The light-emitting element and the light-emitting and light-receiving element can be formed over one substrate. Thus, the display portion can be provided with one or both of an image capturing function and a sensing function without a significant increase in the number of manufacturing steps.

The stacking order of the light-emitting layer 383R and the active layer 373 is not limited. FIG. 26A and FIG. 26B each illustrate an example in which the active layer 373 is provided over the hole-transport layer 382 and the light-emitting layer 383R is provided over the active layer 373. The stacking order of the light-emitting layer 383R and the active layer 373 may be reversed.

The light-emitting and light-receiving element may exclude at least one layer of the hole-injection layer 381, the hole-transport layer 382, the electron-transport layer 384, and the electron-injection layer 385. Furthermore, the light-emitting and light-receiving element may include another functional layer such as a hole-blocking layer or an electron-blocking layer.

In the light-emitting and light-receiving element, a conductive film that transmits visible light is used as the electrode through which light is extracted. A conductive film that reflects visible light is preferably used as the electrode through which light is not extracted.

The functions and materials of the layers constituting the light-emitting and light-receiving element are similar to those of the layers constituting the light-emitting elements and the light-receiving element and are not described in detail.

FIG. 26C to FIG. 26G illustrate examples of stacked-layer structures of light-emitting and light-receiving elements.

The light-emitting and light-receiving element illustrated in FIG. 26C includes a first electrode 377, the hole-injection layer 381, the hole-transport layer 382, the light-emitting layer 383R, the active layer 373, the electron-transport layer 384, the electron-injection layer 385, and a second electrode 378.

FIG. 26C illustrates an example in which the light-emitting layer 383R is provided over the hole-transport layer 382 and the active layer 373 is stacked over the light-emitting layer 383R.

As illustrated in FIG. 26A to FIG. 26C, the active layer 373 and the light-emitting layer 383R may be in contact with each other.

A buffer layer is preferably provided between the active layer 373 and the light-emitting layer 383R. In that case, the buffer layer preferably has a hole-transport property and an electron-transport property. For example, a substance with a bipolar property is preferably used for the buffer layer. Alternatively, as the buffer layer, at least one layer of a hole-injection layer, a hole-transport layer, an electron-transport layer, an electron-injection layer, a hole-blocking layer, an electron-blocking layer, and the like can be used. FIG. 26D illustrates an example in which the hole-transport layer 382 is used as the buffer layer.

The buffer layer provided between the active layer 373 and the light-emitting layer 383R can inhibit transfer of excitation energy from the light-emitting layer 383R to the active layer 373. Furthermore, the optical path length (cavity length) of the microcavity structure can be adjusted with the buffer layer. Thus, high emission efficiency can be obtained from the light-emitting and light-receiving element including the buffer layer between the active layer 373 and the light-emitting layer 383R.

FIG. 26E illustrates an example of a stacked-layer structure in which a hole-transport layer 382-1, the active layer 373, a hole-transport layer 382-2, and the light-emitting layer 383R are stacked in this order over the hole-injection layer 381. The hole-transport layer 382-2 functions as a buffer layer. The hole-transport layer 382-1 and the hole-transport layer 381-2 may contain the same material or different materials. Instead of the hole-transport layer 381-2, any of the above layers that can be used as the buffer layer may be used. The positions of the active layer 373 and the light-emitting layer 383R may be interchanged.

The light-emitting and light-receiving element illustrated in FIG. 26F is different from the light-emitting and light-receiving element illustrated in FIG. 26A in that the hole-transport layer 382 is not included. In this manner, the light-emitting and light-receiving element may exclude at least one of the hole-injection layer 381, the hole-transport layer 382, the electron-transport layer 384, and the electron-injection layer 385. The light-emitting and light-receiving element may include another functional layer such as a hole-blocking layer or an electron-blocking layer.

The light-emitting and light-receiving element illustrated in FIG. 26G is different from the light-emitting and light-receiving element illustrated in FIG. 26A in including a layer 389 serving as both a light-emitting layer and an active layer instead of including the active layer 373 and the light-emitting layer 383R.

As the layer serving as both a light-emitting layer and an active layer, it is possible to use, for example, a layer containing three materials which are an n-type semiconductor that can be used for the active layer 373, a p-type semiconductor that can be used for the active layer 373, and a light-emitting substance that can be used for the light-emitting layer 383R.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

Embodiment 5

In this embodiment, an example of a display apparatus including a light-receiving device and the like of one embodiment of the present invention will be described.

In the display apparatus of this embodiment, a pixel can include a plurality of types of subpixels including light-emitting devices that emit light of different colors. For example, the pixel can include three types of subpixels. The three subpixels can be of three colors of red (R), green (G), and blue (B) or of three colors of yellow (Y), cyan (C), and magenta (M), for example. Alternatively, the pixel can include four types of subpixels. The four subpixels can be of four colors of R, G, B, and white (W) or of four colors of R, G, B, and Y, for example.

There is no particular limitation on the arrangement of subpixels, and a variety of methods can be employed. Examples of the arrangement of subpixels include a stripe arrangement, an S-stripe arrangement, a matrix arrangement, a delta arrangement, a Bayer arrangement, and a PenTile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

In the display apparatus including light-emitting devices and a light-receiving device in each pixel, the pixel has a light-receiving function; thus, the display apparatus can detect a contact or approach of an object while displaying an image. For example, an image can be displayed by using all the subpixels included in the display apparatus; or light can be emitted by some of the subpixels as a light source and an image can be displayed by using the other subpixels.

Figure 27A:
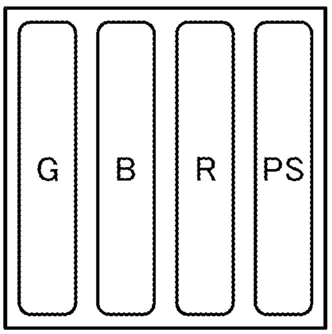
FIG. 27A to FIG. 27F are diagrams each illustrating an example of a pixel.
Figure 27B:
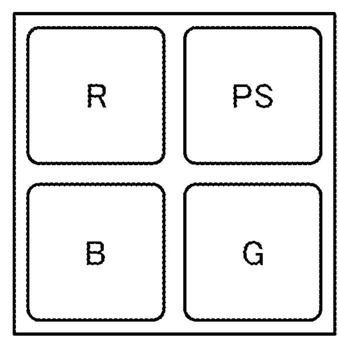
Figure 27C:
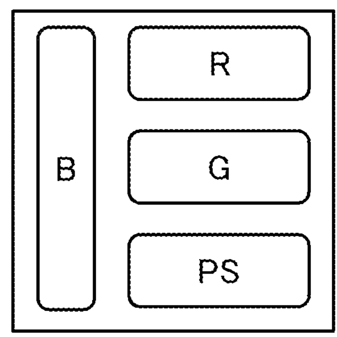

Pixels illustrated in FIG. 27A, FIG. 27B, and FIG. 27C each include a subpixel G, a subpixel B, a subpixel R, and a subpixel PS.

The pixel illustrated in FIG. 27A employs an S-stripe arrangement. The pixel illustrated in FIG. 27B employs a matrix arrangement.

In the pixel illustrated in FIG. 27C, three subpixels (the subpixel R, the subpixel G, and the subpixel S) are vertically arranged next to one subpixel (the subpixel B).

Figure 27D:
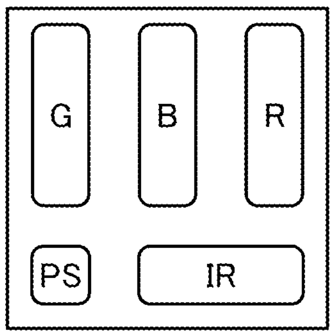
Figure 27E:
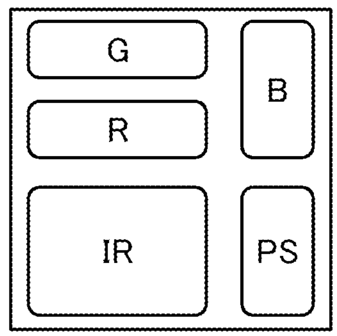
Figure 27F:
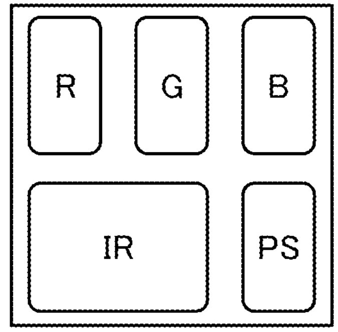

Pixels illustrated in FIG. 27D, FIG. 27E, and FIG. 27F each include the subpixel G, the subpixel B, the subpixel R, a subpixel IR, and the subpixel PS.

FIG. 27D, FIG. 27E, and FIG. 27F illustrate examples in which one pixel is provided in two rows. Three subpixels (the subpixel G, the subpixel B, and the subpixel R) are provided in the upper row (first row), and two subpixels (one subpixel PS and one subpixel IR) are provided in the lower row (second row).

In FIG. 27D, the three vertically oriented subpixel G, subpixel B, and subpixel R are arranged laterally, and the subpixel PS and the horizontally oriented subpixel IR are arranged laterally below the three subpixels. In FIG. 27E, the two horizontally oriented subpixel G and subpixel R are arranged in the vertical direction; the vertically oriented subpixel B is arranged laterally next to the subpixels G and R; and the horizontally oriented subpixel IR and the vertically oriented subpixel PS are arranged laterally below the subpixels R, G, and B. In FIG. 27F, the three vertically oriented subpixel R, subpixel G, and subpixel B are arranged laterally, and the horizontally oriented subpixel IR and the vertically oriented subpixel PS are arranged laterally below the subpixels R, G, and B. In FIG. 27E and FIG. 27F, the area of the subpixel IR is the largest, and the area of the subpixel PS is substantially the same as that of the subpixel and the like.

Note that the layout of the subpixels is not limited to those illustrated in FIG. 27A to FIG. 27F.

The subpixel R includes a light-emitting device that emits red light. The subpixel G includes a light-emitting device that emits green light. The subpixel B includes a light-emitting device that emits blue light. The subpixel IR includes a light-emitting device that emits infrared light. The subpixel PS includes a light-receiving device. Although there is no particular limitation on the wavelength of light that the subpixel PS detects, the light-receiving device included in the subpixel PS preferably has sensitivity to light emitted from the light-emitting device included in the subpixel R, the subpixel G, the subpixel B, or the subpixel TR. The light-receiving device preferably detects one or more of light in blue, violet, bluish violet, green, yellow green, yellow, orange, red, and infrared wavelength ranges, for example.

The light-receiving area of the subpixel PS is smaller than the light-emitting area of each of the other subpixels. A smaller light-receiving area leads to a narrower image-capturing range, inhibits a blur in a captured image, and improves the definition. Thus, by using the subpixel PS, high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless sensor, or a touchless sensor), or the like. For example, the subpixel PS preferably detects infrared light. Thus, touch detection is possible even in a dark place.

Here, the touch sensor or the near touch sensor can detect an approach or contact of an object (e.g., a finger, a hand, or a pen). The touch sensor can detect an object when the display apparatus and the object come in direct contact with each other. The near touch sensor can detect an object even when the object is not in contact with the display apparatus. For example, the display apparatus can preferably detect an object when the distance between the display apparatus and the object is more than or equal to 0.1 mm and less than or equal to 300 mm, preferably more than or equal to 3 mm and less than or equal to 50 mm. With this structure, the display apparatus can be controlled without an object directly contacting with the display apparatus. In other words, the display apparatus can be controlled in a contactless (touchless) manner. With the above structure, the display apparatus can have a reduced risk of being dirty or damaged, or can be operated without the object directly touching a dirt (e.g., dust or a virus) attached to the display apparatus.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS is provided in some of the pixels in the display apparatus. When the number of subpixels PS included in the display apparatus is smaller than the number of subpixels R, for example, higher detection speed can be achieved.

Figure 27G:
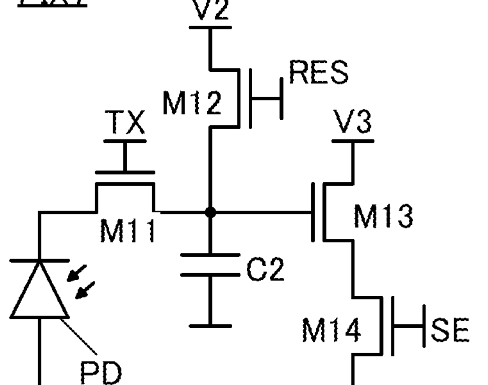
FIG. 27G and FIG. 27H are diagrams each showing an example of a circuit diagram of a pixel.
Figure 27H:
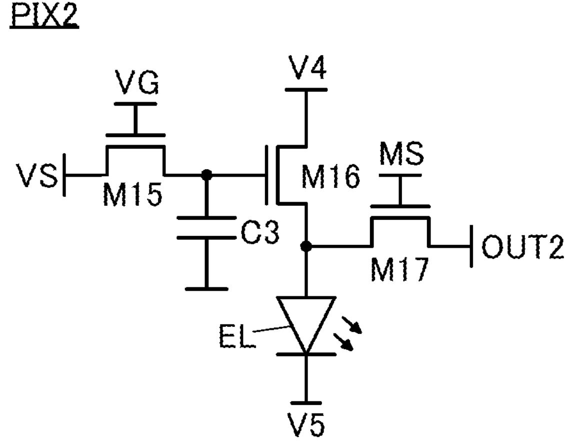

FIG. 27G illustrates an example of a pixel circuit for a subpixel including a light-receiving device. FIG. 27H illustrates an example of a pixel circuit for a subpixel including a light-emitting device.

A pixel circuit PIX1 illustrated in FIG. 27G includes a light-receiving device PD, a transistor M11, a transistor M12, a transistor M13, a transistor M14, and a capacitor C2. Here, a photodiode is used as an example of the light-receiving device PD.

An anode of the light-receiving device PD is electrically connected to a wiring V1, and a cathode of the light-receiving device PD is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the light-receiving device PD is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving device PD. The transistor M13 functions as an amplifier transistor for performing output corresponding to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 27H includes a light-emitting device EL, a transistor M15, a transistor M16, a transistor M17, and a capacitor C3. Here, a light-emitting diode is used as an example of the light-emitting device EL. In particular, an organic EL element is preferably used as the light-emitting device EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting device EL and one of a source and a drain of the transistor M17. A gate of the transistor M17 is electrically connected to a wiring MS, and the other of the source and the drain of the transistor M17 is electrically connected to a wiring OUT2. A cathode of the light-emitting device EL is electrically connected to a wiring V5.

A constant potential is supplied to the wiring V4 and the wiring V5. The anode of the light-emitting device EL can be set to a high potential, and the cathode can be set to a lower potential than the anode. The transistor M15 is controlled by a signal supplied to the wiring VG and functions as a selection transistor for controlling a selection state of the pixel circuit PIX2. The transistor M16 functions as a driving transistor that controls current flowing through the light-emitting device EL in accordance with a potential supplied to the gate of the transistor M16. When the transistor M15 is on, a potential supplied to the wiring VS is supplied to the gate of the transistor M16, and the luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Here, transistors in which a metal oxide (an oxide semiconductor) is used in a semiconductor layer where a channel is formed are preferably used as the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon achieves an extremely low off-state current. Therefore, owing to the low off-state current, charge accumulated in a capacitor that is connected in series to the transistor can be retained for a long time. Hence, it is particularly preferable to use transistors containing an oxide semiconductor as the transistor M11, the transistor M12, and the transistor M15 each of which is connected in series with the capacitor C2 or the capacitor C3. Moreover, the use of transistors using an oxide semiconductor as the other transistors can reduce the manufacturing cost.

For example, the off-state current per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

Alternatively, transistors using silicon as a semiconductor in which a channel is formed can be used as the transistor M11 to the transistor M17. It is particularly preferable to use silicon with high crystallinity, such as single crystal silicon or polycrystalline silicon, because high field-effect mobility can be achieved and higher-speed operation can be performed.

Alternatively, a transistor containing an oxide semiconductor may be used as at least one of the transistor M11 to the transistor M17, and transistors containing silicon may be used as the other transistors.

Although n-channel transistors are illustrated in FIG. 27G and FIG. 27H, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a high-resolution light-receiving portion or display portion can be achieved.

To increase the luminance of the light-emitting device EL included in the pixel circuit, the amount of current fed through the light-emitting device EL needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Accordingly, when an OS transistor is used as the driving transistor in the pixel circuit, the amount of current flowing through the light-emitting device can be increased, so that the luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor in the pixel circuit, current flowing between the source and the drain can be set minutely by a change in gate-source voltage; hence, the amount of current flowing through the light-emitting device can be controlled. Consequently, the number of gray levels expressed by the pixel circuit can be increased.

Regarding saturation characteristics of current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, stable current can be fed through light-emitting devices that contain an EL material even when the current-voltage characteristics of the light-emitting devices vary, for example. In other words, when the OS transistor operates in the saturation region, the source-drain current hardly changes with an increase in the source-drain voltage; hence, the luminance of the light-emitting device can be stable.

As described above, by using an OS transistor as the driving transistor included in the pixel circuit, it is possible to achieve "inhibition of black floating", "increase in emission luminance", "increase in gray level", "inhibition of variation in light-emitting devices", and the like.

The refresh rate can be variable in the display apparatus of one embodiment of the present invention. For example, the refresh rate can be adjusted in accordance with the contents displayed on the display apparatus (e.g., adjusted in the range from 0.01 Hz to 240 Hz inclusive), whereby power consumption can be reduced. The driving with a lowered refresh rate for reducing power consumption of a display apparatus may be referred to as idling stop (IDS) driving.

The driving frequency of the touch sensor or the near touch sensor may be changed in accordance with the refresh rate. For example, when the refresh rate of the display apparatus is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

At least part of this embodiment can be implemented in combination with the other embodiments described in this specification as appropriate.

Embodiment 6

In this embodiment, a high-resolution display apparatus is described.

Structure Example of Display Panel

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display apparatus may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves sense of reality.

Figures 28A, 28B, 28C, 28D, 28E, 28F, 28G, 28H, 28I, 28J:
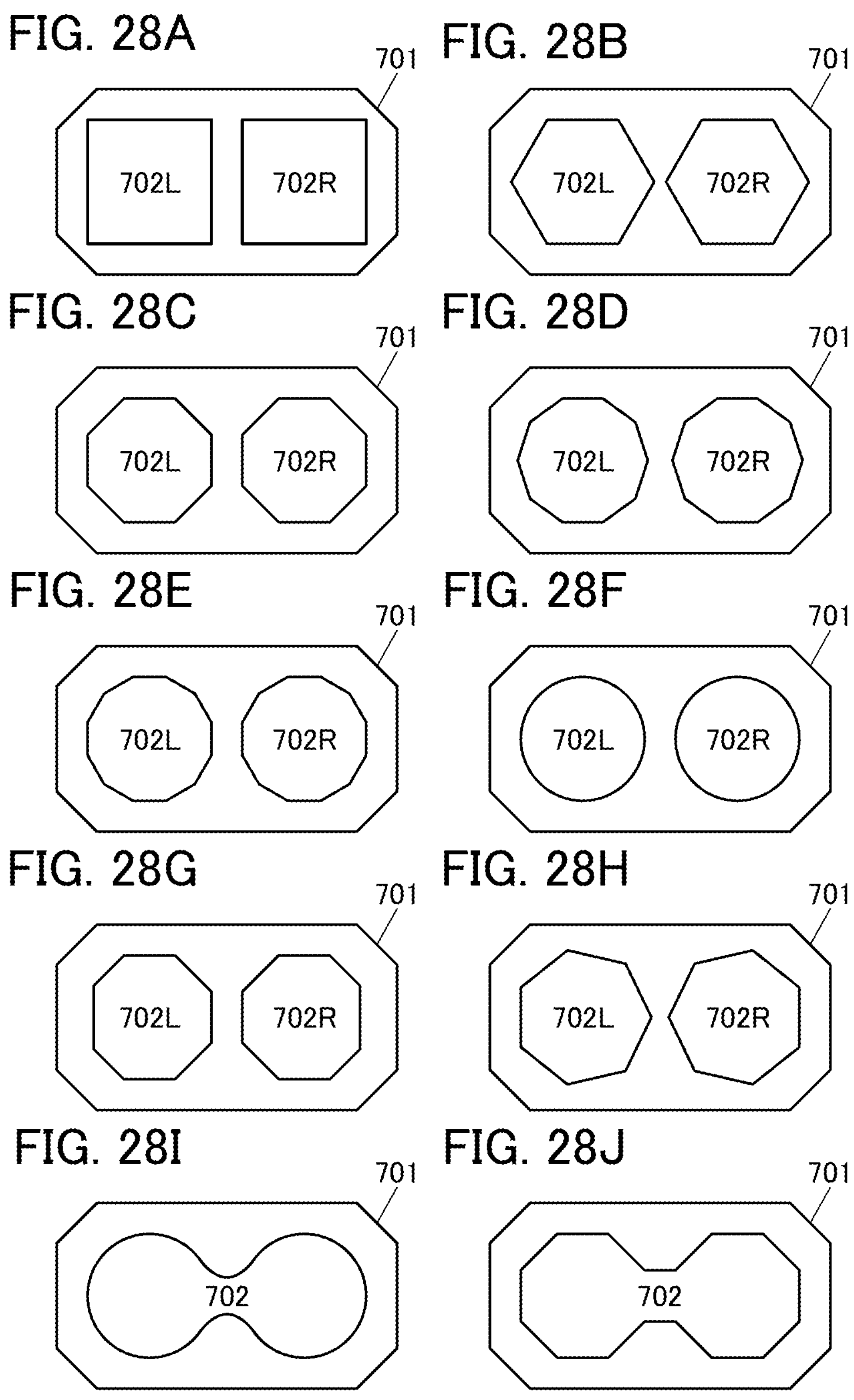
FIG. 28A to FIG. 28J are diagrams each illustrating a structure example of a display apparatus.

FIG. 28A illustrates a structure example of a display panel. In FIG. 28A, a display portion 702L for the left eye and a display portion 702R for the right eye are provided inward from a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 28A have a square top surface shape.

The top surface shapes of the display portion 702L and the display portion 702R may be other regular polygons. FIG. 28B illustrates an example in which the top surface shape is a regular hexagon; FIG. 28C illustrates an example in which the top surface shape is a regular octagon; FIG. 28D illustrates an example in which the top surface shape is a regular decagon; and FIG. 28E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a linear portion of the outline of the display portion is not strictly a straight line and can be partly a stair-like portion. In particular, a linear portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

FIG. 28F illustrates an example in which the top surface shapes of the display portion 702L and the display portion 702R are circular.

The top surface shapes of the display portion 702L and the display portion 702R may be bilaterally asymmetrical. Moreover, the top surface shapes may not necessarily be regular polygonal.

FIG. 28G illustrates an example in which the top surface shapes of the display portion 702L and the display portion 702R are bilaterally asymmetric octagonal. FIG. 28H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

FIG. 28I illustrates an example in which the two circular display portions 702 in FIG. 28F are connected. FIG. 28J illustrates an example in which the two regular octagonal display portions 702 in FIG. 28C are connected.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 7

In this embodiment, a metal oxide (also referred to as an oxide semiconductor) that can be used in the OS transistor described in the above embodiment is described.

The metal oxide used in the OS transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more kinds selected from gallium, aluminum, yttrium, and tin, and further preferably M is gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide deposited at room temperature is in an intermediate state, which is neither a single crystal nor polycrystal nor an amorphous state, and it cannot be concluded that In—Ga—Zn oxide film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductors include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor having a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of flexibility of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof and these regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used for a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

On the other hand, the second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using the CAC-OS has high reliability. Thus, the CAC-OS is the most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 8

In this embodiment, electronic devices of embodiments of the present invention will be described with reference to FIG. 29 to FIG. 32.

An electronic device in this embodiment includes the display apparatus of one embodiment of the present invention. In the display apparatus of one embodiment of the present invention, increases in resolution, definition, and sizes are easily achieved. Thus, the display apparatus of one embodiment of the present invention can be used for a display portion of a variety of electronic devices.

The display apparatus of one embodiment of the present invention can be manufactured at low cost, which leads to a reduction in the manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor of a computer or the like, digital signage, and a large game machine such as a pachinko machine.

In particular, the display apparatus of one embodiment of the present invention can have a high resolution, and thus can be suitably used for an electronic device including a relatively small display portion. Examples of such an electronic devices include information terminals (wearable devices) such as watch-type and bracelet-type information terminals and wearable devices capable of being worn on the head, such as a VR device like a head-mounted display and a glasses-type AR device. Examples of wearable devices include an SR (Substitutional Reality) device and an MR (Mixed Reality) device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display apparatus with such high definition or high resolution, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, and the like on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 29A:
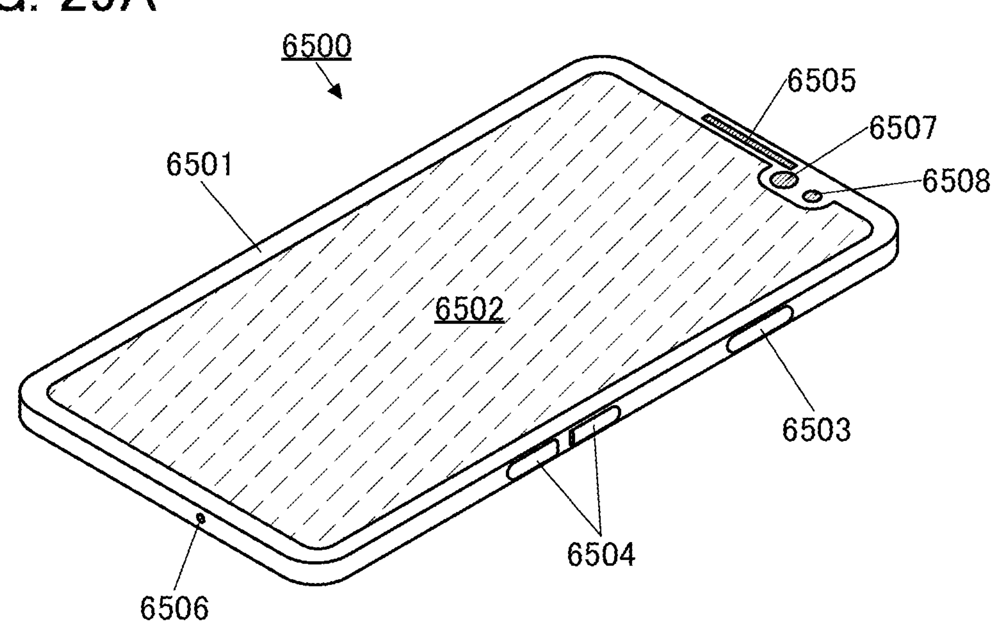
FIG. 29A and FIG. 29B are diagrams illustrating an example of an electronic device.

An electronic device 6500 illustrated in FIG. 29A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 29B:
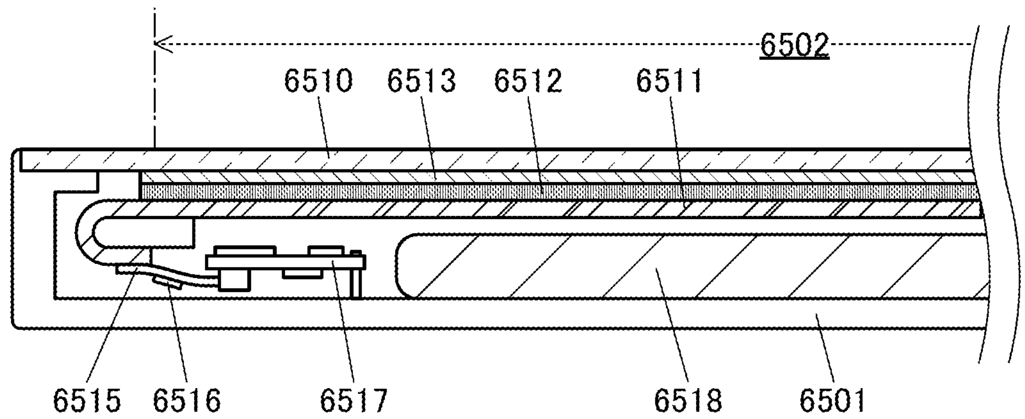

FIG. 29B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display apparatus having flexibility) of one embodiment of the present invention can be used for the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

FIG. 30A illustrates an example of a television device. In a television device 7100, a display portion 7000 is incorporated in a housing 7101. Here, a structure in which the housing 7101 is supported by a stand 7103 is illustrated.

The display apparatus of one embodiment of the present invention can be used for the display portion 7000.

Operation of the television device 7100 illustrated in FIG. 30A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 30B illustrates an example of a notebook personal computer. A notebook personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used in the display portion 7000.

FIG. 30C and FIG. 30D illustrate examples of digital signage.

Digital signage 7300 illustrated in FIG. 30C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 30D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 30C and FIG. 30D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 30C and FIG. 30D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 31A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing 8001 may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display apparatus of one embodiment of the present invention can be used for the display portion 8002 of the camera 8000 and the display portion 8102 of the finder 8100. Note that a finder may be incorporated in the camera 8000.

FIG. 31B is a diagram illustrating the appearance of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display apparatus of one embodiment of the present invention can be used in the display portion 8204.

FIG. 31C to FIG. 31E are diagrams illustrating the appearance of a head-mounted display 8300. The head-mounted display 8300 includes a housing 8301, a display portion 8302, a fixing band 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is perceived through the lenses 8305, three-dimensional display using parallax, or the like can also be performed. Note that the number of display portions 8302 provided is not limited to one; two display portions 8302 may be provided so that one display portion is provided for one eye of the user.

The display apparatus of one embodiment of the present invention can be used for the display portion 8302. The display apparatus of one embodiment of the present invention can achieve extremely high resolution. For example, a pixel is not easily perceived by the user even when the user perceives display that is magnified by the use of the lenses 8305 as illustrated in FIG. 31E. In other words, a video with a strong sense of reality can be perceived by the user with the use of the display portion 8302.

FIG. 31F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401.

The pair of display portions 8404 may display different images, whereby three-dimensional display using parallax can be performed.

A user can perceive display on the display portion 8404 through the lenses 8405. The lens 8405 has a focus adjustment mechanism and can adjust the position according to the user's eyesight. The display portion 8404 is preferably a square or a horizontal rectangle. Accordingly, realistic sensation can be increased.

The mounting portion 8402 preferably has plasticity and elasticity to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 32A to FIG. 32F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 32A to FIG. 32F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display apparatus of one embodiment of the present invention can be used in the display portion 9001.

The details of the electronic devices illustrated in FIG. 32A to FIG. 32F are described below.

Figure 32A:
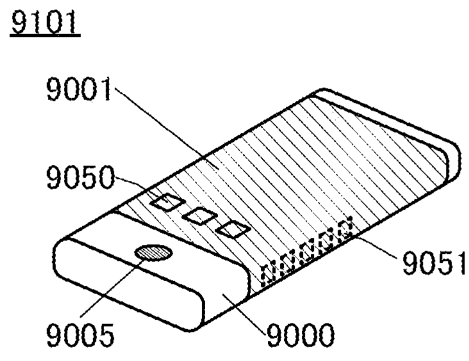
FIG. 32A to FIG. 32F are diagrams each illustrating an example of an electronic device.

FIG. 32A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display letters and image information on its plurality of surfaces. FIG. 32A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 32C:
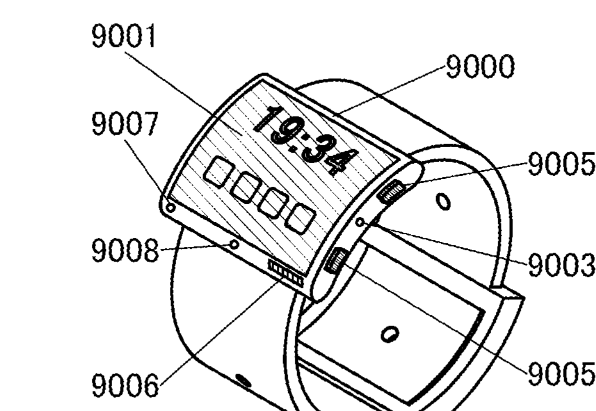
Figure 32B:
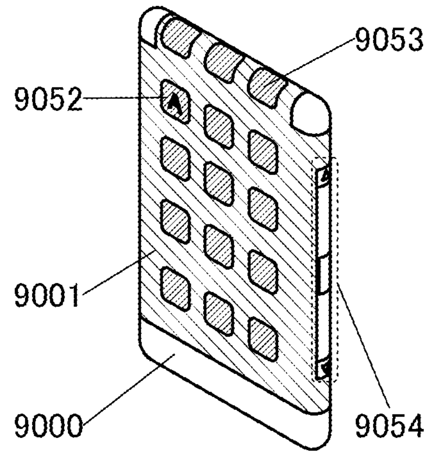

FIG. 32B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer a call, for example.

FIG. 32C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

Figure 32D:
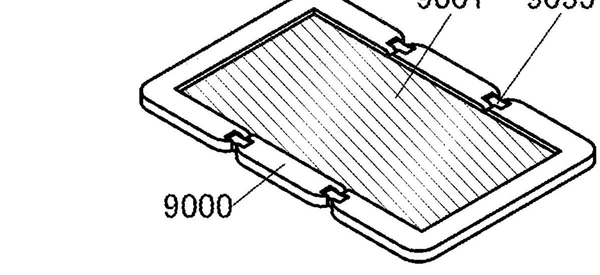
Figure 32E:
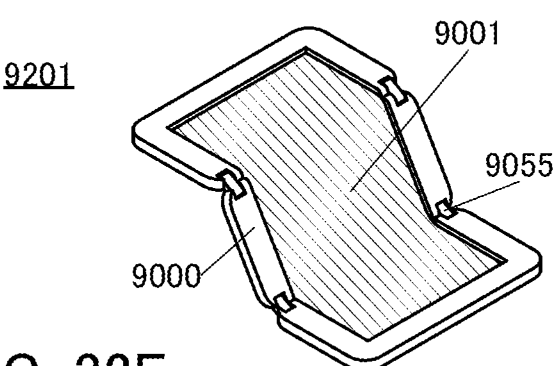
Figure 32F:
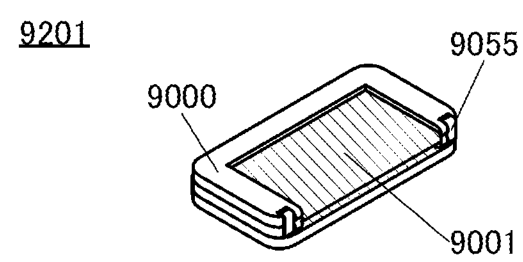

FIG. 32D to FIG. 32F are perspective views illustrating a foldable portable information terminal 9201. FIG. 32D is a perspective view of an opened state of the portable information terminal 9201, FIG. 32F is a perspective view of a folded state thereof, and FIG. 32E is a perspective view of a state in the middle of change from one of FIG. 32D and FIG. 32F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

REFERENCE NUMERALS

100: display apparatus, 101: substrate, 105: insulating layer, 110: light-emitting element, 110B: light-emitting element, 110G: light-emitting element, 110R: light-emitting element, 110S: light-receiving element, 111: pixel electrode, 111A: electrode, 111B: pixel electrode, 111C: connection electrode, 111G: pixel electrode, 111R: pixel electrode, 111S: pixel electrode, 112: organic layer, 112B: organic layer, 112G: organic layer, 112R: organic layer, 113: common electrode, 114: organic layer, 115: organic layer, 116: organic layer, 120: slit, 121: protective layer, 125: insulating layer, **125*f*: insulating film, 126: resin layer, 126G: resin layer, 126S: resin layer, 130: connection portion, 131: insulating layer, 132: insulating layer, 135B: layer, 135**G: layer,

135R: layer, 135S: layer, 140: connection portion, 143: resist mask, 144: sacrificial film, 145: sacrificial layer, 146: sacrificial film, 147: sacrificial layer, 151B: FMM, 151G: FMM, 151R: FMM, 151S: FMM, 155: organic layer, 161: conductive layer, 162: conductive layer, 163: resin layer, 170: substrate, 171: resin layer, 172: light-blocking layer, 173: layer, 175: layer, 176: resin layer, 177: light-blocking layer, 180: light This application is based on Japanese Patent Application Serial No. 2021-089477 filed on May 27, 2021, the entire contents are hereby incorporated herein by reference.

The invention claimed is:

1. A display apparatus comprising:

a light-emitting element;

a light-receiving element;

a first resin layer; and a light-blocking layer, wherein a first pixel electrode, a first organic layer, and a common electrode are stacked in this order in the light-emitting element, wherein a second pixel electrode, a second organic layer, and the common electrode are stacked in this order in the light-receiving element, wherein the first organic layer comprises a first light-emitting layer, wherein the second organic layer comprises a photoelectric conversion layer, wherein the light-blocking layer comprises a portion positioned between the light-emitting element and the light-receiving element in a plan view, wherein the first resin layer is provided to cover the light-emitting element and the light-receiving element, wherein the first resin layer comprises a portion positioned between the light-emitting element and the light-blocking layer and a portion positioned between the light-receiving element and the light-blocking layer, and wherein the first resin layer comprises a portion with a thickness smaller than an arrangement interval between the light-emitting element and the light-receiving element in a region overlapping with the light-blocking layer.

2. The display apparatus according to claim 1, further comprising a first spacer, wherein the first spacer comprises a portion overlapping with the light-emitting element, and a portion positioned, in a plan view, between the light-emitting element and the light-receiving element, wherein the first spacer comprises an opening overlapping with the light-receiving element, wherein the light-blocking layer is positioned between the first resin layer and the first spacer, wherein the light-blocking layer comprises a portion covering an inner wall of the opening of the first spacer, and wherein the first resin layer comprises a portion smaller than the arrangement interval between the light-emitting element and the light-receiving element in a region overlapping with the first spacer and the light-blocking layer.

3. The display apparatus according to claim 1, further comprising a second resin layer, wherein the second resin layer is positioned in a region between the light-emitting element and the light-receiving element, and wherein the second resin layer comprises a portion not overlapping with the first organic layer, the second organic layer, the first pixel electrode, and the second pixel electrode but overlapping with the common electrode.

4. The display apparatus according to claim 3, wherein the second resin layer is divided into a first portion positioned on a side of the light-emitting element and a second portion positioned on a side of the light-receiving element, and wherein the common electrode is provided to cover the first portion and the second portion and fill a gap between the first portion and the second portion.

5. The display apparatus according to claim 1, further comprising a first insulating layer, wherein the first insulating layer is positioned between the light-emitting element and the light-receiving element, and wherein the first insulating layer is in contact with an end portion of the first organic layer and an end portion of the second organic layer.

6. The display apparatus according to claim 1, further comprising a first layer and a second layer between the light-emitting element and the light-receiving element, wherein the first layer overlaps with the second organic layer and comprises the same material as the first organic layer, wherein the second layer overlaps with the first organic layer and comprises the same material as the second organic layer, wherein the end portion of the first organic layer and an end portion of the first layer are provided to face each other in the region between the light-emitting element and the light-receiving element, and wherein the end portion of the second organic layer and an end portion of the second layer are provided to face each other in the region between the light-emitting element and the light-receiving element.

7. A display apparatus comprising:

a light-emitting element;

a light-receiving element;

a first resin layer;

a light-blocking layer; and a second spacer, wherein a first pixel electrode, a first organic layer, and a common electrode are stacked in this order in the light-emitting element, wherein a second pixel electrode, a second organic layer, and the common electrode are stacked in this order in the light-receiving element, wherein the first organic layer comprises a first light-emitting layer, wherein the second organic layer comprises a photoelectric conversion layer, wherein the second spacer comprises a portion overlapping with the light-receiving element, and a portion positioned, in a plan view, between the light-emitting element and the light-receiving element, wherein the second spacer does not overlap with the light-emitting element, wherein the light-blocking layer is provided to cover a top surface and a side surface of a side end portion of the second spacer, and wherein the first resin layer is provided to cover the light-emitting element, the light-receiving element, the second spacer, and the light-blocking layer.

8. The display apparatus according to claim 7, further comprising a second resin layer, wherein the second resin layer is positioned in a region between the light-emitting element and the light-receiving element, and wherein the second resin layer comprises a portion not overlapping with the first organic layer, the second organic layer, the first pixel electrode, and the second pixel electrode but overlapping with the common electrode.

9. The display apparatus according to claim 7, further comprising a first insulating layer, wherein the first insulating layer is positioned between the light-emitting element and the light-receiving element, and wherein the first insulating layer is in contact with an end portion of the first organic layer and an end portion of the second organic layer.

10. The display apparatus according to claim 7, further comprising a first layer and a second layer between the light-emitting element and the light-receiving element, wherein the first layer overlaps with the second organic layer and comprises the same material as the first organic layer, wherein the second layer overlaps with the first organic layer and comprises the same material as the second organic layer, wherein the end portion of the first organic layer and an end portion of the first layer are provided to face each other in the region between the light-emitting element and the light-receiving element, and wherein the end portion of the second organic layer and an end portion of the second layer are provided to face each other in the region between the light-emitting element and the light-receiving element.

11. A display apparatus comprising:

a light-emitting element;

a light-receiving element;

a first resin layer;

a light-blocking layer; and a protective layer, wherein a first pixel electrode, a first organic layer, and a common electrode are stacked in this order in the light-emitting element, wherein a second pixel electrode, a second organic layer, and the common electrode are stacked in this order in the light-receiving element, wherein the first organic layer comprises a first light-emitting layer, wherein the second organic layer comprises a photoelectric conversion layer, wherein the protective layer is provided to cover the light-emitting element and the light-receiving element, wherein the protective layer comprises a portion positioned between the first resin layer and the light-emitting element and a portion positioned between the first resin layer and the light-receiving element, wherein the light-blocking layer comprises a portion positioned between the light-emitting element and the light-receiving element in a plan view, wherein the light-blocking layer comprises a portion in contact with the protective layer, and wherein the first resin layer is divided with the light-blocking layer as a boundary.

12. The display apparatus according to claim 11, further comprising a second resin layer, wherein the second resin layer is positioned in a region between the light-emitting element and the light-receiving element, and wherein the second resin layer comprises a portion not overlapping with the first organic layer, the second organic layer, the first pixel electrode, and the second pixel electrode but overlapping with the common electrode.

13. The display apparatus according to claim 11, further comprising a first insulating layer, wherein the first insulating layer is positioned between the light-emitting element and the light-receiving element, and wherein the first insulating layer is in contact with an end portion of the first organic layer and an end portion of the second organic layer.

14. The display apparatus according to claim 11, further comprising a first layer and a second layer between the light-emitting element and the light-receiving element, wherein the first layer overlaps with the second organic layer and comprises the same material as the first organic layer, wherein the second layer overlaps with the first organic layer and comprises the same material as the second organic layer, wherein the end portion of the first organic layer and an end portion of the first layer are provided to face each other in the region between the light-emitting element and the light-receiving element, and wherein the end portion of the second organic layer and an end portion of the second layer are provided to face each other in the region between the light-emitting element and the light-receiving element.

* * * * *